US012660580B2

(12) United States Patent
Chung et al.

(10) Patent No.: US 12,660,580 B2
(45) Date of Patent: Jun. 16, 2026

(54) SELECTIVE BARRIER LAYER DEPOSITION USING BLOCKING LAYERS

(71) Applicant: TAIWAN SEMICONDUCTOR MANUFACTURING COMPANY, LTD., Hsinchu (TW)

(72) Inventors: Chin-Lung Chung, Taoyuan City (TW); Ching-Fu Yeh, Hsinchu City (TW); Shin-Yi Yang, New Taipei City (TW); Ming-Han Lee, Taipei (TW); Ting-Ya Lo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1150 days.

(21) Appl. No.: 17/679,234

(22) Filed: Feb. 24, 2022

(65) Prior Publication Data

US 2023/0154791 A1      May 18, 2023

Related U.S. Application Data

(60) Provisional application No. 63/279,052, filed on Nov. 12, 2021.

(51) Int. Cl.
*H10W 20/00* (2026.01)
*H10W 20/41* (2026.01)
(Continued)

(52) U.S. Cl.
CPC ....... *H10W 20/034* (2026.01); *H10W 20/035* (2026.01); *H10W 20/0765* (2026.01); *H10W 20/42* (2026.01); *H10W 20/425* (2026.01); *H10W 20/48* (2026.01); *H10W 20/072* (2026.01); *H10W 20/075* (2026.01); *H10W 20/455* (2026.01); *H10W 20/46* (2026.01)

(58) Field of Classification Search
CPC .................. H01L 21/76844; H01L 2221/1063
See application file for complete search history.

(56) References Cited

U.S. PATENT DOCUMENTS 9,105,490 B2    8/2015    Wang et al.
9,236,267 B2    1/2016    De et al.
(Continued)

*Primary Examiner* — Daniel Luke
(74) *Attorney, Agent, or Firm* — NZ Carr Law Office

(57) ABSTRACT

An interconnection structure includes a conductive feature disposed in a first dielectric material, a first etch stop layer disposed over the first dielectric material, a second dielectric material disposed on the first etch stop layer, a conductive via extending through the second dielectric material and the first etch stop layer and in contact with at least a portion of the conductive feature, a first barrier layer disposed between the second dielectric material and the conductive via, a first liner disposed between and in contact with the first barrier layer and the conductive via, a third dielectric material disposed over the second dielectric material, a conductive line disposed in the third dielectric material and in direct contact with the conductive via, a second barrier layer disposed on the second dielectric material and in contact with the first barrier layer and the conductive line, and a second liner disposed between and in contact with the second barrier layer and the conductive line, wherein the second liner is separated from the first liner.

20 Claims, 38 Drawing Sheets

(51) Int. Cl.

| | | |
|---|---|---|
| *H10W 20/42* | (2026.01) | |
| *H10W 20/48* | (2026.01) | |
| *H10W 20/45* | (2026.01) | |
| *H10W 20/46* | (2026.01) | |

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 10,879,107 | B2 * | 12/2020 | Dutta | H01L 23/528 |
| 12,211,743 | B2 * | 1/2025 | Qu | H01L 21/28562 |
| 2021/0057273 | A1 | 2/2021 | Chen et al. | |
| 2023/0253248 | A1 * | 8/2023 | Zhou | H01L 21/28562 |
| | | | | 438/653 |

* cited by examiner

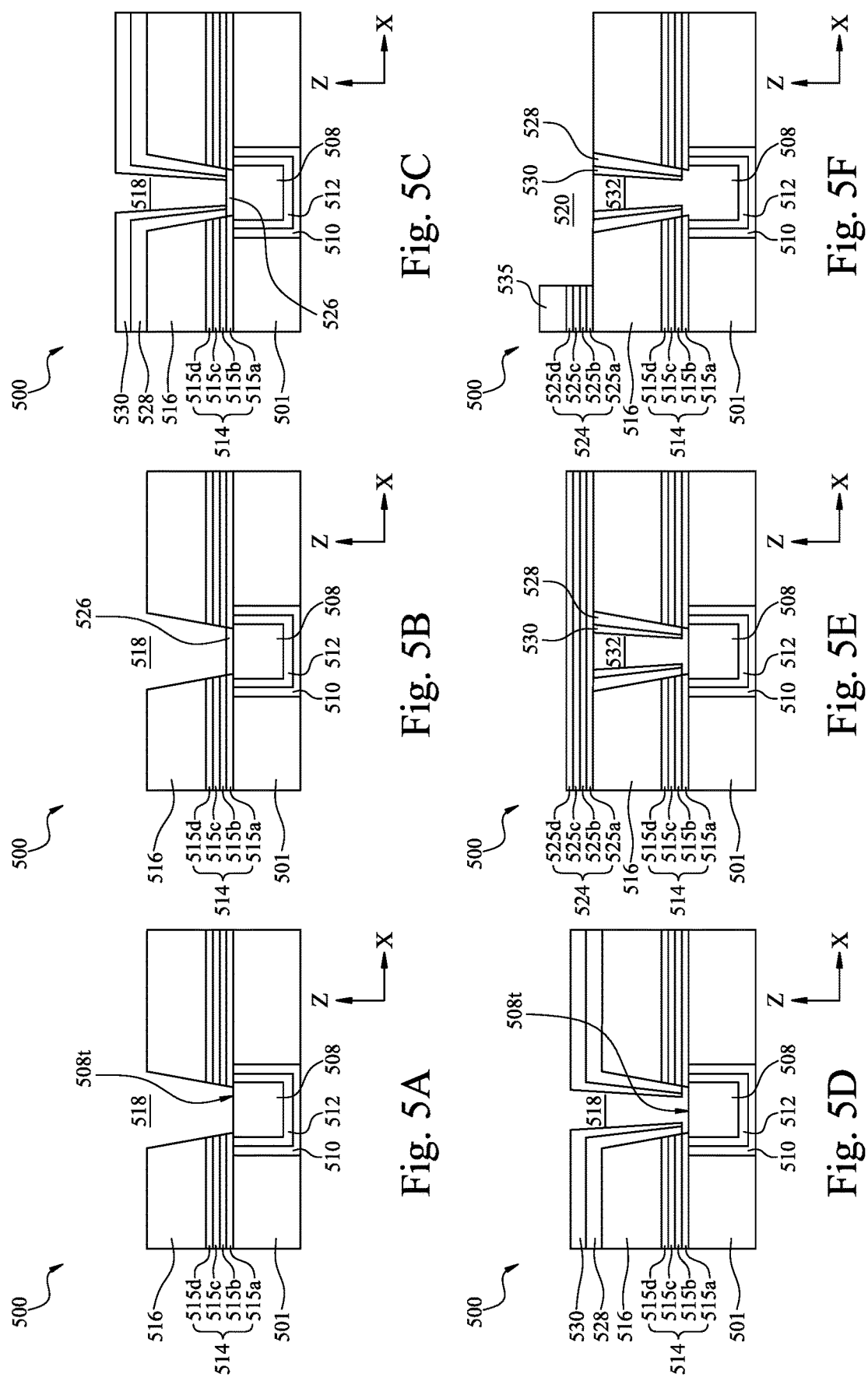

Fig. 6H"

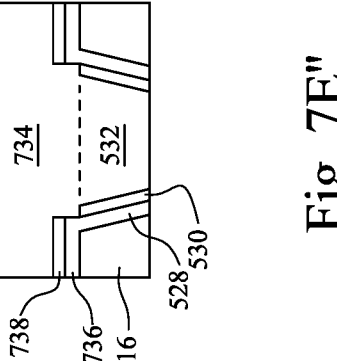
Fig. 7E"
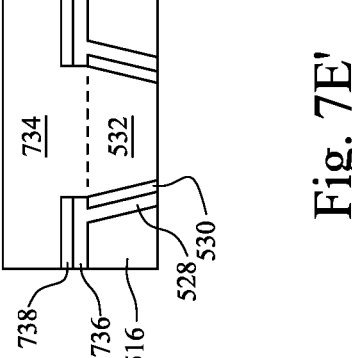
Fig. 7E'

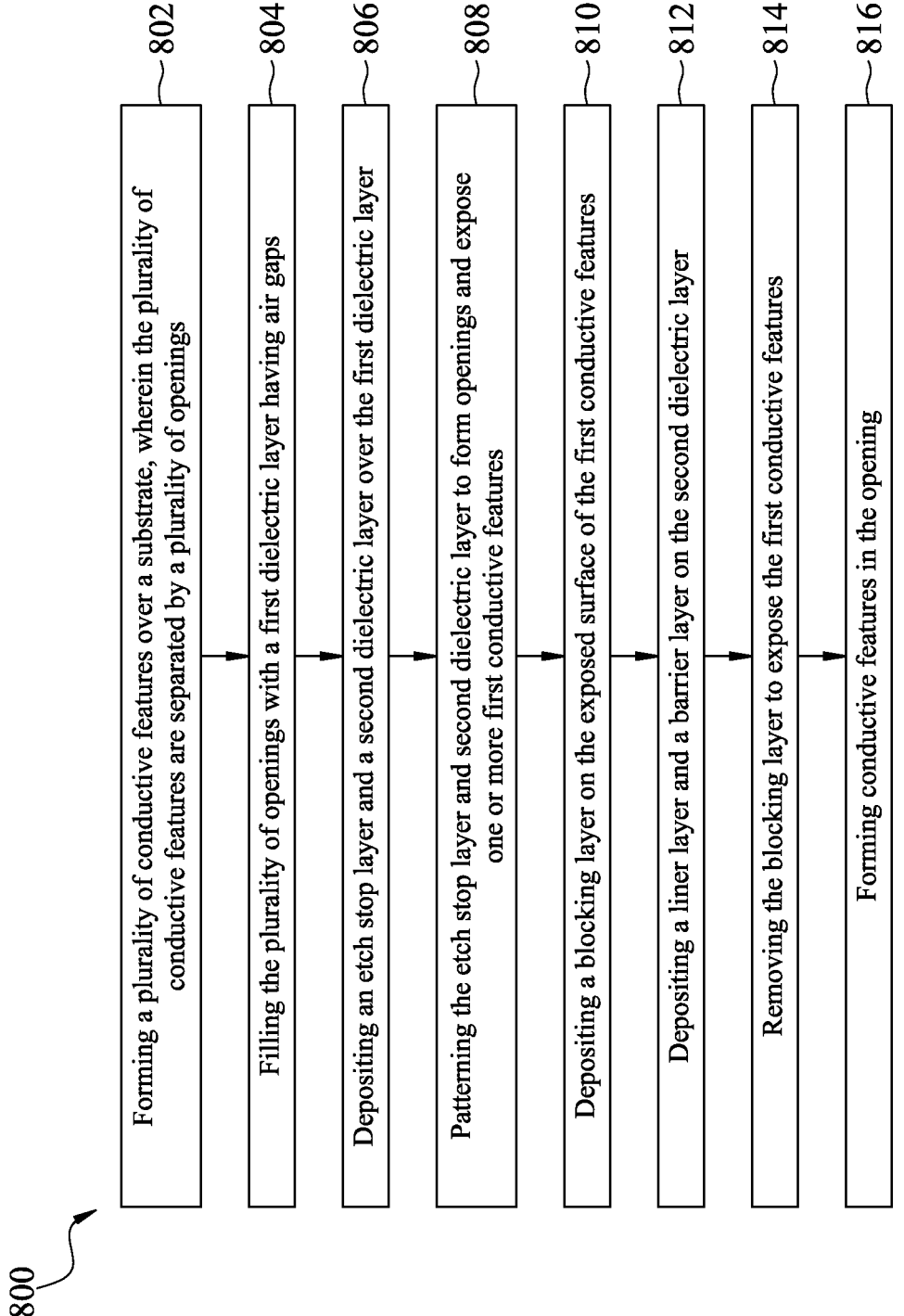

Forming a plurality of conductive features over a substrate, wherein the plurality of conductive features are separated by a plurality of openings — 802

Filling the plurality of openings with a first dielectric layer having air gaps — 804

Depositing an etch stop layer and a second dielectric layer over the first dielectric layer — 806

Patterning the etch stop layer and second dielectric layer to form openings and expose one or more first conductive features — 808

Depositing a blocking layer on the exposed surface of the first conductive features — 810

Depositing a liner layer and a barrier layer on the second dielectric layer — 812

Removing the blocking layer to expose the first conductive features — 814

Forming conductive features in the opening — 816

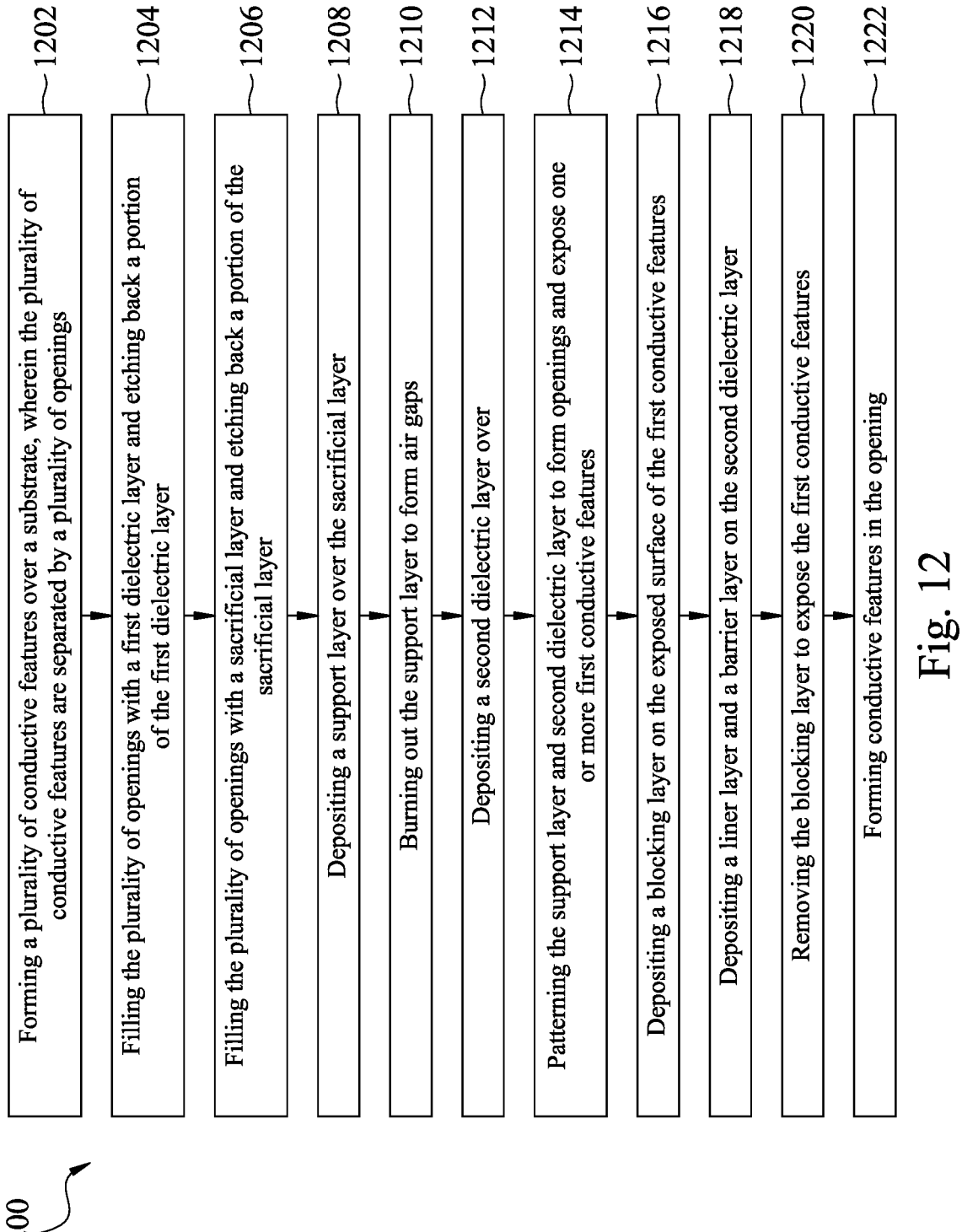

Forming a plurality of conductive features over a substrate, wherein the plurality of conductive features are separated by a plurality of openings ~1202

Filling the plurality of openings with a first dielectric layer and etching back a portion of the first dielectric layer ~1204

Filling the plurality of openings with a sacrificial layer and etching back a portion of the sacrificial layer ~1206

Depositing a support layer over the sacrificial layer ~1208

Burning out the support layer to form air gaps ~1210

Depositing a second dielectric layer over ~1212

Patterning the support layer and second dielectric layer to form openings and expose one or more first conductive features ~1214

Depositing a blocking layer on the exposed surface of the first conductive features ~1216

Depositing a liner layer and a barrier layer on the second dielectric layer ~1218

Removing the blocking layer to expose the first conductive features ~1220

Forming conductive features in the opening ~1222

SELECTIVE BARRIER LAYER DEPOSITION USING BLOCKING LAYERS

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnection structure gets higher, electrical resistivity and resistive-capacitive (RC) delay increase. Therefore, improved methods of forming the interconnection structure are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5H are cross-sectional side views of various stages of manufacturing an interconnection structure, in accordance with some embodiments.

FIG. 6G' is an enlarged view of a portion of the interconnection structure in accordance with some embodiments.

FIG. 6H' is an enlarged view of a portion of the interconnection structure according to one embodiment.

FIG. 6H" is an enlarged view of a portion of the interconnection structure according to another embodiment.

FIG. 7E' is an enlarged view of a portion of the interconnection structure according to one embodiment.

FIG. 7E" is an enlarged view of a portion of the interconnection structure according to another embodiment.

FIG. 8 is a flow chart of a method for manufacturing an interconnect structure according to embodiments of the present disclosure.

FIG. 12 is a flow chart of a method for manufacturing an interconnect structure according to embodiments of the present disclosure.

DETAILED DESCRIPTION

Figure 1:
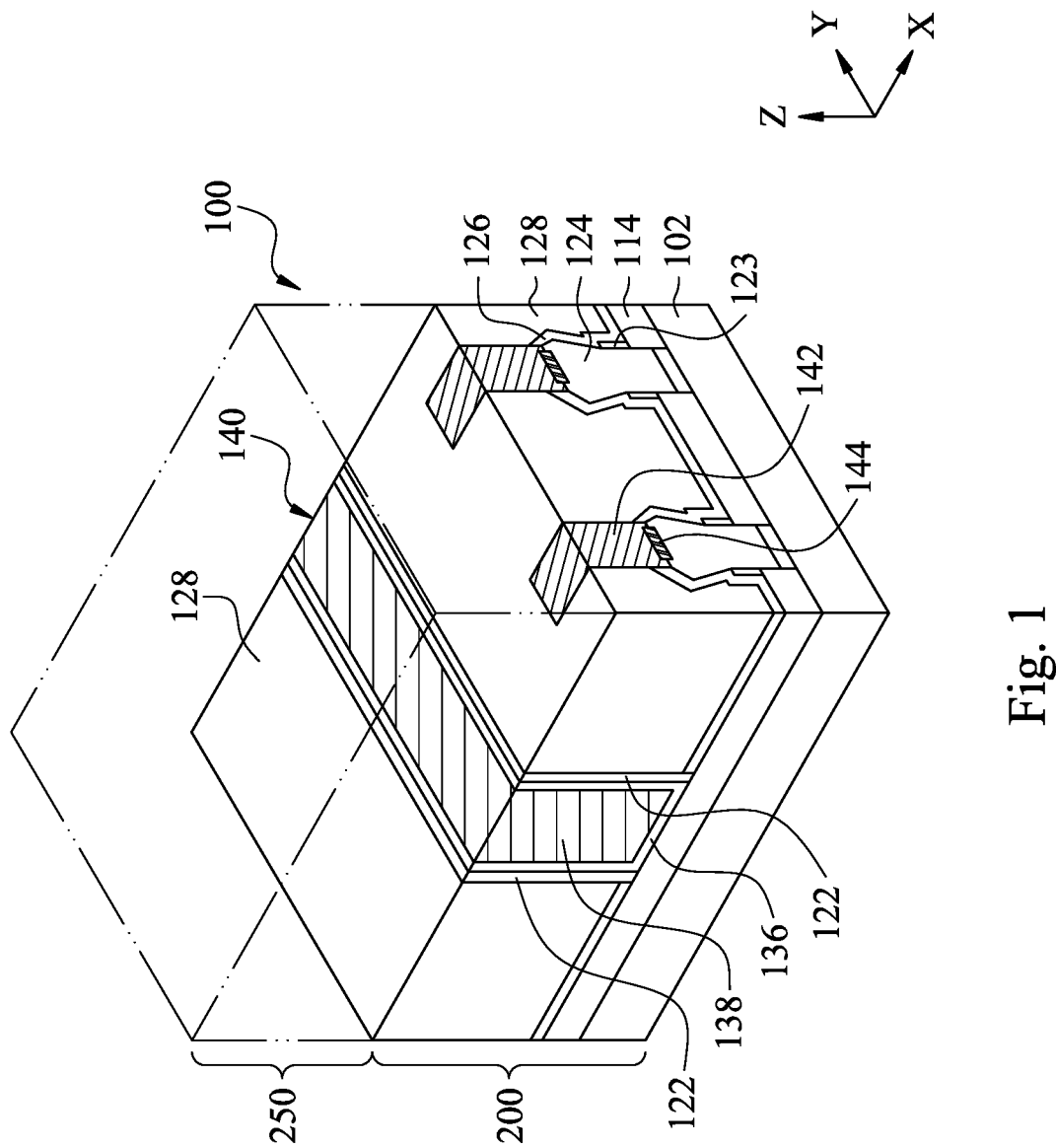
FIG. 1 is a perspective sectional view of a semiconductor device structure according to embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective sectional view of a semiconductor device structure 100 including a device layer 200 and an interconnection structure 250. The device layer 200 includes a substrate 102 and one or more devices formed in or on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the device layer 200 may include any suitable devices, such as transistors, diodes, imaging sensors, resistors, capacitors, inductors, memory cells, or a combination thereof. In some embodiments, the device layer 200 includes transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device formed on the substrate 102 is a FinFET, which is shown in FIG. 1. The device layer 200 includes source/drain (S/D) regions 124 and gate stacks 140 (only one is shown in FIG. 1). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. While not shown, channel regions are formed between the S/D regions 124 and have at least three surfaces wrapped around by the gate stack 140.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions may include one or more semiconductor materials, such as Si, Ge, GeSn, SiGe, GaAs, InSb, GaP, GaSb, InAlAs, InGaAs, GaSbP, GaAsSb, GaN, GaP, or InP. The channel regions may include the same semiconductor material as the substrate 102. In some embodiments, the device layer 200 may include FinFETs, and the channel regions are a plurality of fins disposed below the gate stacks 140. In some embodiments, the device layer 200 may include nanostructure transistors, and the channel regions are surrounded by the gate stacks 140.

The gate stack 140 includes a gate electrode layer 138 disposed over the channel region (or surrounding the channel region for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. The gate stack 140 may further include a gate dielectric layer 136 disposed over the channel region. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layer 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique. In some embodiments, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

A contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

S/D contacts 142 may be disposed in the ILD layer 128 and over the S/D region 124. The S/D contacts 142 may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer 144 may be disposed between the S/D contacts 142 and the S/D region 124. The silicide layers 144 may be made of a metal or metal alloy silicide, and the metal includes a noble metal, a refractory metal, a rare earth metal, alloys thereof, or combinations thereof In integrated circuits, interconnection structures (or interconnect structures) are used to provide signal routing and power supply to semiconductor devices. An integrated circuit chip typically includes a device layer, fabricated during front-end-of-line (FEOL) and middle-end-of-line (MEOL) processes, and a back-end-of-line (BEOL) layer. The device layer may be formed in and/or on the substrate, and the BEOL layer is formed on a front side and/or backside of the device layer. The device layer may include various semiconductor devices, such as transistors, diodes, capacitors, resistors, etc., and may be formed in and/or on the substrate. In some embodiments, the device layer may also include the MEOL structures, such as one or more dielectric layers with conductive features connected to gates and source/drain features in the device layer. Interconnection structures typically include conductive lines and vias formed in both the device layer and the BEOL layers.

Figure 2:
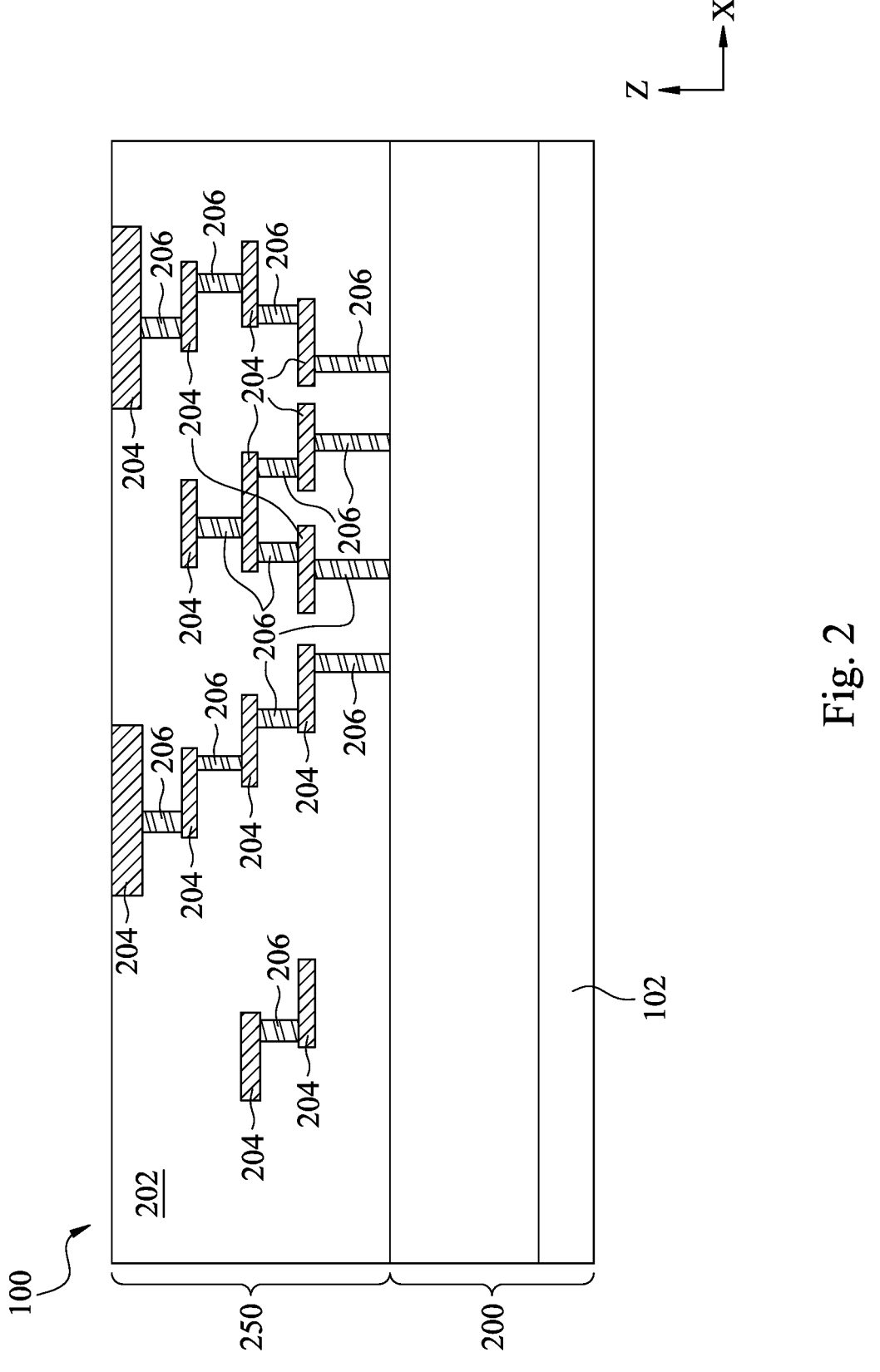
FIG. 2 is a cross-sectional side view of a stage of manufacturing the semiconductor device structure, in accordance with some embodiments.

FIG. 2 is a cross-sectional side view of a stage of manufacturing the semiconductor device structure 100, in accordance with some embodiments. The interconnection structure 250 is formed over the device layer 200. The interconnection structure 250 includes various conductive features, such as conductive lines 204 and conductive vias 206, formed in a dielectric layer 202. The dielectric layer 202 may be an intermetal dielectric (IMD) layer or an interlayer dielectric (ILD) layer. The dielectric layer 202 may include multiple dielectric layers embedding multiple levels of conductive lines and vias 204, 206. The dielectric layer 202 is made from a dielectric material, such as $SiO_x$, $SiO_xC_yH_z$, or $SiO_xC_y$, where x, y and z are integers or non-integers. In some embodiments, the dielectric layer 202 includes a low-k dielectric material having a k value less than that of silicon oxide. The conductive lines 204 and conductive vias 206 may be made from one or more electrically conductive materials, such as metal, metal alloy, metal nitride, or silicide. The conductive vias 206 and lines 204 are arranged in levels to provide electrical paths to the gate electrode 138 (FIG. 1) and S/D contacts 142 (FIG. 1) in the device layer 200. In some embodiments, a backside interconnection structure (not shown), similar to the interconnection structure 250, may be formed on the backside of the device layer 200 to provide power supply and/or additional signal connection to the device layer 200. FIGS. 3A-7E" to be discussed below relate to various embodiments of interconnection structures and methods to form thereof according to the present disclosure.

Figures 3A, 3B:
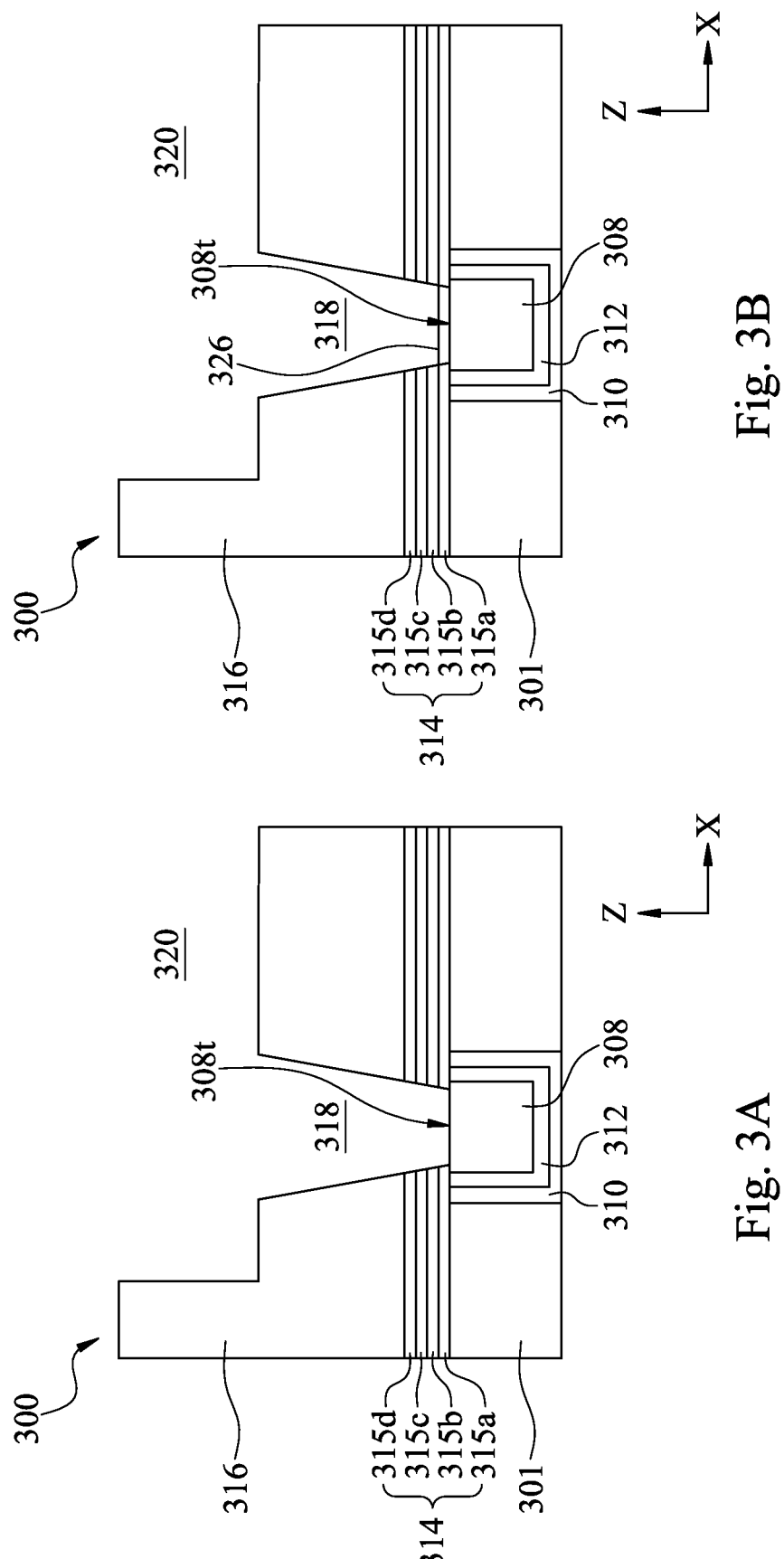
FIGS. 3A-3E' are cross-sectional side views of various stages of manufacturing the interconnection structure, in accordance with some embodiments.

FIGS. 3A-3E are cross-sectional side views of various stages of manufacturing the interconnection structure 300, in accordance with some embodiments. Various embodiments of the interconnection structure 300 may be used to form one or more layers of the interconnection structure 250 shown in FIGS. 1 and 2. In FIG. 3A, the interconnection structure 300 includes a dielectric material 301, which may be an ILD layer or an IMD layer. For example, the dielectric material 301 may be the ILD layer 128 (FIG. 1) or the dielectric layer 202 (FIG. 2). The dielectric layer 301 may include the same material as the ILD layer 128 or the dielectric layer 202. In some embodiments, the dielectric material 301 includes a low-k dielectric material, such as SiOCH. The dielectric layer 301 may be formed by CVD, FCVD, ALD, spin coating, or other suitable process. The dielectric material 301 may include one or more conductive features 308 disposed therein. The one or more conductive features 308 may be electrically connected to the S/D regions 124 (FIG. 1) and the gate electrode layer 138 (FIG. 1). In some embodiments, the conductive features 308 are the conductive lines 204 or conductive vias 206 shown in FIG. 2. The conductive feature 308 may include an electrically conductive material, such as Cu, Co, W, Ru, Mo, Zn, alloys thereof, or combinations thereof, and may be formed by any suitable process, such as PVD.

In some embodiments, a barrier layer 310 may be formed between the dielectric material 301 and the conductive feature 308, and a liner 312 may be formed between the barrier layer 310 and the conductive feature 308. The barrier layer 310 may include metal nitride, metal oxide, two-dimensional (2D) material, or a combination thereof. Suitable metals for the barrier layer 310 may include, but are not limited to, Ta, Ti, W, Mn, Zn, In, or Hf. In some embodiments, the barrier layer 310 is a metal nitride, such as TaNx, TiNx or WNx, or a metal oxide, such as HfOx. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof. The barrier layer 310 may prevent the metal diffusion from the conductive feature 308 to the dielectric material 301. In some embodiments, the conductive feature 308 includes a metal that is not susceptible to diffusion, and the barrier layer 310 may be omitted. The liner 312 may include Co, Ru, Mn, Zn, Zr, W, Mo, Os, Ir, Al, Fe, Ni, alloys thereof, or combinations thereof. In some embodiments, the liner 312 is Co or Ru. In some embodiments, the liner 312 is CoRu. In some embodiments, the liner 312 may include the same material as the conductive feature 308. In some embodiments, the liner 312 may be omitted, and the conductive feature 308 may be in contact with the barrier layer 310. The barrier layer 310 and the liner 312 may each have a thickness ranging from about 3 Angstroms to about 100 Angstroms. Because the barrier layer 310 and the liner 312 may include an electrically conductive material, the contacting area for a subsequently formed conductive vias and lines 332, 334 (FIG. 3E) may be increased.

As shown in FIG. 3A, an etch stop layer 314 and a dielectric material 316 are formed over a dielectric material 301. The dielectric material 316 may be the dielectric layer 202 (FIG. 2). The etch stop layer 314 may include a material different from the dielectric material 316 in order to have different etch selectivity compared to the dielectric material 316. In some embodiments, the etch stop layer 314 is made of a dielectric material, such as an oxide, a nitride, a metal oxide, a metal nitride, or a combination thereof. Suitable materials for the etch stop layer 314 may include, but not limited to, silicon nitride, silicon carbide, oxygen-doped silicon carbide (ODC), silicon carbon nitride, silicon oxynitride, carbon nitride, silicon oxide, silicon carbon oxide, and aluminum oxide, etc. The etch stop layer 314 may be a single layer or a multi-layer structure. In some embodiments, the etch stop layer 314 includes a carbide and a nitride. In some embodiments, the etch stop layer 314 includes an oxide and a nitride. In some embodiments, the etch stop layer 314 may include two or more layers of dielectric material discussed herein. For example, the etch stop layer 314 may include a first layer 315a in contact with the dielectric material 301, a second layer 315b disposed on the first layer 315b, a third layer 315c disposed on the second layer 315b, and a fourth layer 315d disposed on the third layer 315c. In some embodiments, the first, second, third, and fourth layers 315a, 315b, 315c, 315d may include the same dielectric material but with different ratio, composition, and/or oxidation rates. In some embodiments, the first and third layers 315a, 315c may include the same dielectric material but with different ratio, composition, and/or oxidation rates and the second and fourth layers 315b, 315d may include the same dielectric material but with different ratio, composition, and/or oxidation rates. In one exemplary embodiment shown in FIG. 3A, the first layer 315a includes aluminum oxide, the second layer 315b includes oxygen-doped silicon carbide, the third layer 315c includes aluminum oxide, and the fourth layer 315d oxygen-doped silicon carbide. The etch stop layer 314 may be formed by any suitable process, such as CVD, ALD, PVD, PEALD, or PECVD.

The dielectric material 316 may include the same material as the dielectric material 301 and may be formed by the same process as the dielectric material 301. Openings 318, 320 are formed in and through the dielectric material 316, as shown in FIG. 3A. The openings 318, 320 are intended to be filled with a conductive material to form conductive features therein. The openings 318, 320 may be formed by any suitable process, such as one or more etch processes. In some embodiments, the openings 318, 320 may be a result of a dual-damascene process. The opening 320 may be a trench opening formed in an upper portion of the dielectric material 316. The opening 318 may be a via opening formed through the dielectric material 316 and the etch stop layer 314 to expose a portion of the conductive feature 308 to the opening 320. The etch processes remove a portion of the etch stop layer 314 so that the opening 318 exposes the top surface 308t of the corresponding conductive feature 308. In some embodiments, the etch processes may remove a portion of the etch stop layer 314 so that the opening 318 exposes the conductive feature 308 and portions of the liner 312.

In FIG. 3B, a blocking layer 326 is selectively formed on the exposed top surface 308t of the conductive feature 308. The blocking layer 326 may be organic material including small molecule or polymer. In some embodiments, the blocking layer 326 may include one or more self-assembled monolayers (SAMs) having a head group and a tail group. The head group of the SAM may be selected depending on the material of the conductive feature 308. For example, the head group of the SAM may include an azole group-containing compound when Cu or Co is used as the conductive feature 308, or a compound terminated with an alkyne group when Ru is used as the conductive feature 308. In some embodiments, the head group of the SAM may include a phosphorus (P), sulfur (S), silicon (Si), or nitrogen (N) terminated compound which may only attach to the metallic surfaces of the conductive features 308 (and the liners 312 if exposed). The head group of the SAM may not form on the dielectric surface of the dielectric material 316 and the etch stop layer 314. The tail group of the SAM may include a highly hydrophobic long alkyl chain which blocks adsorption of a precursor (e.g., precursor for forming the subsequent barrier layer 328) from forming on the blocking layer 326. In some embodiments, the tail group includes a polymer such as polyimide. The blocking layer 326 may be formed by supplying a blocking agent to the exposed surfaces, for example by CVD, ALD, molecular layer deposition (MLD), wet coating, immersion process, or other suitable methods.

In some embodiments, the blocking layer 326 is formed by a wet-coating process, and the solution for wet coating may be a protic organic solvent such as alcohols, carboxylic acids, or a combination thereof. Exemplary protic organic solvents may include, but are not limited to, methanol, ethanol, 1-propanol, 2-propanol, 1-butanol, 1-pentanol, 1-hexanol, 1-heptanol, 2-ethoxyethanol, and mixtures thereof. The solution for wet coating may also be a polar or nonpolar protic solvent. Exemplary polar aprotic solvents may include, but are not limited to, N,N-dimethylformamide, N-methyl-2-pyrrolidinone, acetonitrile, acetone, ethyl acetate, benzyl ether, trioctylphosphine, trioctylphosphine oxide, and mixtures thereof. Exemplary nonpolar protic solvents may include, but are not limited to, alkane, olefin, an aromatic, an ester or an ether solvent, hexane, octane, benzene, toluene, xylene, and mixtures thereof. It is contemplated that the wet-coating process herein is applicable to formation of other blocking layer discussed in this disclosure.

In some embodiments, the blocking layer 326 may have a thickness in a range between about 2 angstrom and about 100 Angstroms. A thickness less than 2 Angstroms may not provide enough coverage and protection to the conductive feature 308 underneath. A thickness greater than 100 Angstroms may block portions of the dielectric material 316 or the etch stop layer 314, resulting in incomplete coverage of the subsequently formed barrier layer and liner layer.

Figures 3C, 3D:
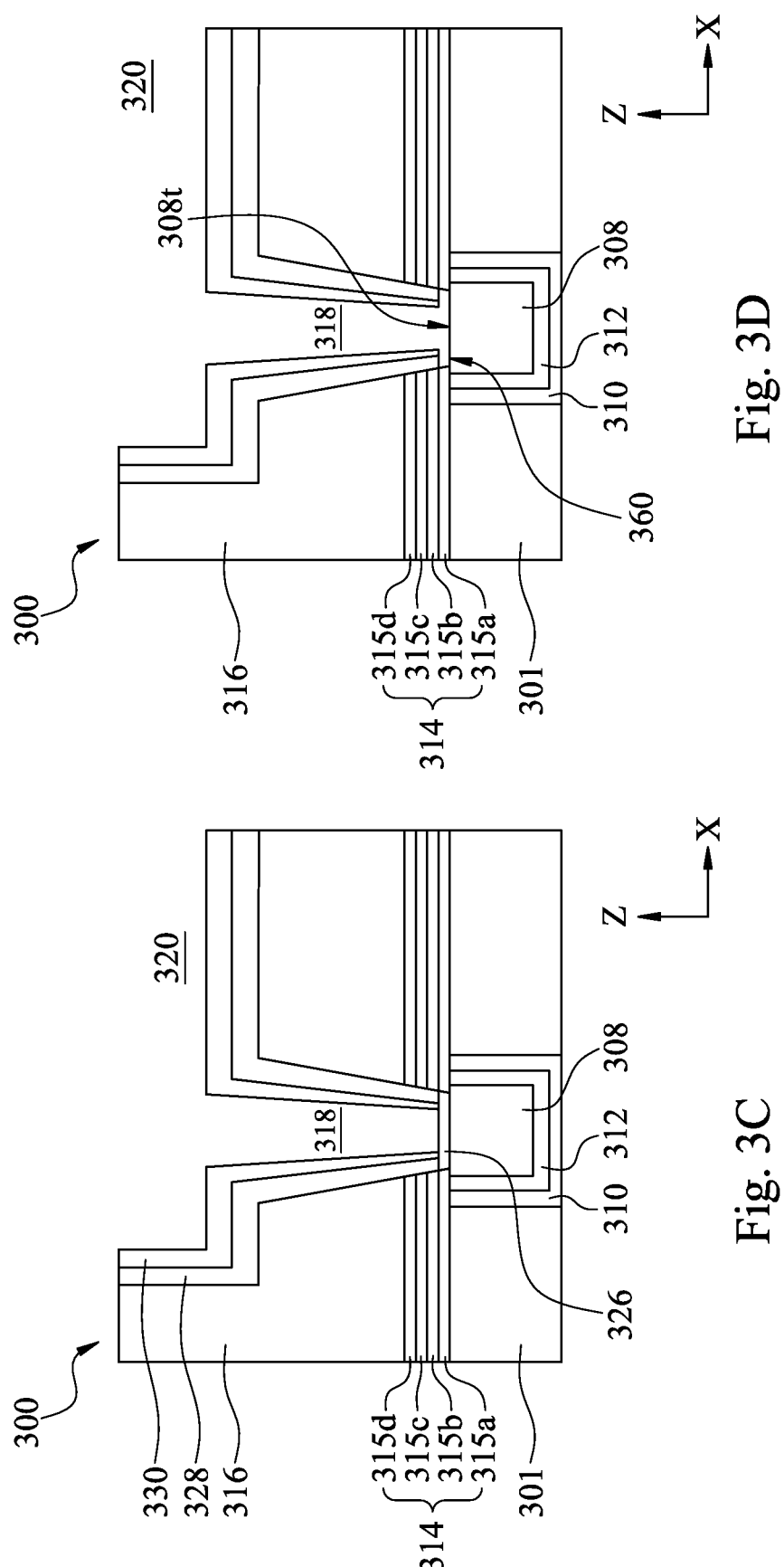

In FIG. 3C, a barrier layer 328 is deposited on exposed dielectric surfaces, such as the dielectric material 316 and the etch stop layer 314, and a liner 330 is deposited on the barrier layer 328. The barrier layer 328 serves to prevent the metal diffusion from the subsequent conductive features 332, 334 to the dielectric material 316. The liner 330 serves as a glue layer to allow better adhesion of the subsequent conductive features 332, 334 to the barrier layer 328. With the blocking layer 326 formed on the metallic surfaces of the conductive features 308, the barrier layer 328 is selectively formed on/over the dielectric material 316 and the etch stop layer 314 and not formed on the blocking layer 326. The selective deposition of the barrier layer 328 is achieved through the use of the blocking layer 326. For example, the blocking layer 326 may block the barrier layer 328 from forming on the metallic surface of the conductive feature 308. Specifically, the blocking layer 326 blocks the precursor(s) of the barrier layer 328 from forming thereon, so the precursor(s) of the barrier layer 328 grows on the dielectric surfaces, such as the surfaces of the dielectric material 316 and the etch stop layer 314. The selective deposition of the barrier layer 328 can also be achieved and/or enhanced through the use of ALD process and/or MLD process so that the barrier layer 328 has the characteristic or property of being specific in bonding with the dielectric material 316 and the etch stop layer 314 through self-limiting surface reactions. In addition, since the barrier layer 328 and the liner 330 both include metallic material, the liner 330 can be selectively formed on the metallic surface of the barrier layer 328 instead of the organic material or polymer used by the blocking layer 326. The barrier layer 328 may include the same material as the barrier layer 310 and may be formed by a conformal process, such as ALD. The barrier layer 328 may have a thickness ranging from about 3 Angstrom to about 100 Angstroms, such as from about 5 Angstroms to about 50 Angstroms. Likewise, the liner 330 may include the same material as the liner 312 and may be formed by a conformal process, such as ALD. The liner 330 may have a thickness ranging from about 3 Angstrom to about 100 Angstroms, such as from about 3 Angstroms to about 50 Angstroms. The deposition process of barrier layer 328 or the liner 330 may be performed in a temperature range between room temperature to about 400° C.

In FIG. 3D, after the formation of the barrier layer 328 and the liner 330, the blocking layer 326 is removed to expose the top surface 308t of the conductive feature 308. The blocking layer 326 may be removed using thermal degradation or plasma bombardment, or other suitable process. The removal process does not substantially affect the liner 330 or the conductive feature 308. The removal of the blocking layer 326 forms a spacing 360 between the bottoms of the barrier layer 328 and the liner 330 and the top of the conductive feature 308.

Figure 3E:
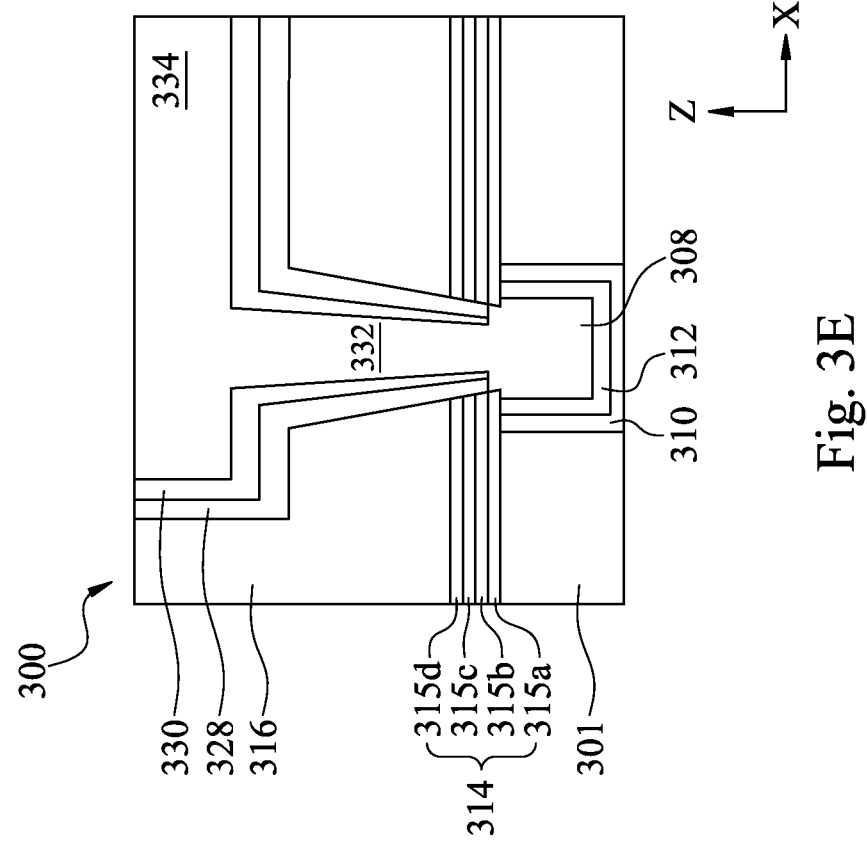
Figure 3E:
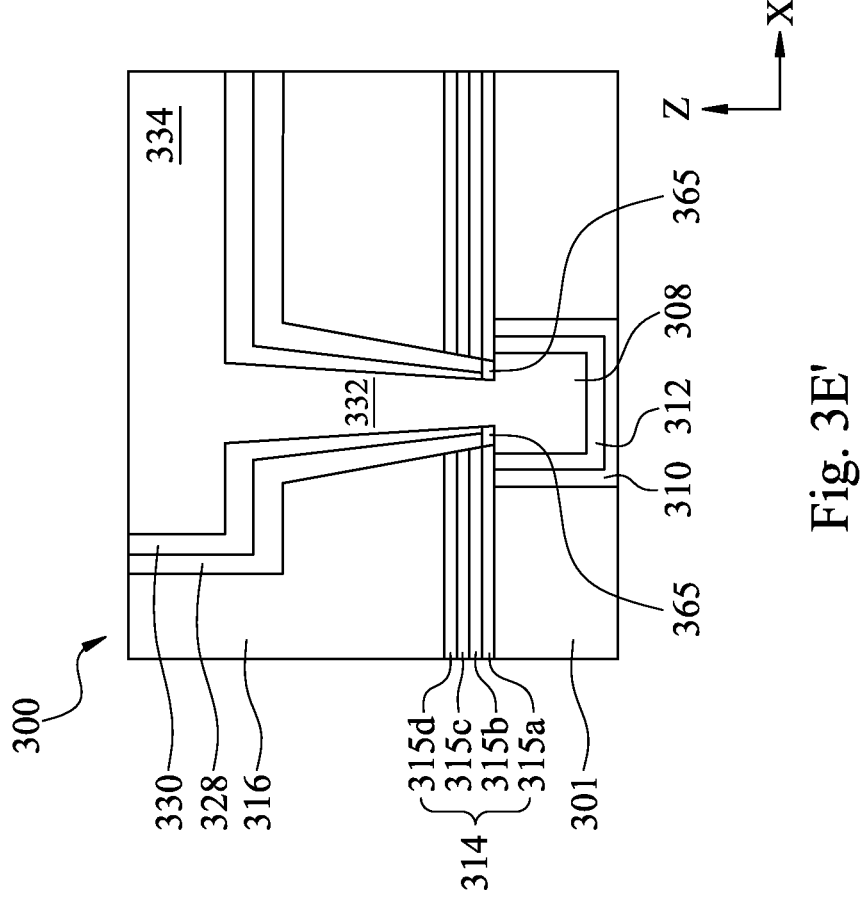

In FIG. 3E, a conductive via 332 and a conductive line 334 are formed in the spacing 360 and the openings 318, 320 (FIG. 3D), respectively. The conductive via 332 and conductive line 334 may be formed by filling a conductive material in the openings 318, 320. The conductive via 332 and conductive line 334 may include any suitable conductive material, such as Cu, Ru, W, Ni, Al, Co, iridium (Jr), osmium (Os), gold (Au), palladium (Pd), platinum (Pt), silver (Ag), tantalum (Ta), titanium (Ti), or alloys thereof. The conductive via 332 and conductive line 334 may be deposited using PVD, CVD, ALD, electroplating, ELD, or other suitable deposition process, or combinations thereof, and followed by a planarization process, such as a CMP process. As shown in FIG. 3E, the interconnection structure 300 includes conductive via 332 and conductive line 334 formed in the dielectric material 316. The conductive line 334 may have a first dimension and the conductive via 332 may have a second dimension less than the first dimension. The conductive via 332 is in direct contact with the underlying conductive features 308 in the dielectric material 301. Because there is no barrier layer or liner layer between the conductive via 332 and the conductive feature 308, the contact resistance between the conductive via 332 and the conductive feature 308 is reduced.

In some embodiments, the conductive material may fill the conductive via 332 and the conductive line 334, but the spacing 360 may not be filled or only be partially filled due to the size of the spacing 360 and/or the limitation of the deposition technology. In such cases, an air gap may be formed as a result the conductive material not filling up the spacing 360. FIG. 3E' illustrates an embodiment where the conductive material does not fully fill the spacing 360, thereby forming an air gap 365 defined by bottoms of the barrier layer 328 and the liner 330, the top of the conductive feature 308, and a portion of the etch stop layer 314 (e.g., first layer 315a). The air gap 365 help lower capacitance in the region near the conductive features 308 and reduce RC delay. It is contemplated that the air gap 365 discussed herein are equally applicable in other embodiments, such as embodiments shown in FIGS. 4F and 5H, which may adapt processes similar to that shown in FIGS. 3B to 3D.

Figures 4A, 4B, 4C, 4D, 4E, 4F:
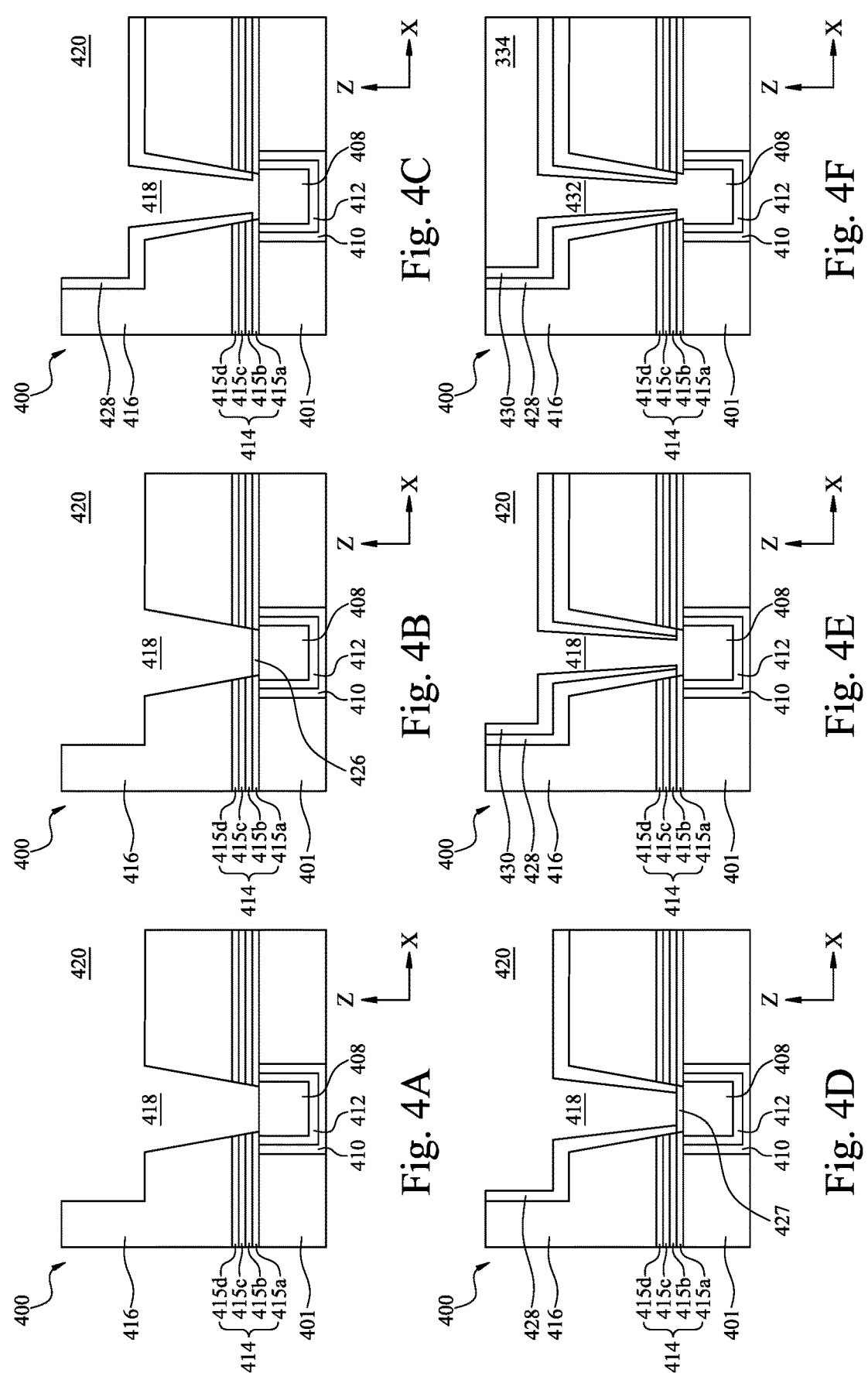
FIGS. 4A-4F are cross-sectional side views of various stages of manufacturing an interconnection structure, in accordance with some embodiments.

FIGS. 4A-4F are cross-sectional side views of various stages of manufacturing an interconnection structure 400, in accordance with some embodiments. Various embodiments of the interconnection structure 400 may be used to form one or more layers of the interconnection structure 250 shown in FIGS. 1 and 2. As will be discussed in more detail below, the embodiment shown in FIGS. 4A-4F is substantially identical to the embodiment shown in FIGS. 3A-3E except that formation of the blocking layer is a two-step process to enable selective deposition of the barrier layer and liner. The interconnection structure 400 in FIGS. 4A and 4B is substantially identical to the interconnection structure 300 shown in FIGS. 3A and 3B. The interconnection structure 400 includes a dielectric material 401, which may be the ILD layer 128 (FIG. 1) or the dielectric layer 202 (FIG. 2). The dielectric material 401 may include one or more conductive features 408 disposed therein. The one or more conductive features 408 may be the conductive lines 204 or conductive vias 206 (FIG. 2) and electrically connected to the S/D regions 124 and the gate electrode layer 138 (FIG. 1). The dielectric material 401 and the conductive feature 408 are similar to the dielectric material 301 and the conductive feature 308 discussed above.

The interconnection structure 400 includes a barrier layer 410 between the dielectric material 401 and the conductive feature 408, and a liner 412 between the barrier layer 410 and the conductive feature 408. The barrier layer 410 and the liner 412 may include the same material as the barrier layer 310 and the liner 312, respectively. The interconnection structure 400 includes an etch stop layer 414 and a dielectric material 416 formed on the etch stop layer 414. The dielectric material 416 may be the dielectric layer 202 (FIG. 2). The dielectric material 416 and the etch stop layer 414 may include the same material as the dielectric material 316 and the etch stop layer 314. In one exemplary embodiment, the etch stop layer 414 is a multi-layer structure including a first layer 415a in contact with the dielectric material 401, a second layer 415b disposed on the first layer 415b, a third layer 415c disposed on the second layer 415b, and a fourth layer 415d disposed on the third layer 415c. In one example, the first layer 415a and the third layer 415c may include aluminum oxide, and the second layer 415b and the fourth layer 415d may include oxygen-doped silicon carbide. It is contemplated that other layer arrangements, such as those discussed above with respect to etch stop layer 314, are applicable to etch stop layer 414. Openings 418, 420 are formed in and through the dielectric material 416 in a similar fashion as those discussed above with respect to FIG. 3A. In one embodiment, the openings 418 are via openings and the openings 420 are trench openings, and the openings 418, 420 are formed as a result of a dual-damascene process. In some embodiments, the opening 418 is formed to expose the liners 412.

In FIG. 4B, a first blocking layer 426 is selectively formed on the exposed top surface of the conductive feature 408. In some embodiments, the first blocking layer 426 may include the same material as the blocking layer 326 and may be formed by a method similar to the method discussed above with respect to FIG. 3B. In some embodiments, the material of the first blocking layer 426 is chosen so that the subsequent barrier layer 428 is selectively formed on the dielectric material 416 and the etch stop layer 414 and not formed on the first blocking layer 426. For example, the first blocking layer 426 may include one or more self-assembled monolayers (SAMs) having a head group and a tail group, in which the head group of the SAM includes a phosphorus (P) or sulfur (S) terminated compound which may only attach to the metallic surfaces of the conductive features 408 (and the liners 412 if exposed), and the tail group of the SAM includes a highly hydrophobic long alkyl chain which blocks adsorption of a precursor (e.g., precursor for forming the subsequent barrier layer 428) from forming on the blocking layer 426. In some embodiments, the tail group includes a polymer such as polyimide.

In some embodiments, the first blocking layer 426 may be formed by exposing the top surface of the conductive feature 408 to a blocking agent through the use of CVD, ALD, wet coating, immersion process, or other suitable methods. The blocking agent may include one or more inhibitors configured to selectively attach to the metallic surface of the conductive feature 308. Suitable inhibitors may include, but are not limited to, bezotriazole ($C_6H_5N_3$), benzimidazole ($C_7H_6N_2$), tolyltriazole ($C_7H_7N_3$), oxalic acid ($C_2H_2O_4$), malonic acid ($C_3H_4O_4$), citric acid ($C_6H_8O_7$), lactic acid ($C_3H_6O_3$), ethylenediaminetetraacetic acid ($C_{10}H_{16}N_2O_8$), tetraacetic acid ($C_{14}H_{24}N_2O_{10}$), pentetic acid ($C_{14}H_{23}N_3O_{10}$), and nitrilotriacetic acid ($C_6H_9NO_6$), or the like. In other embodiments, the blocking agent may include inorganic inhibitors, such as chromates, nitrites, molybdates and phosphates, and the cathodic type inhibitors, such as zinc and polyphosphate inhibitors.

In FIG. 4C, a barrier layer 428 is deposited on exposed dielectric surfaces, such as the dielectric material 416 and the etch stop layer 414. With the first blocking layer 426 formed on the metallic surfaces of the conductive features 408, the barrier layer 428 is selectively formed on the dielectric material 416 and the etch stop layer 414 and not formed on the first blocking layer 426. The barrier layer 428 may include the same material as the barrier layer 328 and may be formed by a conformal process, such as ALD. After the formation of the barrier layer 428, the first blocking layer 426 is removed using thermal degradation or plasma bombardment, or other suitable process. The top surface of the conductive feature 408 is exposed upon removal of the first blocking layer 426.

In FIG. 4D, a second blocking layer 427 is selectively formed on the exposed top surface of the conductive feature 408. In some embodiments, the second blocking layer 427 may include the same material as the first blocking layer 426. In some embodiments, the first and second blocking layers 426, 427 are made from a different material to enable selective deposition of the barrier layer 428 and the subsequent liner 430. In any case, the second blocking layer 427 is chosen so that it bonds with the metallic surfaces of the conductive features 408 and not the barrier layer 428, and that the subsequent liner 430 is selectively formed on the barrier layer 428 and not formed on the second blocking layer 427. Dividing the process of forming SAMs in two distinct stages (i.e., formation of the first and second blocking layers 426, 427) is advantageous because the first blocking layer 427 may be decomposed (due to poor thermal stability) during the formation of the barrier layer 428 and not have sufficient mechanical strength to withstand the heat and protect the conductive feature 408 during the formation of the liner 430. By replacing the first blocking layer 426 with the second blocking layer 427 prior to formation of the liner 430, the conductive feature 408 is not exposed during formation of the liner 430, and the liner 430 can be formed on the barrier layer 428 with enhanced selectivity.

In some embodiments, the second blocking layer 427 may include one or more SAMs having a head group and a tail group, in which the head group of the SAM may include a compound terminated with an azole, alkene or alkyne group to bond with the top surface of the conductive feature 408, and the tail group of the SAM may include a compound having a carbon (C) or fluorine (F) terminated group that is configured to bond with the subsequent liner 430. The second blocking layer 427 may be formed by ALD, CVD, spin-on, dipping, or other suitable process. In some embodiments, the second blocking layer 427 is selectively formed by molecular layer deposition (MLD) via gas phase precursors with specific functional groups attached to the top surface of the conductive feature 408 but not the barrier layer 428.

In FIG. 4E, a liner 430 is formed on the barrier layer 428. With the second blocking layer 427 formed on the metallic surfaces of the conductive features 408, the liner 430 is selectively formed on the barrier layer 428 and not formed on the second blocking layer 427. The liner 430 may include the same material as the liner 330 and may be formed by a conformal process, such as ALD. After the formation of the liner 430, the second blocking layer 427 may be removed using thermal degradation or plasma bombardment, or other suitable process. The top surface of the conductive feature 408 is exposed upon removal of the second blocking layer 427.

It is contemplated that the process of forming SAMs in two distinct stages as discussed in FIGS. 4B-4E is equally applicable to various embodiments (e.g., FIGS. 5A-5H, 6A-6H", 7A-7E", 9A-9H, 9D', 9E', 11A-11J, and 13A-13N) in this disclosure where a blocking layer is used.

In FIG. 4F, a conductive via 432 and a conductive line 434 are formed in the openings 418, 420 (FIG. 4E), respectively. The conductive via 432 and conductive line 434 may include the same material as the conductive via 332 and conductive line 334, and may be formed using any suitable deposition technique, as discussed above with respect to FIG. 3E. Thereafter, a planarization process, such as a CMP process, is performed so that the top surfaces of the conductive line 334, the liner 430, the barrier layer 428, and the dielectric material 416 are substantially co-planar. As shown in FIG. 4F, the interconnection structure 400 includes the conductive via 432 and conductive line 434 formed in the dielectric material 416. The conductive via 432 is in direct contact with the conductive features 408 in the dielectric material 401. Because there is no barrier layer or liner layer between the conductive via 432 and the conductive feature 408, the contact resistance between the conductive via 432 and the conductive feature 408 is reduced.

Figures 5G, 5H:
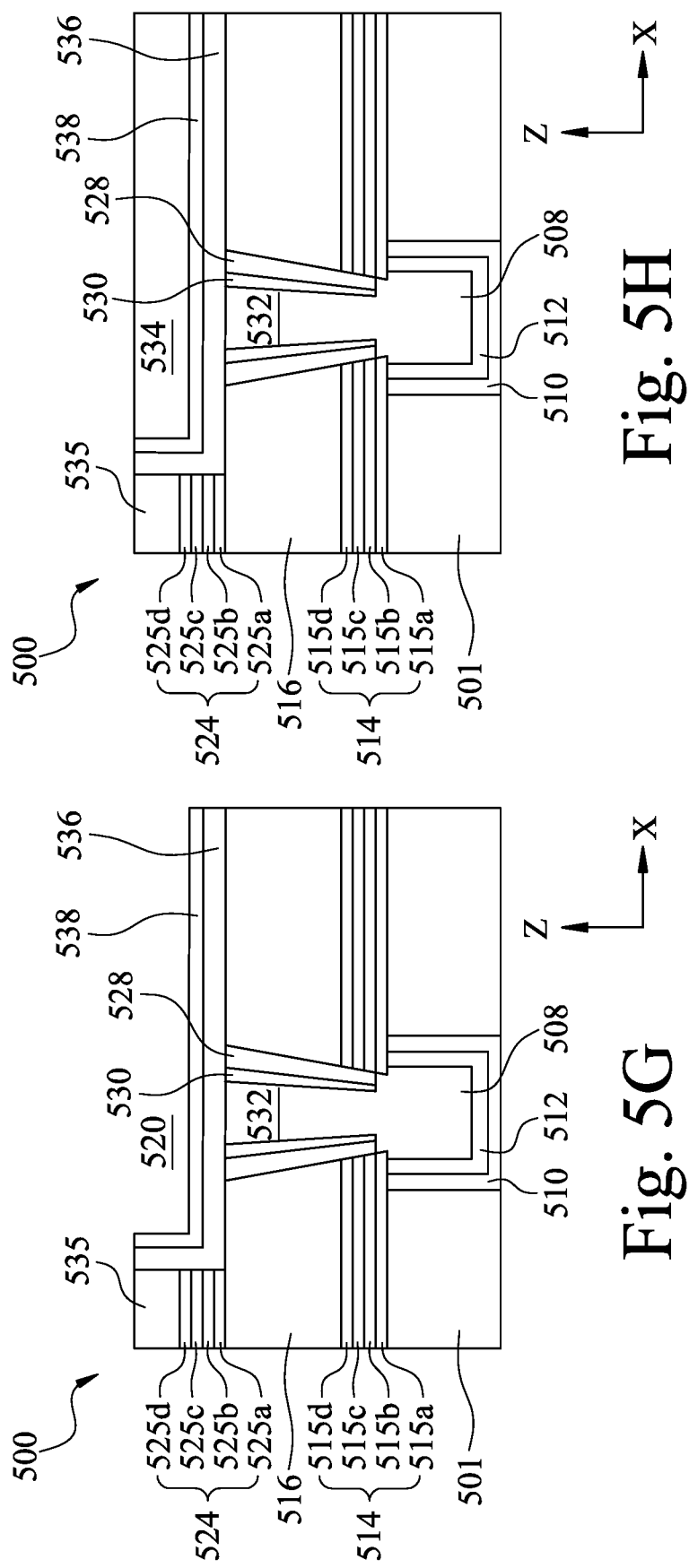

FIGS. 5A-5H are cross-sectional side views of various stages of manufacturing an interconnection structure 500, in accordance with some embodiments. Various embodiments of the interconnection structure 500 may be used to form one or more layers of the interconnection structure 250 shown in FIGS. 1 and 2. As will be discussed in more detail below, the embodiment shown in FIGS. 5A-5H is similar to the embodiment shown in FIGS. 3A-3E except that the embodiment of FIGS. 5A-5H is related to single damascene process. In FIG. 5A, the interconnection structure 500 includes a dielectric material 501, which may be the ILD layer 128 (FIG. 1) or the dielectric layer 202 (FIG. 2). The dielectric material 501 may include one or more conductive features 508 disposed therein. The one or more conductive features 508 may be the conductive lines 204 or conductive vias 206 (FIG. 2) and electrically connected to the S/D regions 124 and the gate electrode layer 138 (FIG. 1). The dielectric material 501 and the conductive feature 508 are similar to the dielectric material 301 and the conductive feature 308 discussed above.

The interconnection structure 500 includes a barrier layer 510 between the dielectric material 501 and the conductive feature 508, and a liner 512 between the barrier layer 510 and the conductive feature 508. The barrier layer 510 and the liner 512 may include the same material as the barrier layer 310 and the liner 312, respectively. The interconnection structure 500 includes a first etch stop layer 514 and a dielectric material 516 formed on the first etch stop layer 514. The dielectric material 516 may be the dielectric layer 202 (FIG. 2). The dielectric material 516 and the etch stop layer 514 may include the same material as the dielectric material 416 and the first etch stop layer 414 as discussed above. In one exemplary embodiment, the first etch stop layer 514 is a multi-layer structure including a first layer 515a in contact with the dielectric material 501, a second layer 515b disposed on the first layer 515a, a third layer 515c disposed on the second layer 515b, and a fourth layer 515d disposed on the third layer 515c. In one exemplary embodiment, the first layer 515a and the third layer 515c may include aluminum oxide, and the second layer 515b and the fourth layer 515d may include oxygen-doped silicon carbide. It is contemplated that other layer arrangements, such as those discussed above with respect to etch stop layer 314, are applicable to the first etch stop layer 514. Openings 518 (only one is shown) are formed in and through the dielectric material 516 and the first etch stop layer 514. The openings 518 are intended to be filled with a conductive material and form conductive features therein. In some embodiments, the openings 518 may be a via opening formed through the dielectric material 516 and the etch stop layer 514 to expose a top surface 508t of the conductive feature 508. The openings 518 may be formed by any suitable processes, such as one or more etch processes. The etch processes remove a portion of the first etch stop layer 514, so the opening 518 exposes the top surface 508t of the corresponding conductive feature 508. In some embodiments, the etch processes may remove a portion of the first etch stop layer 514 so that the opening 518 exposes the conductive feature 508 and portions of the liner 512.

In FIG. 5B, a blocking layer 526 is selectively formed on the exposed top surface 508t of the conductive feature 508. In some embodiments, the blocking layer 526 may include the same material as the blocking layer 326 and may be formed by a method similar to the method discussed above with respect to FIG. 3B. In one embodiment, the blocking layer 526 may include one or more self-assembled monolayers (SAMs) having a head group and a tail group, wherein the head group of the SAM may include a phosphorus (P), sulfur (S), silicon (Si), or nitrogen (N) terminated compound which may only attach to the metallic surfaces of the conductive features 508 (and the liners 512 if exposed). The head group of the SAM may not form on the dielectric surface of the dielectric material 516 and the first etch stop layer 514. The tail group of the SAM may include a highly hydrophobic long alkyl chain which blocks adsorption of a precursor (e.g., precursor for forming the subsequent barrier layer 528) from forming on the blocking layer 526. In some embodiments, the tail group includes a polymer such as polyimide.

In FIG. 5C, a barrier layer 528 is deposited on exposed dielectric surfaces, such as the dielectric material 516 and the first etch stop layer 514, and a liner 530 is deposited on the barrier layer 528. The barrier layer 528 and the liner 530 may include the same material as the barrier layer 328 and the liner 330, respectively, and may be formed in a similar fashion as the barrier layer 328 and liner 330 as discussed above with respect to FIG. 3C. With the blocking layer 526 formed on the metallic surfaces of the conductive features 508, the barrier layer 528 and the liner 530 are selectively formed on/over the dielectric material 516 and the first etch stop layer 514 and not formed on the blocking layer 526.

In some embodiments, the formation of the blocking layer 526 is replaced with a two-step process of forming SAMs as discussed above with respect to FIGS. 4B-4E. In such cases, after the formation of the barrier layer 528, the blocking layer 526 is removed, and a second blocking layer, such as the second blocking layer 427, is formed on the exposed top surface 508t of the conductive feature 508. Thereafter, the liner 530 is selectively formed on the barrier layer 528 and not on the second blocking layer. The second blocking layer may include the same material as the blocking layer 526. In some embodiments, the blocking layer 526 and second blocking layers are made from a different material to enable selective deposition of the barrier layer 528 and the subsequent liner 530, as discussed above with respect to FIGS. 4B-4E. In any case, the second blocking layer is chosen so that it bonds with the metallic surfaces of the conductive features 508 and not the barrier layer 528, and that the subsequent liner 530 is selectively formed on the barrier layer 528 and not formed on the second blocking layer. By replacing the first blocking layer 526 with the second blocking layer prior to formation of the liner 530, the conductive feature 508 is not exposed during formation of the liner 530, and the liner 530 can be formed on the barrier layer 528 with enhanced selectivity.

In FIG. 5D, the blocking layer 526 is removed using thermal degradation or plasma bombardment, or other suitable process. The top surface 508t of the conductive feature 508 is exposed upon removal of the blocking layer 526.

In FIG. 5E, conductive features 532 are formed in the openings 518 (FIG. 5D). In some embodiments, the conductive features 532 are conductive vias. The conductive features 532 may include the same material as the conductive vias 332 and may be formed using PVD, CVD, ALD, electroplating, ELD, or other suitable deposition process, or combinations thereof. Therefore, a planarization process, such as a CMP process, is performed so that the top surfaces of the conductive features 532, the liner 530, the barrier layer 528, and the dielectric material 516 are substantially co-planar.

Next, a second etch stop layer 524 is formed on the top surfaces of the conductive features 532, the liner 530, the barrier layer 528, and the dielectric material 516. The second etch stop layer 524 may include the same material as the first etch stop layer 514. In some embodiments, the second etch stop layer 524 is a multi-layer structure including a first layer 525a in contact with the conductive features 532, the liner 530, the barrier layer 528, and the dielectric material 516, a second layer 525b disposed on the first layer 525a, a third layer 525c disposed on the second layer 525b, and a fourth layer 525d disposed on the third layer 525c. In one exemplary embodiment, the first layer 525a and the third layer 525c may include aluminum oxide, and the second layer 525b and the fourth layer 525d may include oxygen-doped silicon carbide. It is contemplated that other layer arrangements, such as those discussed above with respect to etch stop layer 314, are applicable to the second etch stop layer 524.

In FIG. 5F, a dielectric material 535 is formed on the second etch stop layer 524. The dielectric material 535 may be the dielectric layer 202 (FIG. 2). The dielectric material 535 may include the same material as the dielectric material 501. Openings 520 (only one is shown) are then formed in the dielectric material 535 and the second etch stop layer 524 to expose portions of the dielectric material 516, the conductive features 532, the liner 530, and the barrier layer 528. The openings 520 may be formed by an etch process, such as a dry etch, wet etch, or a combination thereof. The openings 520 may be trenches, in some embodiments.

In FIG. 5G, a barrier layer 536 is formed in the openings 520 and on the dielectric material 516, the conductive features 532, the liner 530, the barrier layer 528, the second etch stop layer 524, and the dielectric material 535. The barrier layer 536 may include the same material as the barrier layer 528. Next, a liner 538 is formed on the barrier layer 536. The liner 538 may include the same material as the liner 530. The barrier layer 536 and the liner 538 may be formed by a conformal process, such as ALD.

In FIG. 5H, a conductive material 534 is formed on the liner 538. The conductive material 534 may include the same material as the conductive lines 334, and may be formed using PVD, CVD, ALD, electroplating, ELD, or other suitable deposition process, or combinations thereof. Thereafter, a planarization process, such as a CMP process, is performed so that the top surfaces of the conductive material 534, the liner 538, the barrier layer 536, and the dielectric material 535 are substantially co-planar. As shown in FIG. 5H, the interconnection structure 500 includes conductive vias 532 that are in direct contact with the underlying conductive features 508 formed in the dielectric material 501. Because there is no barrier layer or liner layer between the conductive via 532 and the conductive feature 508 (i.e., barrier- and liner-free via bottom), the contact resistance between the conductive via 532 and the conductive feature 508 is reduced.

Figures 6A, 6B, 6C, 6D, 6E, 6F:
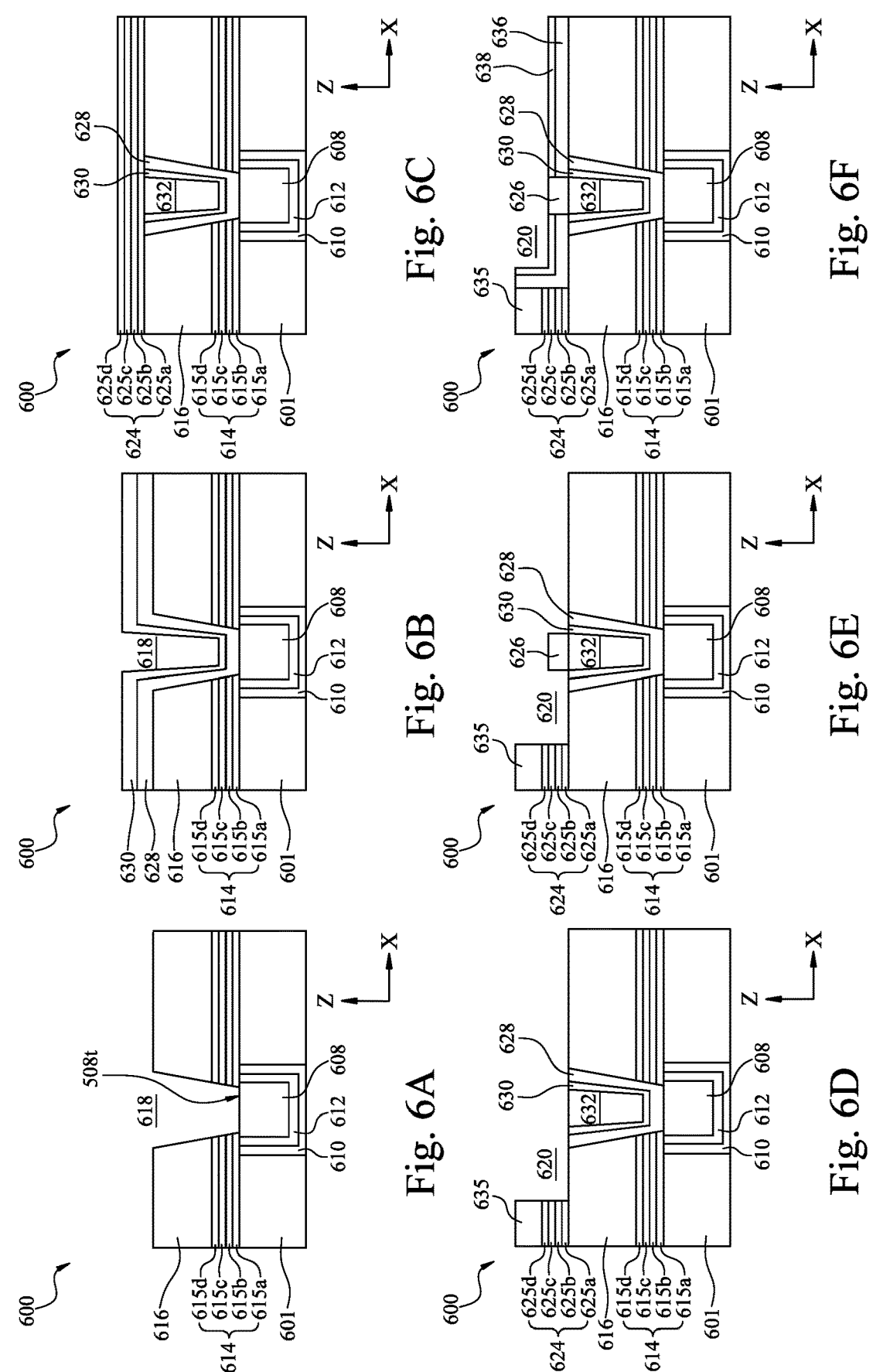
FIGS. 6A-6H are cross-sectional side views of various stages of manufacturing an interconnection structure, in accordance with some embodiments.

FIGS. 6A-6H are cross-sectional side views of various stages of manufacturing an interconnection structure 600, in accordance with some embodiments. Various embodiments of the interconnection structure 600 may be used to form one or more layers of the interconnection structure 250 shown in FIGS. 1 and 2. As will be discussed in more detail below, the embodiment shown in FIGS. 6A-6H is similar to the embodiment shown in FIGS. 5A-5E except that the embodiment shown in FIGS. 6A-6H is a barrier- and liner-free via top configuration. In FIG. 6A, the interconnection structure 600 includes a dielectric material 601, which may be the ILD layer 128 (FIG. 1) or the dielectric layer 202 (FIG. 2). The dielectric material 601 may include one or more conductive features 608 disposed therein. The one or more conductive features 608 may be the conductive lines 204 or conductive vias 206 (FIG. 2) and electrically connected to the S/D regions 124 and the gate electrode layer 138 (FIG. 1). The dielectric material 601 and the conductive feature 608 are similar to the dielectric material 501 and the conductive feature 508 discussed above.

The interconnection structure 600 includes a barrier layer 610 between the dielectric material 601 and the conductive feature 608, and a liner 612 between the barrier layer 610 and the conductive feature 608. The barrier layer 610 and the liner 612 may include the same material as the barrier layer 510 and the liner 512, respectively. The interconnection structure 600 includes a first etch stop layer 614 and a dielectric material 616 formed on the first etch stop layer 614. The dielectric material 616 may be the dielectric layer 202 (FIG. 2). The dielectric material 616 and the etch stop layer 614 may include the same material as the dielectric material 516 and the first etch stop layer 514. In one exemplary embodiment, the first etch stop layer 614 is a multi-layer structure including a first layer 615a in contact with the dielectric material 601, a second layer 615b disposed on the first layer 615a, a third layer 615c disposed on the second layer 615b, and a fourth layer 615d disposed on the third layer 615c. In one exemplary embodiment, the first layer 615a and the third layer 615c may include aluminum oxide, and the second layer 615b and the fourth layer 615d may include oxygen-doped silicon carbide. It is contemplated that other layer arrangements, such as those discussed above with respect to etch stop layer 314, are applicable to the first etch stop layer 614. Openings 618 (only one is shown) are formed in and through the dielectric material 616 and the first etch stop layer 614. The openings 618 are intended to be filled with a conductive material to form conductive features therein. In some embodiments, the openings 618 may be a via opening formed through the dielectric material 616 and the etch stop layer 614 to expose a top surface 608t of the conductive feature 608. The openings 618 may be formed by any suitable processes, such as one or more etch processes. In some embodiments, the etch processes may remove a portion of the first etch stop layer 614 so that the opening 618 exposes the conductive feature 608 and portions of the barrier layer 610 and the liner 612.

In FIG. 6B, a barrier layer 628 is deposited on exposed dielectric surfaces, such as the dielectric material 616 and the first etch stop layer 614, and a liner 630 is deposited on the barrier layer 628. The barrier layer 628 and the liner 630 may include the same material as the barrier layer 528 and the liner 530, respectively, and may be formed by a conformal process, such as ALD.

In FIG. 6C, conductive features 632 are formed in the openings 618 (FIG. 6B). In some embodiments, the conductive features 632 are conductive vias. The conductive features 632 may include the same material as the conductive vias 332 and may be formed using PVD, CVD, ALD, electroplating, ELD, or other suitable deposition process, or combinations thereof. Therefore, a planarization process, such as a CMP process, is performed so that the top surfaces of the conductive features 632, the liner 630, the barrier layer 628, and the dielectric material 616 are substantially co-planar.

Next, a second etch stop layer 624 is formed on the top surfaces of the conductive features 632, the liner 630, the barrier layer 628, and the dielectric material 616. The second etch stop layer 624 may include the same material as the first etch stop layer 614. In some embodiments, the second etch stop layer 624 is a multi-layer structure including a first layer 625a in contact with the conductive features 632, the liner 630, the barrier layer 628, and the dielectric material 616, a second layer 625b disposed on the first layer 625a, a third layer 625c disposed on the second layer 625b, and a fourth layer 625d disposed on the third layer 625c. In one exemplary embodiment, the first layer 625a and the third layer 625c may include aluminum oxide, and the second layer 625b and the fourth layer 625d may include oxygen-doped silicon carbide. It is contemplated that other layer arrangements, such as those discussed above with respect to etch stop layer 314, are applicable to the second etch stop layer 624.

In FIG. 6D, a dielectric material 635 is formed on the second etch stop layer 624. The dielectric material 635 may be the dielectric layer 202 (FIG. 2). The dielectric material 635 may include the same material as the dielectric material 601. Openings 620 (only one is shown) are then formed in the dielectric material 635 and the second etch stop layer 624 to expose portions of the dielectric material 616, the conductive features 632, the liner 630, and the barrier layer 628. The openings 620 may be formed by an etch process, such as a dry etch, wet etch, or a combination thereof. The openings 620 may be trenches, in some embodiments.

In FIG. 6E, a blocking layer 626 is selectively formed on the exposed top surface of the conductive feature 632. In some embodiments, the blocking layer 626 may include the same material as the blocking layer 326 and may be formed by a method similar to the method discussed above with respect to FIG. 3B. In one embodiment, the blocking layer 626 may include one or more self-assembled monolayers (SAMs) having a head group and a tail group, wherein the head group of the SAM may include a phosphorus (P), sulfur (S), silicon (Si), or nitrogen (N) terminated compound which may only attach to the metallic surfaces of the conductive features 632. In some embodiments, the head group of the SAM may not form on the barrier layer 628, the liner 630, and the dielectric surface of the dielectric material 616 and the second etch stop layer 624. In some embodiments where the conductive feature 632 and the liner 630 are formed from the same material (e.g., Cu or Co), the head group may include an azole group-containing compound and the blocking layer 626 is selectively formed on the top surface of the conductive feature 632 but not on the liner 630, the barrier layer 628, the dielectric materials 616, 635, and the second etch stop layer 624. In some embodiments where the conductive feature 632 and the liner 630 are formed from the same material (e.g., Ru), the head group may include an alkyne-containing compound and the blocking layer 626 is selectively formed on the top surface of the conductive feature 632 and the liner 630 but not on the barrier layer 628, the dielectric materials 616, 635, and the second etch stop layer 624. The tail group of the SAM may include a highly hydrophobic long alkyl chain which blocks adsorption of a precursor (e.g., precursor for forming the subsequent barrier layer 636) from forming on the blocking layer 626. In some embodiments, the tail group includes a polymer such as polyimide.

In FIG. 6F, a barrier layer 636 is formed in the opening 620 and in contact with the barrier layer 628, the liner 630, and the exposed dielectric surfaces, such as the dielectric materials 616, 635 and the second etch stop layer 624. A liner 638 is then deposited on the barrier layer 636. With the blocking layer 626 formed on the metallic surfaces of the conductive features 632, the barrier layer 636 and the liner 638 are selectively formed on/over the dielectric materials 616, 635 and the second etch stop layer 624 and not formed on the blocking layer 626. The barrier layer 636 and the liner 638 may include the same material as the barrier layer 328 and the liner 330, respectively, and may be formed by the same process as the barrier layer 328 and liner 330 as discussed above with respect to FIG. 3C.

In some embodiments, the formation of the blocking layer 626 is replaced with a two-step process of forming SAMs as discussed above with respect to FIGS. 4B-4E. In such cases, after the formation of the barrier layer 636, the blocking layer 626 is removed, and a second blocking layer, such as the second blocking layer 427, is formed on the exposed top surface of the conductive feature 632 (e.g., conductive via). Thereafter, the liner 638 is selectively formed on the barrier layer 636 and not on the second blocking layer. The second blocking layer may include the same material as the blocking layer 626. In some embodiments, the blocking layer 626 and second blocking layers are made from a different material to enable selective deposition of the barrier layer 636 and the liner 638, as discussed above with respect to FIGS. 4B-4E. In any case, the second blocking layer is chosen so that it bonds with the metallic surfaces of the conductive features 632 and not the barrier layer 636, and that the liner 638 is selectively formed on the barrier layer 636 and not formed on the second blocking layer. By replacing the first blocking layer 626 with the second blocking layer prior to formation of the liner 638, the conductive feature 632 is not exposed during formation of the liner 638, and the liner 638 can be formed on the barrier layer 636 with enhanced selectivity.

Figures 6G, 6H:
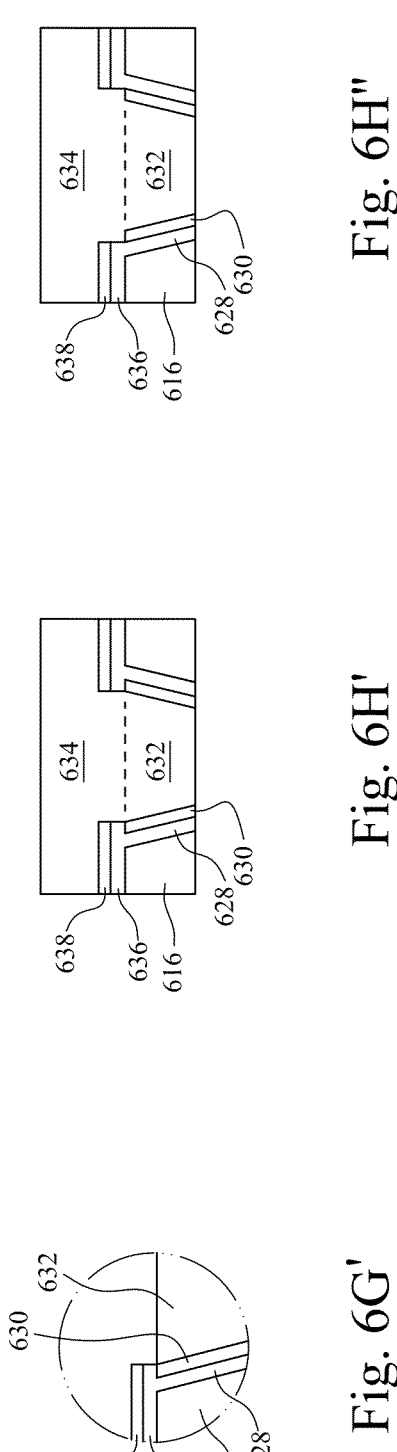

In FIG. 6G, after the formation of the barrier layer 636 and the liner 638, the blocking layer 626 is removed to expose the top surface of the conductive feature 632. The blocking layer 626 may be removed using thermal degradation or plasma bombardment, or other suitable process. Since the liner 630 was not covered by the blocking layer 626, the barrier layer 636 may cover the exposed portion of the liner 630, leaving the barrier layer 636 intervened between the liner 630 and the liner 638. FIG. 6G' is an enlarged view of a portion of the interconnection structure 600 showing the liner 630 is separated from the liner 638 by the barrier layer 636.

In FIG. 6H, a conductive material 634 is formed in the opening 620 and in contact with the liner 638, the barrier layer 636, and the conductive feature 632. In some embodiments, the conductive material 634 is a conductive line. The conductive material 634 may include the same or different material as the conductive feature 632, and may be formed using PVD, CVD, ALD, electroplating, ELD, or other suitable deposition process, or combinations thereof. Thereafter, a planarization process, such as a CMP process, is performed so that the top surfaces of the conductive material 634, the liner 638, the barrier layer 636, and the dielectric material 635 are substantially co-planar. FIG. 6H' is an enlarged view of a portion 670 of the interconnection structure 600 according to one embodiment where only the top surface of the conductive feature 632 was covered by the blocking layer 626. FIG. 6H' shows the conductive material 634 is in contact with the liner 638, the barrier layer 636, and the conductive feature 632, and the conductive feature 632 is in contact with the liner 630. The liner 638 is separated from the liner 630 by the barrier layer 636. The liner 630 is separated from the dielectric material 616 by the barrier layer 628. In some embodiments, the barrier layer 636 and the barrier layer 628 are made from the different material.

FIG. 6H" is an enlarged view of the portion 670 of the interconnection structure 600 according to another embodiment where the top surfaces of the conductive feature 632 and the liner 630 were covered by the blocking layer 626. In such a case, the conductive material 634 is in contact with the liner 638, the barrier layer 636, a portion of the liner 630, and the conductive feature 632. The liner 638 and the liner 630 are separated from each other by the conductive material 634. In any case, the barrier layer 636 is in contact with a conductive material, regardless of whether the conductive material 734 and the conductive feature 532 are formed by the same material.

As shown in FIGS. 6H, 6H', and 6H", the interconnection structure 600 includes conductive feature 632 (e.g., conductive via) that is in direct contact with the conductive material 634. Since there is no barrier layer or liner layer between the conductive material 634 and the top of the conductive feature 632 (i.e., barrier- and liner-free via top), the overall contact resistance of the interconnection structure 600 is reduced.

Figures 7A, 7B, 7C, 7D, 7E:
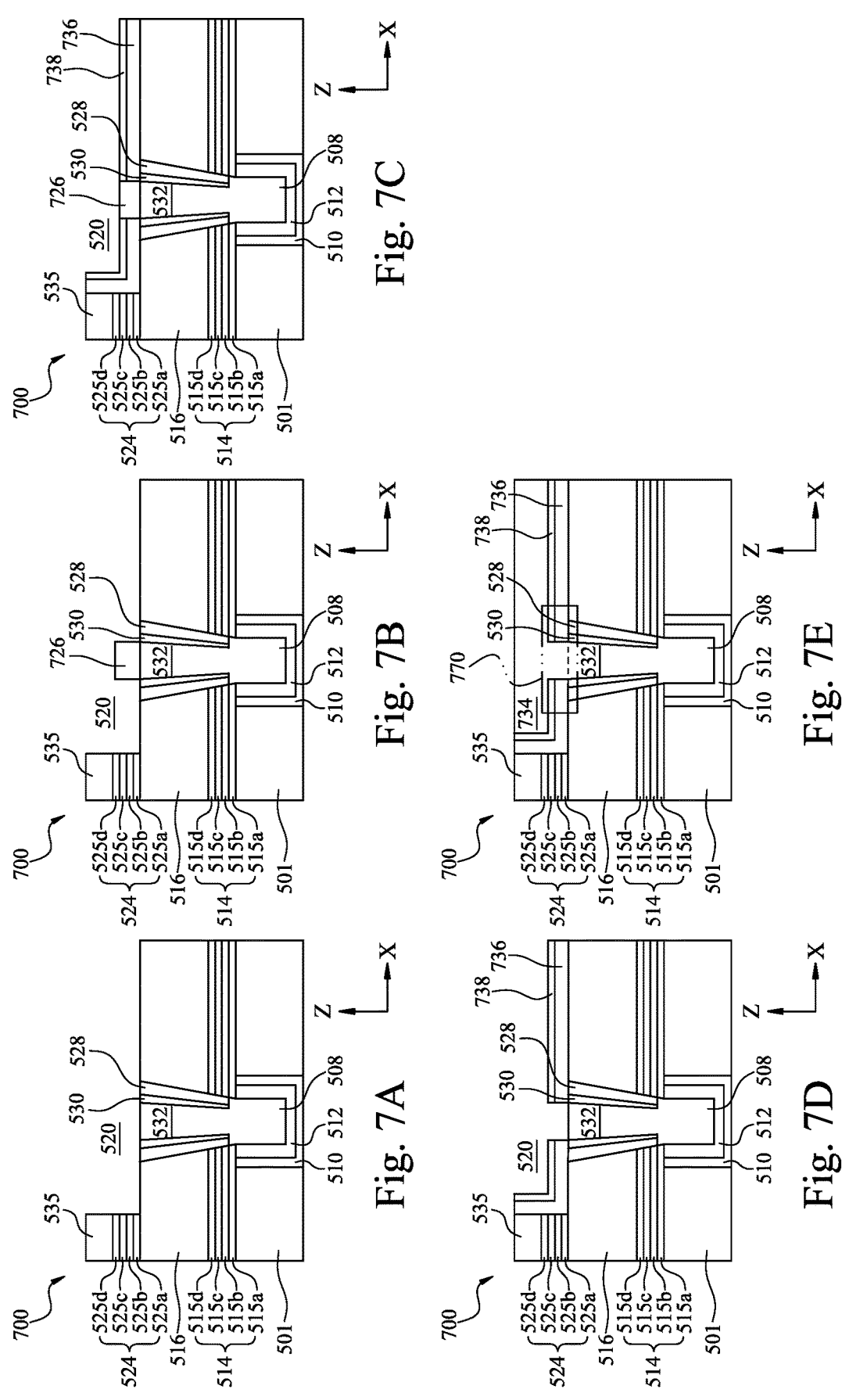
FIGS. 7A-7E are cross-sectional side views of various stages of manufacturing an interconnection structure, in accordance with some embodiments.

FIGS. 7A-7E' are cross-sectional side views of various stages of manufacturing an interconnection structure 700, in accordance with some embodiments. Various embodiments of the interconnection structure 700 may be used to form one or more layers of the interconnection structure 250 shown in FIGS. 1 and 2. As will be discussed in more detail below, the embodiment shown in FIGS. 7A-7E' is similar to embodiments shown in FIGS. 5A-5E and 6A-6H" except that the embodiment shown in FIGS. 7A-7E' is a barrier- and liner-free via top and bottom configuration. FIG. 7A shows a stage of the interconnection structure 700 that is fabricated according to various processes discussed above with respect to FIGS. 5A-5F. In FIG. 7B, a blocking layer 726 is selectively formed on the exposed top surface of the conductive feature 532. In some embodiments, the blocking layer 726 may include the same material as the blocking layer 626 and may be formed by a similar fashion as discussed above with respect to FIG. 6E. As discussed above, in some embodiments where the conductive feature 532 and the liner 530 are formed from the same material, the blocking layer 726 may be a SAM having a head group that is chosen to be selectively formed on the top surface of the conductive feature 532 and the liner 530 but not on the barrier layer 528 and the dielectric materials 516, 535 and the second etch stop layer 524.

In FIG. 7C, a barrier layer 736 is formed in the opening 520 and in contact with the barrier layer 528, the liner 530, and the exposed dielectric surfaces, such as the dielectric materials 516, 535 and the second etch stop layer 524. A liner 738 is then deposited on the barrier layer 736. With the blocking layer 726 formed on the metallic surfaces of the conductive features 532, the barrier layer 736 and the liner 738 are selectively formed on/over the dielectric materials 516, 535 and the second etch stop layer 524 and not formed on the blocking layer 726. The barrier layer 736 and the liner 738 may include the same material as the barrier layer 636 and the liner 638, respectively, and may be formed by the same process as the barrier layer 636 and liner 638 as discussed above with respect to FIG. 6F. In some embodiments, the liner 738 and the liner 530 are made from a different material. For example, the liner 738 may include CoRu and the liner 530 may include Co, or vice versa. In some embodiments, the barrier layer 736 and the barrier layer 528 are made from a different material. For example, the barrier layer 528 may include a metal nitride, and the barrier layer 736 may include a metal oxide or a 2D material, or vice versa.

Likewise, in some embodiments, the formation of the blocking layer 726 can be replaced with a two-step process of forming SAMs as discussed above with respect to FIGS. 4B-4E. In such cases, after the formation of the barrier layer 636, the blocking layer 726 is removed, and a second blocking layer, such as the second blocking layer 427, is formed on the exposed top surface of the conductive feature 532 (e.g., conductive via). Thereafter, the liner 738 is selectively formed on the barrier layer 736 and not on the second blocking layer. The second blocking layer may include the same material as the blocking layer 726. In some embodiments, the blocking layer 726 and second blocking layers are made from a different material to enable selective deposition of the barrier layer 736 and the liner 738, as discussed above with respect to FIGS. 4B-4E. In any case, the second blocking layer is chosen so that it bonds with the metallic surfaces of the conductive features 532 and not the barrier layer 736, and that the liner 738 is selectively formed on the barrier layer 736 and not formed on the second blocking layer. By replacing the first blocking layer 726 with the second blocking layer prior to formation of the liner 738, the conductive feature 532 is not exposed during formation of the liner 738, and the liner 738 can be formed on barrier layer 736 with enhanced selectivity.

In FIG. 7D, after the formation of the barrier layer 736 and the liner 738, the blocking layer 726 is removed to expose the top surface of the conductive feature 532. The blocking layer 726 may be removed using thermal degradation or plasma bombardment, or other suitable process. Since the liner 530 was not covered by the blocking layer 726, the barrier layer 736 may cover the exposed portion of the liner 530, leaving the barrier layer 736 intervened between the liner 530 and the liner 738. That is, the liner 530 is separated from the liner 738 by the barrier layer 736.

In FIG. 7E, a conductive material 734 is formed in the opening 520 and in contact with the liner 738, the barrier layer 736, and the conductive feature 532. In some embodiments, the conductive material 734 is a conductive line. The conductive material 734 may include the same or different material as the conductive feature 532, and may be formed using PVD, CVD, ALD, electroplating, ELD, or other suitable deposition process, or combinations thereof. Thereafter, a planarization process is performed so that the top surfaces of the conductive material 734, the liner 738, the barrier layer 736, and the dielectric material 535 are substantially co-planar.

FIG. 7E' is an enlarged view of a portion 770 of the interconnection structure 700 according to one embodiment where only the top surface of the conductive feature 532 was covered by the blocking layer 726. FIG. 7E" shows the conductive material 734 is in contact with the liner 738, the barrier layer 736, and the conductive feature 532, and the conductive feature 532 is in contact with the liner 530. The liner 738 is separated from the liner 530 by the barrier layer 736. The liner 530 is separated from the dielectric material 516 by the barrier layer 528. In some embodiments, the barrier layer 736 and the barrier layer 528 are made from the different material.

FIG. 7E" is an enlarged view of the portion 770 of the interconnection structure 700 according to another embodiment where the top surfaces of the conductive feature 532 and the liner 530 were covered by the blocking layer 726. In such a case, the conductive material 734 is in contact with the liner 738, the barrier layer 736, a portion of the liner 530, and the conductive feature 532. The liner 738 and the liner 530 are separated from each other by the conductive material 734. In any case, the barrier layer 736 is in contact with the conductive material, regardless of whether the conductive material 734 and the conductive feature 532 are formed by the same material.

As shown in FIGS. 7E, 7E', and 7E", the interconnection structure 700 includes conductive feature 532 (e.g., conductive via) that is in direct contact with the conductive material 734 and the conductive feature 508. Since there is no barrier layer or liner layer on either side of the conductive feature 532 (i.e., barrier- and liner-free via top and bottom), the overall contact resistance of the interconnection structure 700 is reduced.

FIG. 8 is a flow chart of a method 800 for manufacturing an interconnect structure according to embodiments of the present disclosure. FIGS. 9A-9H are cross-sectional side views of various stages of manufacturing an interconnect structure 900 according to the method 800 of FIG. 8. FIGS. 9D'-9G' are schematical partial enlarged views of regions in FIGS. 9D-9G respectively. The method 800 and the interconnect structure 900 may be used on one or more layers of the interconnection structure 250.

Figure 9A:
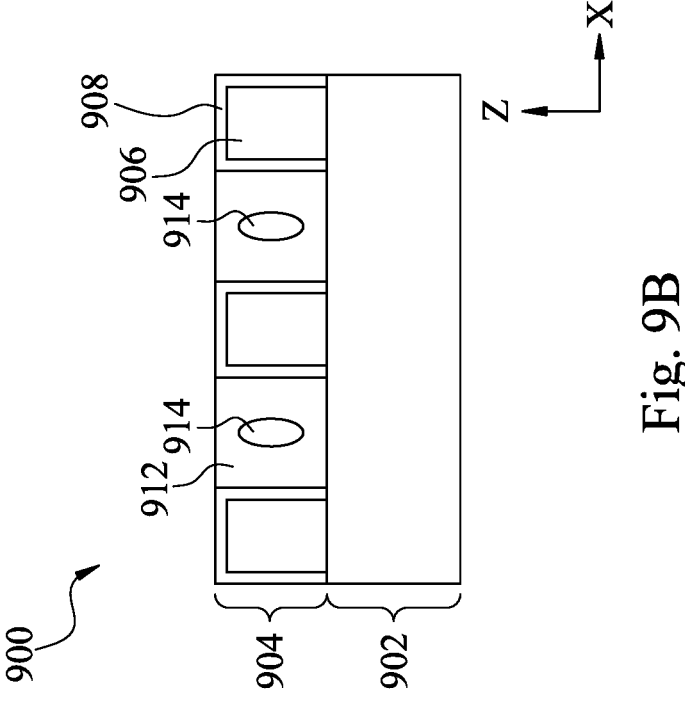
FIGS. 9A-9D, 9D', 9E, 9E', 9F, 9F', 9G, 9G' and 9H are cross-sectional side views of various stages of manufacturing an interconnect structure according to embodiments of the present disclosure.

In operation 802 of the method 800, a plurality of conductive features 906 are formed in an IMD layer 904, as shown in FIG. 9A. In FIG. 9A, the IMD layer 904 is formed over a layer 902, which may be an ILD layer, such as the ILD layer 128 in FIG. 1, or an intermetal dielectric (IMD) layer. In some embodiments, the layer 902 may be dielectric layer having one or more conductive features, not shown, disposed therein. In some embodiments, an etch stop layer may be between the layer 902 and the plurality of conductive features 906. The conductive features 906 may a thickness ranging from about 50 Angstroms to about 500 Angstroms.

The plurality of conductive features 906 may be formed by any suitable methods. In some embodiments, as shown in FIG. 9A, the plurality of conductive features 906 may be formed by depositing and then patterning a conductive layer on the layer 902. The conductive layer may be deposited on the layer 902 by PVD, CVD, ALD, or other suitable process, and then patterned to form the plurality of conductive features 906. In some embodiments, the plurality of conductive features 906 may be formed by patterning a hard mask layer over the conductive layer, then etching the conductive layer using the patterned hard mask by a suitable etching process, such as a directional ion etch. The plurality of conductive features 906 may be conductive lines separated by a plurality of openings 910. The openings 910 may be trenches. The conductive features 906 may include an electrically conductive material, such as Ru, Cu, Co, Mo, Cr, W, Mn, Rh, Jr, Ni, Pd, Pt, Ag, Au, Al, alloys thereof, or other suitable material. In some embodiments, the conductive feature 906 includes a metal.

In some embodiments, after etching the conductive layer to form the conductive features 906, a capping layer 908 may be formed on exposed surfaces of the plurality of conductive features 906 to prevent diffusion of the conductive material into adjacent regions. The capping layer 908 may be a metal nitride layer, such as TaN, or oxygen-doped silicon carbide (SiC:O, also known as ODC), or any suitable material. The capping layer 908 provide protection to the conductive features 906 from the processing chemistry in subsequent processes. The capping layer 908 may also function as a barrier layer to prevent diffusion of metal material from the conductive features 906 into the surrounding dielectric material if present. In some embodiments, the capping layer 908 is selectively formed on the exposed surface of the conductive features 906. The capping layer 908 may be formed on a top surface 906*t* and sidewalls 906*s* of each conductive feature 906. Each opening 910 is defined between the capping layer 908 on the sidewalls 906*s* of neighboring conductive features 906. In some embodiments, the capping layer 908 may be selectively formed by selectively growing a metal layer on the exposed surfaces of the conductive features 906 and performing a plasma treatment of the metal layer after the metal layer is grown on the exposed surfaces of the conductive features. The metal layer may be selectively grown by electroplating, or other suitable methods. The plasma treatment may be performed using a nitrogen containing plasma or a carbon containing plasma. The plasma treatment transforms the metal layer to the capping layer 908 by forming a metal nitride or metal carbide from the metal layer. The capping layer 908 may have a thickness ranging from about 2 Angstroms to about 50 Angstroms. A thickness less than about 2 Angstroms may not provide enough coverage and protection to the conductive features 906 during subsequent processing. A thickness greater than 50 Angstroms may be increase device dimension without providing additional benefit of protection.

Figure 9B:
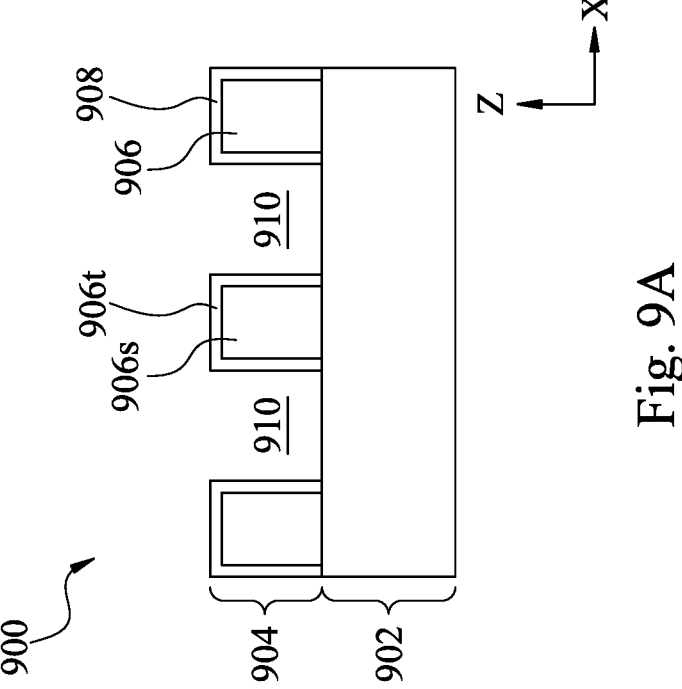
Figure 9D:
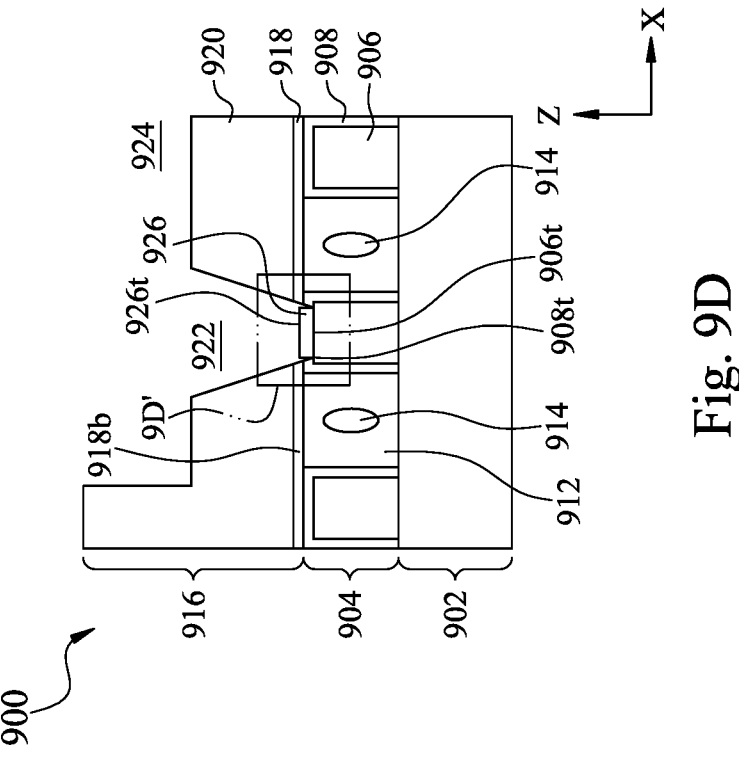

In operation 804 of the method 800, the plurality of openings 910 are filled with a dielectric layer 912 with air gaps 914 formed therein, as shown in FIG. 9B. In some embodiments, the dielectric layer 912 may be deposited by a suitable deposition process to generate the air gaps 914 therein. In some embodiments, the dielectric layer 912 is deposited by a CVD process, such as a flowable CVD process. The formation of the dielectric layer 912 is tuned to effectively close up an upper portion of the openings 910, thereby resulting in the air gaps 914. The parameters in the CVD process, such as pressure, temperature, reactant viscosity, may be tuned in a way such that a gap fill behavior of dielectric materials maintains the air gap 914 without filling up the openings 910. The air gaps 914 in FIG. 9B are shown in oval shapes. However, the air gaps 914 may have other shapes depending on the dimension of the openings 910, and/or process parameters used to deposit the dielectric layer 912. For example, the air gaps 914 may be formed in triangular-like shape by selecting process parameter to a certain degree of non-conformity during deposition of the dielectric layer 912. In some embodiments, the dielectric layer 912 may include a low-k material, such as a silicon oxide material formed by TEOS, BPSG, FSG, PSG, and BSG. In some embodiments, the dielectric layer 912 is a silicon oxide layer.

After deposition of the dielectric layer 912, a planarization process, such as a CMP process, is performed to expose the capping layer 908 formed on the top surfaces 906*t* of the plurality of conductive features 906 and complete the fabrication of the IMD layer 904. As shown in FIG. 9B, the IMD layer 904 includes the plurality of conductive features 906, the dielectric layer 912, and the capping layer 908. An IMD layer 916 is fabricated on the IMD layer 904 using the subsequent operations of the method 800.

Figure 9C:
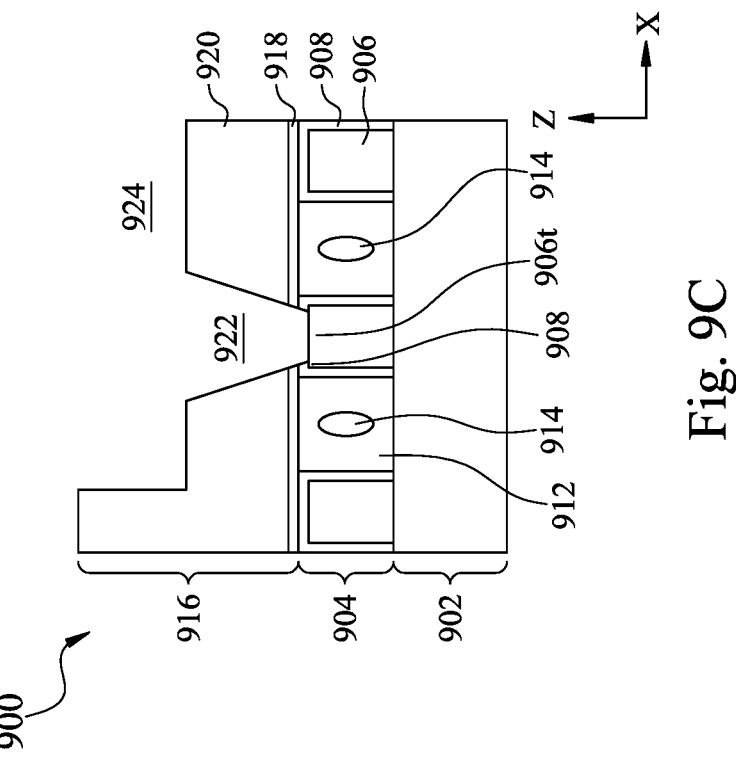

In operation 806, an etch stop layer 918 and a dielectric layer 920 are sequentially deposited on the IMD layer 904, as shown in FIG. 9C. The etch stop layer 918 is formed on the capping layer 908 and the dielectric layer 912. The etch stop layer 918 may be a single layer or a multi-layer structure. In some embodiments, the etch stop layer 918 includes a silicon-containing material, such as SiCO, SiCN, SiN, SiCON, $SiO_x$, SiC, SiON, or other suitable material. The etch stop layer 918 may include a material different from the dielectric layer 920 to have different etch selectivity compared to the dielectric layer 920. The etch stop layer 918 may be formed by any suitable process, such as CVD, ALD, spin-on, or any conformal deposition process. The etch stop layer 918 may have a thickness ranging from about 1 Angstrom to about 100 Angstroms.

The dielectric layer 920 is formed on the etch stop layer 918. The dielectric layer 920 may be a low-k dielectric material. For example, the dielectric layer 920 may be an oxide formed by TEOS, un-doped silicate glass, or doped silicon oxide such as BPSG, fused FSG, PSG, BSG, OSG, SiOC, and/or any suitable low-k dielectric material. The dielectric layer 920 may be deposited by spin-on, CVD, FCVD, PECVD, PVD, or any suitable deposition technique. The thickness of the dielectric layer 920 may be selected according to density of the conductive features formed therein. In some embodiments, the dielectric layer 920 may have a thickness in a range between 175 Angstroms to about 4500 Angstroms.

In operation 808 of the method 800, a patterning process is performed to form openings 924, 922 in and through the dielectric layer 920, as shown in FIG. 9C. The openings 922, 924 are intended to be filled with a conductive material and form conductive features therein. The openings 922, 924 may be formed by any suitable process. In some embodiments, the openings 922, 924 may be a result of a dual-damascene process. The opening 924 may be a trench opening formed in an upper portion of the dielectric layer 920. The opening 922 is a via opening connected to the opening 924 and through the dielectric layer 920 and the etch stop layer 918. The openings 922, 924 may be formed by any suitable processes, such as one or more etch processes. The etch processes also remove a portion of the etch stop layer 918 and the cap layer 908, so the opening 922 exposes the top surface 906*t* of the corresponding conductive feature 906. In some embodiments, the opening 922 may also expose a top surface 908*t* of the capping layer 908 formed on sidewalls 906*s* of the conductive feature 906. Other patterning processes, such as single damascene patterning process, or 1.5 damascene patterning process may be used form via openings in connection with one or more conductive features 906.

In operation 810 of the method 800, a blocking layer 926 is selectively formed on the exposed top surface 906t of the conductive feature 906, as shown in FIG. 9D. As shown in FIG. 9D', at least a portion of the blocking layer 926 is formed at a level below a bottom surface 918b of the etch stop layer 918 because the capping layer 908 formed below the bottom surface 918b of the etch stop layer 918 has been partially removed to expose the top surface 906t. Depending on the processing condition and/or the geometry of the opening 922, the blocking layer 926 may have a thinner thickness near sidewall surface 908s of the capping layer 908. In some embodiments, when a top surface 926t of the blocking layer 926 is below the bottom surface 918b of the etch stop layer 918 and/or the thinner formation of the blocking layer 926 the surface 908s, the sidewall surface 908s of the capping layer 908 may remain exposed after formation of the blocking layer 926. In some embodiments, the blocking layer 926 may be organic material including small molecule or polymer. The blocking layer 926 may include one or more self-assembled monolayers (SAMs) of a blocking compound having a head group and a tail group. The head group of the blocking compound may only attach to the metallic surfaces of the conductive features 906, and may not form on the dielectric surface of the dielectric layer 920, the etch stop layer 918, and the capping layer 908. The tail group of the blocking compound may include a highly hydrophobic long alkyl chain which blocks adsorption of a precursor (e.g., the precursors for forming a subsequent liner layer and barrier layer) from forming on the blocking layer 926. In some embodiments, the tail group includes a polymer such as polyimide.

The blocking agent may include one or more metal inhibitors configured to selectively attach to the metallic surface of the conductive feature 906. Suitable metal inhibitor may be Bezotriazole ($C_6H_5N_3$), Benzimidazole ($C_7H_6N_2$), Tolyltriazole ($C_7H_7N_3$), Oxalic acid ($C_2H_2O_4$), Malonic acid ($C_3H_4O_4$), Citric acid ($C_6H_8O_7$), Lactic acid ($C_3H_6O_3$), Ethylenediaminetetraacetic acid ($C_{10}H_{16}N_2O_8$), Ethylenebis (oxyethylenenitrool) tetraacetic acid ($C_{14}H_{24}N_2O_{10}$), Pentetic acid ($C_{14}H_{23}N_3O_{10}$), and Nitrilotriacetic acid ($C_6H_9NO_6$), or the like. In other embodiments, the blocking layer 926 may include inorganic inhibitors, such as chromates, nitrites, molybdates and phosphates, and the cathodic type includes zinc and polyphosphate inhibitors. In some embodiments, the blocking layer 926 may be formed by supplying a blocking agent to the exposed surfaces, for example by CVD, ALD, wet coating, immersion process, or other suitable methods.

In some embodiments, the blocking layer 926 may have a thickness in a range between about 2 angstrom and about 100 Angstroms. A thickness less than 2 Angstroms may not provide enough coverage and protection to the conductive feature 906 underneath. A thickness greater than 100 Angstroms may block portions of the dielectric layer 920 or the etch stop layer 918 resulting in incomplete coverage of the subsequently formed barrier layer and liner layer.

Figure 9F:
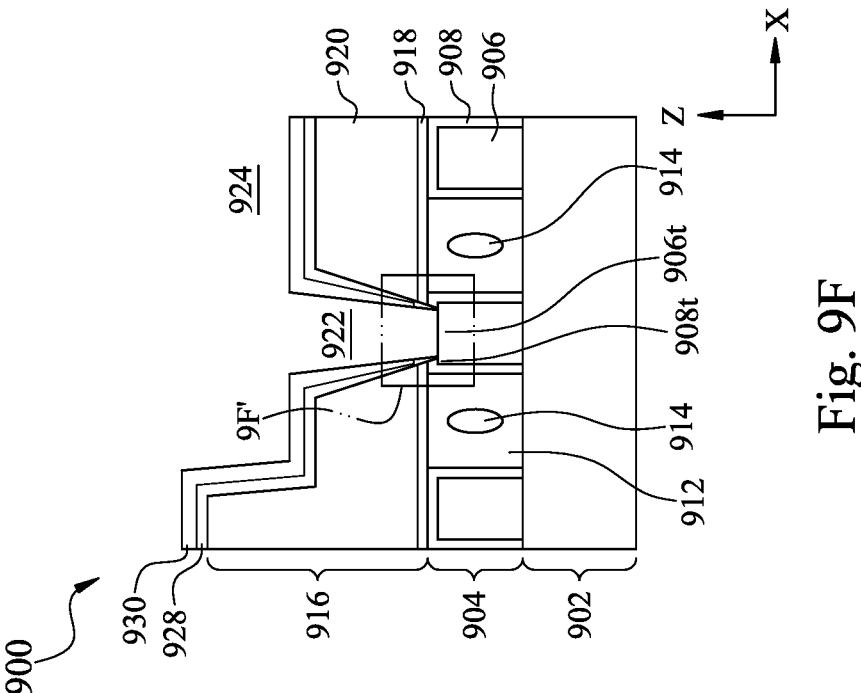
Figure 9E:
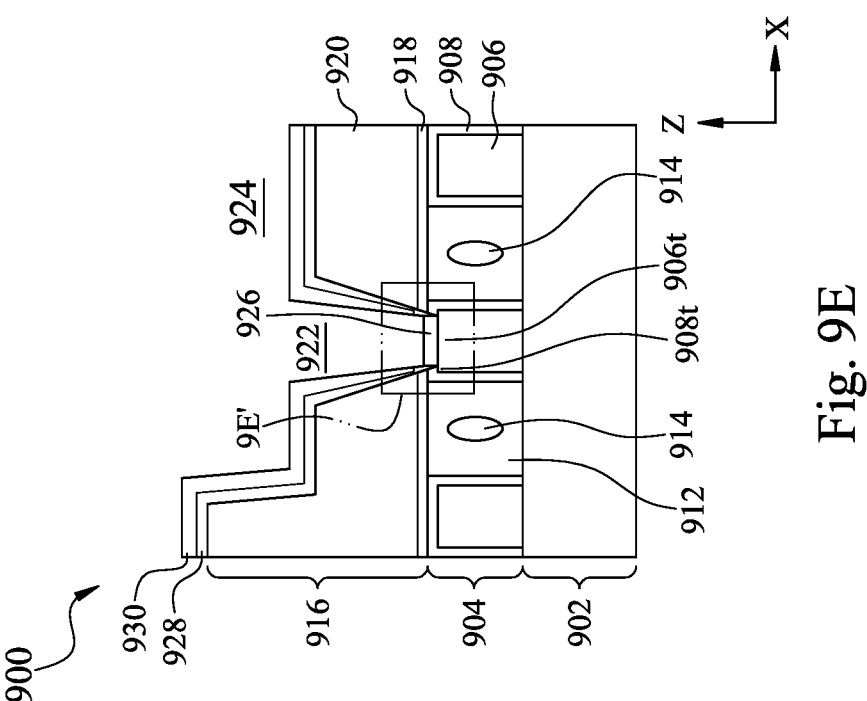

In operation 812 of the method 800, a barrier layer 928 and a liner layer 930 are deposited on exposed dielectric surfaces, such as the dielectric layer 920, and the etch stop layer 918, as shown in FIG. 9E. With the blocking layer 926 formed on the metallic surfaces of the conductive features 906, the barrier layer 928, and the liner layer 930 are selectively formed on the dielectric layer 920 and the etch stop layer 918 and not formed on the blocking layer 926. In some embodiments, as shown in the enlarged view in FIG. 9E', the barrier layer 928 may be formed on the sidewall surface 908s of the capping layer 908.

In some implementations, the barrier layer 928 may be a metal nitride, such as TaNx, TiNx or WNx, or a metal oxide, such as HfOx, and other suitable material. The liner layer 930 may be formed of suitable metal, such as Co, Ru, or an alloy, such as CoRu. In some embodiments, the barrier layer 928 may be deposited using ALD, or CVD. The barrier layer 928 may be formed to a thickness between about 0.5 nm and about 5 nm. In some embodiments, the liner layer 930 may be deposited using ALD, or CVD. A liner layer 930 may be formed to a thickness between about 0.5 nm and 3 nm. In some embodiments, the deposition process of the liner layer 930 or the barrier layer 928 may be performed in a temperature range between room temperature to about 400° C.

In operation 814 of the method 800, the blocking layer 926 is removed to expose the top surface 906t of the conductive feature 906, as shown in FIG. 9F. The blocking layer 926 may be removed using thermal degradation or plasma bombardment, or other suitable process.

Figure 9H:
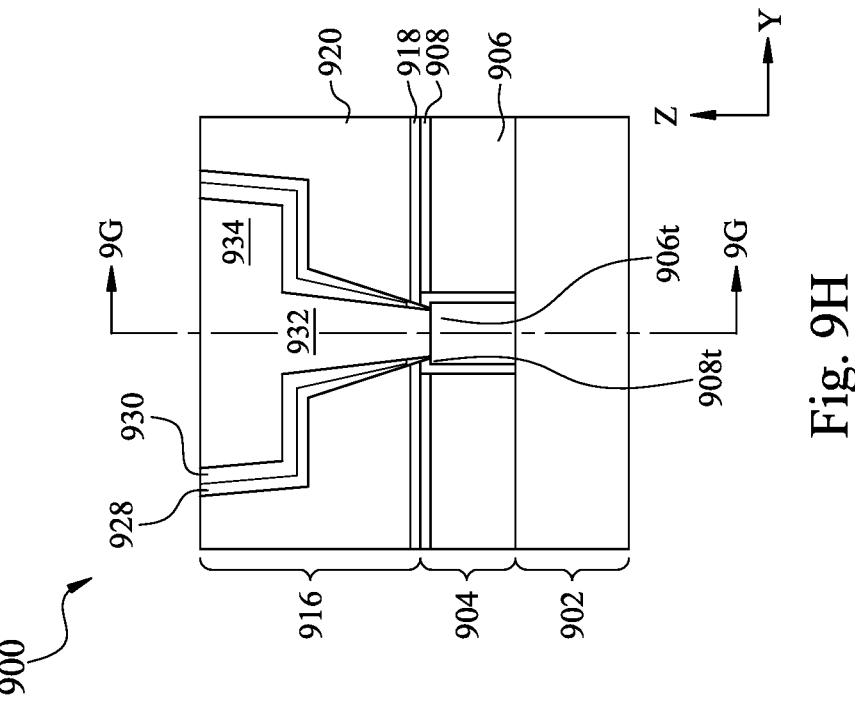
Figure 9G:
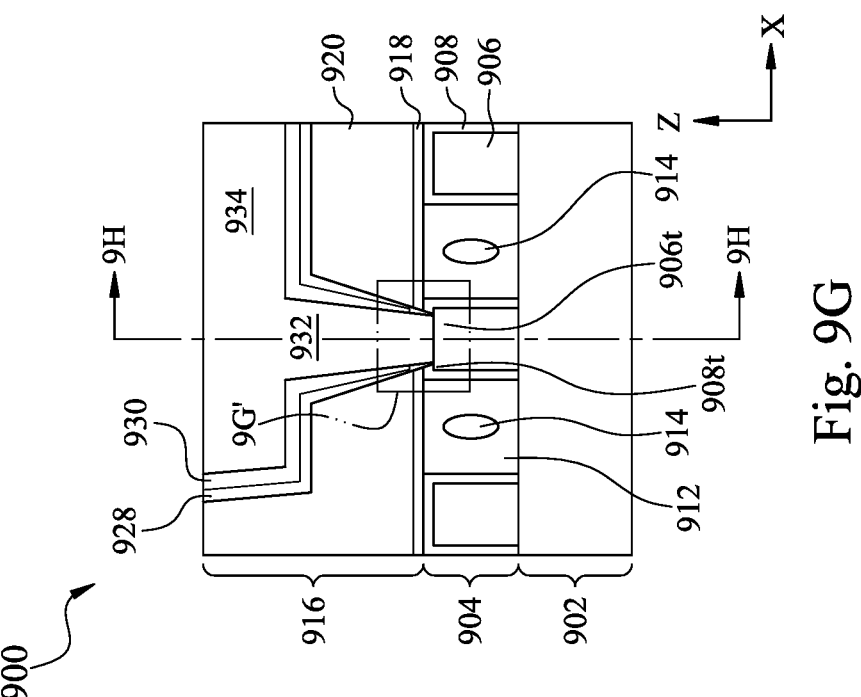
Figure 9E:
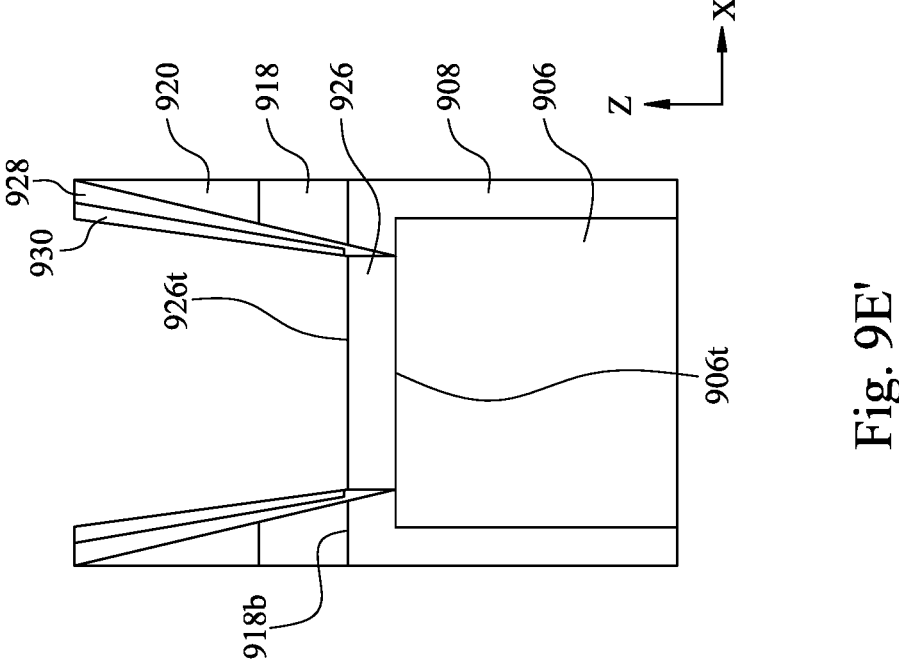
Figure 9D:
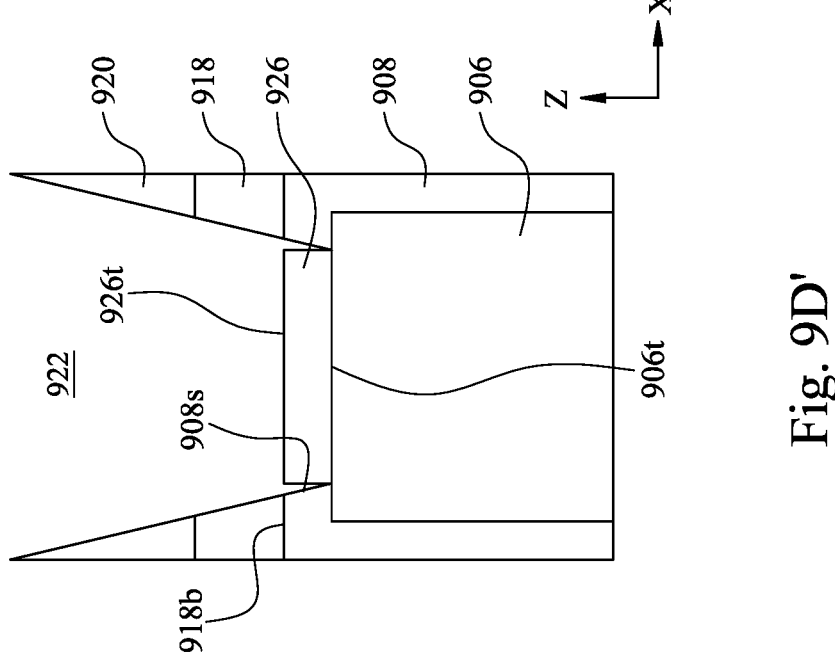
Figure 9G:
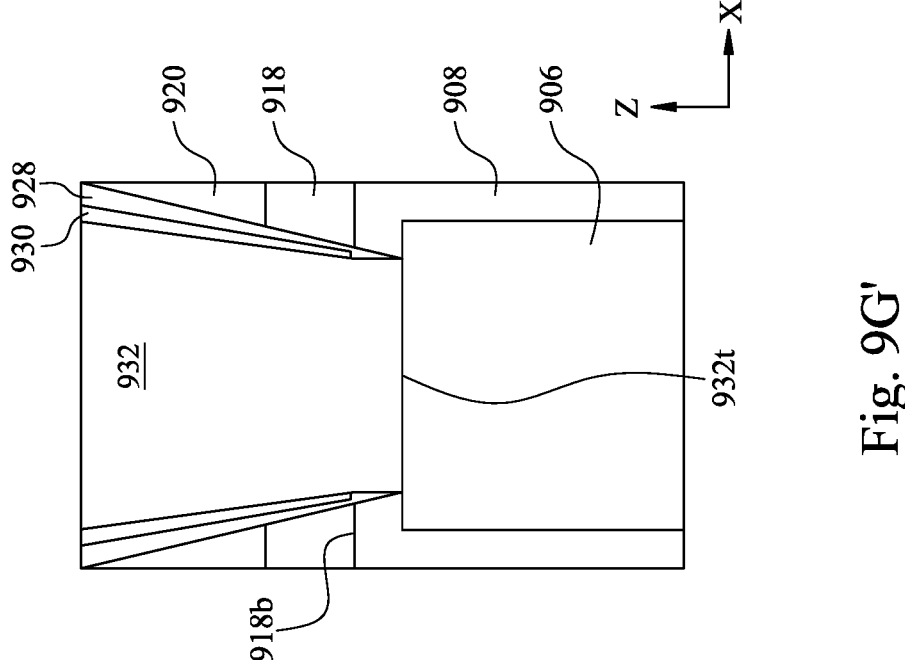
Figure 9F:
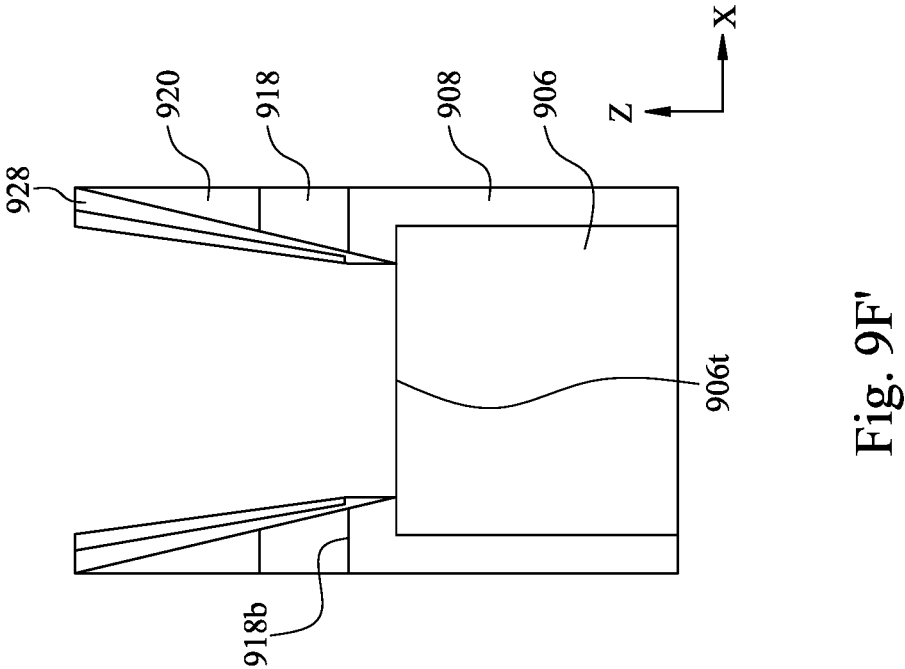

In operation 816 of the method 800, conductive lines 934 and conductive vias 932 are formed in the openings 924, 922 respectively, as shown in FIGS. 9G and 9H. FIG. 9H is a cross sectional view of the interconnect structure 900 along the 9H-9H line in FIG. 9G. FIG. 9G is a cross sectional view of the interconnect structure 900 along the 9G-9G line in FIG. 9H. The conductive lines 934 and conductive vias 932 may be formed by filling a conductive material in the openings 922, 924. As shown in FIG. 9G', a bottom surface 932b of the conductive via 932 is formed below the bottom surface 918b of the etch stop layer 918. The conductive lines 934 and conductive vias 932 may include any suitable conductive material, such as Cu, Ru, W, Ni, Al, Co, iridium (Jr), osmium (Os), gold (Au), palladium (Pd), platinum (Pt), silver (Ag), tantalum (Ta), titanium (Ti), or alloys thereof. The conductive lines 934 and conductive vias 932 may be deposited using PVD, CVD, ALD, electroplating, ELD, or other suitable deposition process, or combinations thereof, and followed by a planarization process, such as a CMP process.

Fabrication of the IMD layer 916 is complete after operation 816. As shown in FIGS. 9G and 9H, the IMD layer 916 includes conductive lines 934 and conductive vias 932 formed in the dielectric layer 920 and the etch stop layer 918. The conductive via 932 is in direct contact with the conductive features 906 in the IMD layer 904. Because there is no barrier layer or liner layer between the conductive via 932 and the conductive feature 906, the resistance between the conductive via 932 and the conductive feature 906 is reduced. The air gaps 914 formed in the dielectric layer 912 lowers the dielectric constant K of the dielectric material between the neighboring conductive features 906, thus, reducing capacitance between the conductive features 906 and reducing RC delay.

Figure 10:
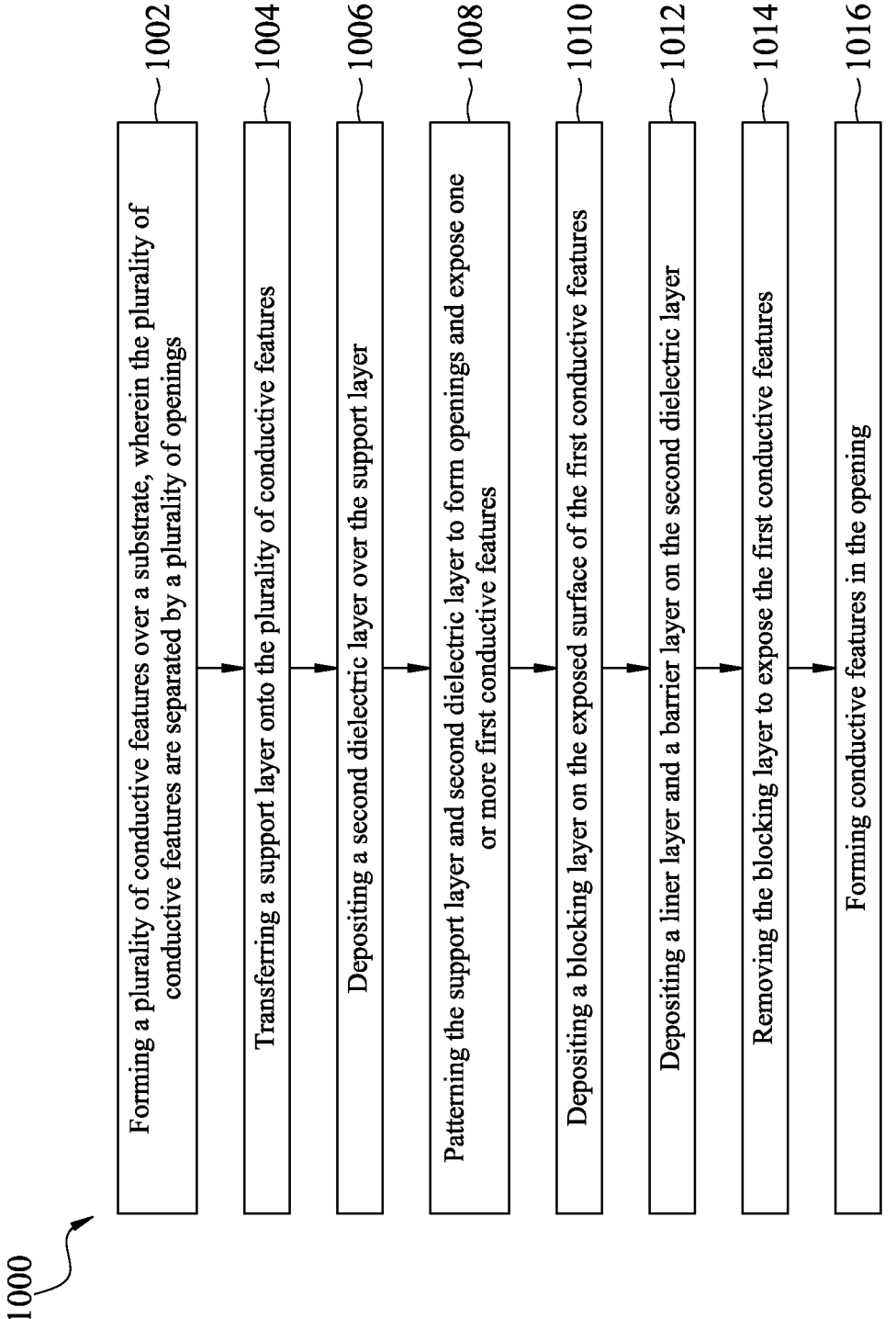
FIG. 10 is a flow chart of a method for manufacturing an interconnect structure according to embodiments of the present disclosure.

FIG. 10 is a flow chart of a method 1000 for manufacturing an interconnect structure according to embodiments of the present disclosure. FIGS. 11A-11J are cross-sectional side views of various stages of manufacturing an interconnect structure 1100 according to the method 1000 of FIG. 10. The method 1000 and the interconnect structure 1100 may be used on one or more layers of the interconnection structure 250.

Figures 11A, 11B:
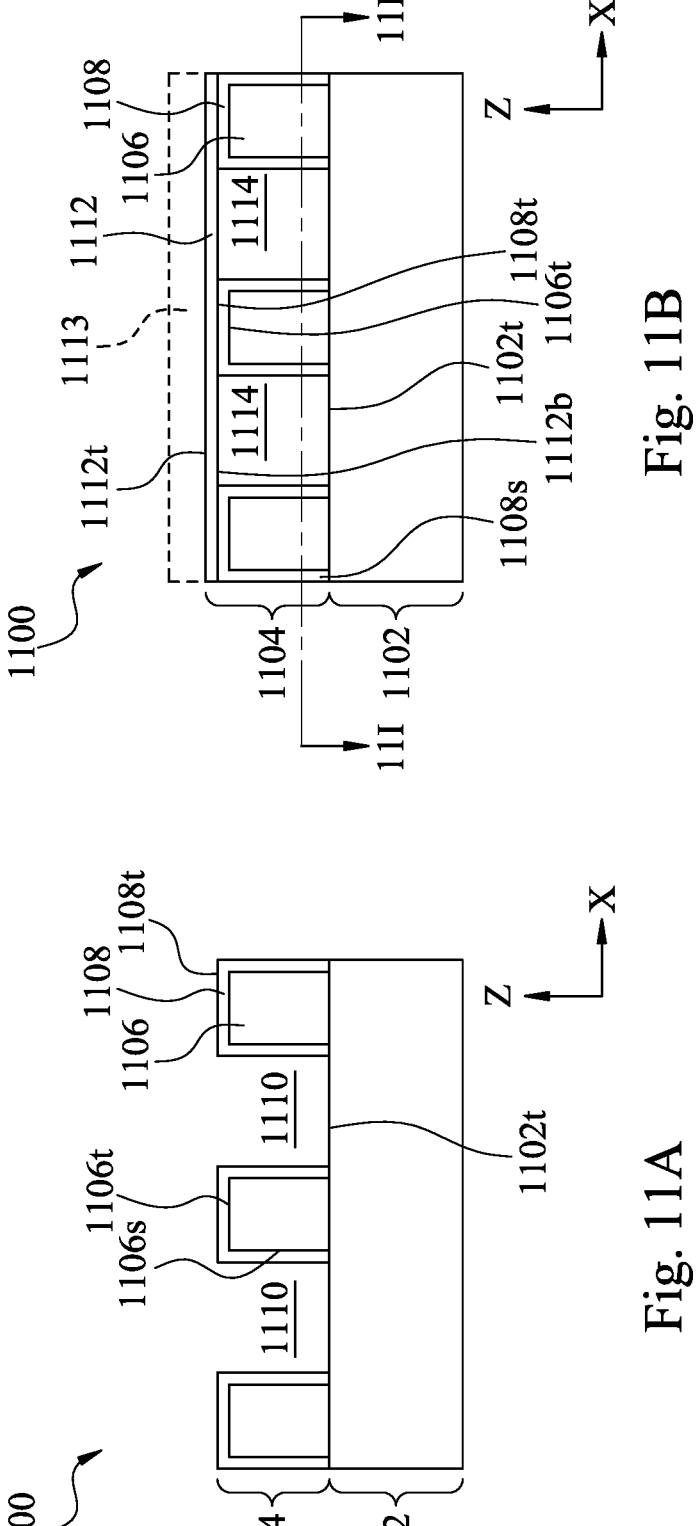
FIGS. 11A-11J are cross-sectional side views of various stages of manufacturing an interconnect structure according to embodiments of the present disclosure.

In operation 1002 of the method 1000, a plurality of conductive features 1106 are formed in an IMD layer 1104, as shown in FIG. 11A. In FIG. 11A, the IMD layer 1104 is formed over a layer 1102. The layer 1102 may be an ILD layer, such as the ILD layer 128 in FIG. 1, or an intermetal dielectric (IMD) layer. In some embodiments, the layer 1102 is similar to the layer 902 described in FIG. 9A above.

The plurality of conductive features 1106 are formed on a top surface 1102t of the layer 1102. In some embodiments, an optional etch stop layer, not shown, may be formed between the conductive features 1106 and the layer 1102. The plurality of conductive features 1106 may be formed by depositing and then patterning a conductive layer on the layer 1102. A plurality of openings 1110 are formed with in the IMD layer 1104 between neighboring conductive features 1106. A capping layer 1108 may be formed on exposed surfaces of the plurality of conductive features 1106 to prevent diffusion of the conductive material into adjacent regions. The capping layer 1108 may be formed on a top surface 1106t and sidewalls 1106s of each conductive feature 1106. Each opening 1110 is defined between the capping layer 1108 on the sidewalls 1106s of neighboring conductive features 1106, and the top surface 1102t of the layer 1102.

The material of the conductive features 1106 and the capping layer 1108 are similar to the material of the conductive features 906 and the capping layer 908 respectively and may be formed by a similar process as described in operation 202 of the method 200.

In operation 1004 of the method 1000, a planar layer 1112 is disposed on the IMD layer 1104 to close the plurality of openings 1110 and form air gaps 1114 within the IMD layer 1104, as shown in FIG. 11B. In some embodiments, the planar layer 1112 may be substantially planar shaped to provide structural support for the air gaps 1114.

In some embodiments, the planar layer 1112 may include one or more 2-dimensional (2D) material. The term "2D material" used in this disclosure refers to single layer material or monolayer-type material that is atomically thin crystalline solid having intralayer covalent bonding and interlayer van der Waals bonding. The planar layer 1112 may be formed from organic 2D material, such as graphene, hexagonal boron nitride (h-BN), or inorganic 2D material, such as transition metal dichalcogenides ($MX_2$), where M is a transition metal element and X is a chalcogenide element. In some embodiments, the transition metal dichalcogenides ($MX_2$), may include, but are not limited to Hf, Tee, $WS_2$, $MoS_2$, $WSe_2$, $MoSe_2$, or any combination thereof. The planar layer 1112 may be first formed on a growth wafer and then transferred over to the IMD layer 1104, for example on to a top surface 1108t of the capping layer 1108.

The planar layer 1112 may be first grown on a growth wafer, such as a metal wafer or a sapphire wafer. In some embodiments, the growth wafer may be a copper wafer. The planar layer 1112 may be formed on the growth wafer by a suitable process, such as a CVD process. In some embodiments, a carbon source, such as methane gas, may be supplied to the surface of the growth wafer in a CVD process to form a graphene film thereon. In other embodiments, a metal dichalcogenide film may be formed on the growth wafer a CVD process or an ALD process.

After formation of the 2D film (the planar layer 1112) on the growth wafer to a target thickness, a transfer film 1113 is formed over the 2D film (the planar layer 1112). The transfer film 1113 allows subsequent handling of the 2D film after formation. For example, the transfer film 1113 allows the planar layer 1112 to be peeled off from the growth substrate and then attached on to a target surface, such as the top surface 1108t. The transfer film 1113 may be a polymer film having a thickness ranging from about 100 nm to about 5 μm. In some embodiments, the transfer film includes poly(methyl methacrylate) (PMMA) or polycarbonate. In some embodiments, the transfer film 1113 may be formed by spin coating. After forming the transfer film 1113, the growth wafer, the 2D film (the planar layer 1112) and the transfer film 1113 may be heated on a hot plate for about 30 seconds to about 20 minutes at a temperature of from about 70° C. to about 200° C. The 2D film (the planar layer 1112) and the transfer film 1113 can then be separated from the growth wafer by peeling or submerging in an aqueous base solution. Upon removal of the growth wafer, the planar layer 1112 has a first surface 1112b exposed and a second surface 1112t attached to the transfer film 1113.

The 2D film (the planar layer 1112) is then attached to a top surface of the target wafer, i.e. the top surface 1108t, together with the transfer film 1113. As shown in FIG. 11B, the first surface 1112b of the planar layer 1112 in direct contact with the top surface 1108t. Then second surface 1112t is covered by the transfer film 1113. In some embodiments, upon the planar layer 1112 is attached to the IMD layer 1104, the transfer film 1113 may be removed from the second surface 1112t after a curing period. The curing period may be in a range between 30 minutes to 24 hours. The transfer film 1113 may be removed by suitable solvent, such as acetone, exposing the second surface 1112t of the planar layer 1112.

Alternatively, instead of forming the transfer film 1113 after formation of the 2D film (the planar layer 1112) on the growth wafer to a target thickness and then peeling the 2D film off the growth wafer, a bonding film may be formed over the first surface 1112b of the planar layer 1112 while the 2D film remains on the growth wafer. For example, a bonding film comprising bisbenzocyclobutene (BCB) may be formed over the first surface 1112b. The planar layer 1112 may be attached to the IMD layer 1104 by contacting the top surface 1108t with the bonding film, and applying heat and force, for example using a semiconductor wafer bonding tool, to bond the planar layer 1112 to the IMD layer 1104. The bonding film may remain between the planar layer 1112 and the IMD layer 1104. The growth wafer may then be removed using a suitable method, such as using an aqueous base solution.

Figure 11D:
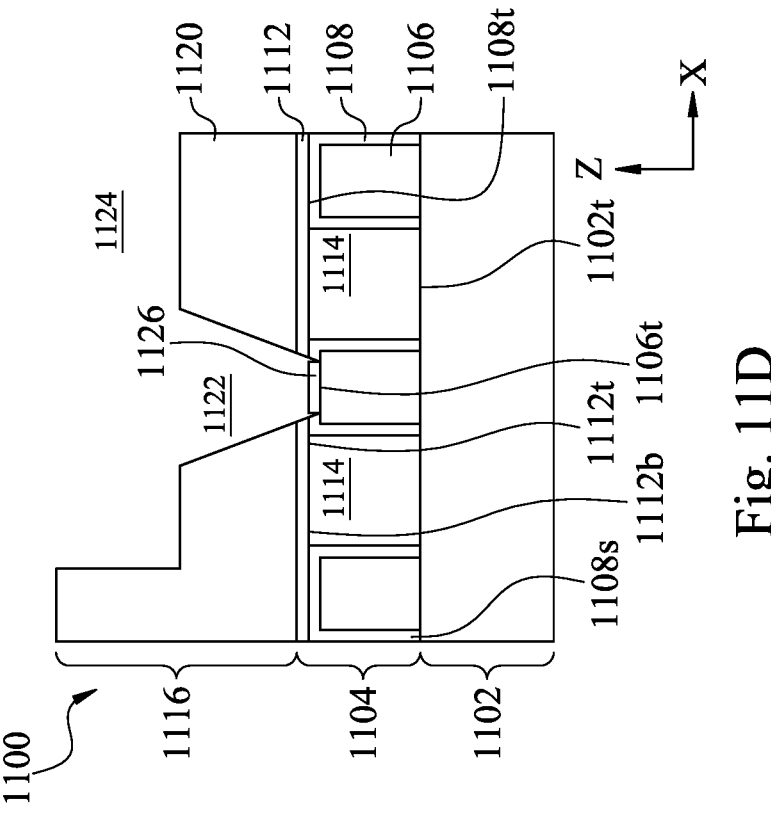

As shown in FIG. 11B, the air gaps 1114 occupy the openings 1110 between the neighboring conductive features 1106. Each air gap 1114 may be defined by the capping layers 1108 formed on the sidewalls 1106s of the neighboring conductive features 1106, the first surface 1112b of the planar layer 1112 (or a bonding layer formed on the first surface 1112b if present), and the top surface 1102t of the layer 1102 (or the etch stop layer formed on the layer 1102 if present). FIG. 11I is a schematic sectional view of the interconnect structure 1100 along the line 11I-11I on FIG. 11B. As shown in FIG. 11I, the air gaps 1114 may have a length 1114x along the x-direction, or parallel to the conductive lines 1106, and a width 1114y along the y-direction, or perpendicular to the conductive lines 1106. The conductive lines 1106 may have a width 1106 along the y-direction 1106y. In some embodiments, a ratio of the width 1114y over the width 1106y may be in a range between 0.5 and 3. A ratio lower than 0.5 may not satisfy design rules. A ratio greater than 3 may cause the air gap 1114 to claps. In some embodiments, a ratio of the length 1114x over the width 1106y may be in a range between 0.5 and 100. A ratio lower than 0.5 may not satisfy design rules. A ratio greater than 100 may cause the air gap 1114 to claps. In some embodiments, dummy conductive features may be formed to limit the dimension of the air gaps 1114.

The planar layer 1112 is used to provide mechanical support to maintain the shape of the air gaps 1114 and the structural integrity of the surrounding layers. In some embodiments, the planar layer 1112 have a thickness in a range between 3.5 Angstroms to about 30 Angstroms. A thickness less than 3.5 Angstroms may not be strong enough to provide structure support to maintain the air gaps 1114. A thickness greater than 30 Angstroms may increase device dimension without additional benefit. In other embodiments, the thickness of the planar layer 1112 may be determined by the thickness of a dielectric layer subsequently deposited over the planar layer 1112.

After transfer of the planar layer 1112 and removal of the transfer film 1113 (or the growth wafer), the fabrication of the IMD layer 1104 is completed. As shown in FIG. 11B, the IMD layer 1104 includes the plurality of conductive features 1106, and the capping layer 1108 and the planar layer 1112. An IMD layer 516 is fabricated on the IMD layer 1104 using the subsequent operations of the method 1000.

Figure 11C:
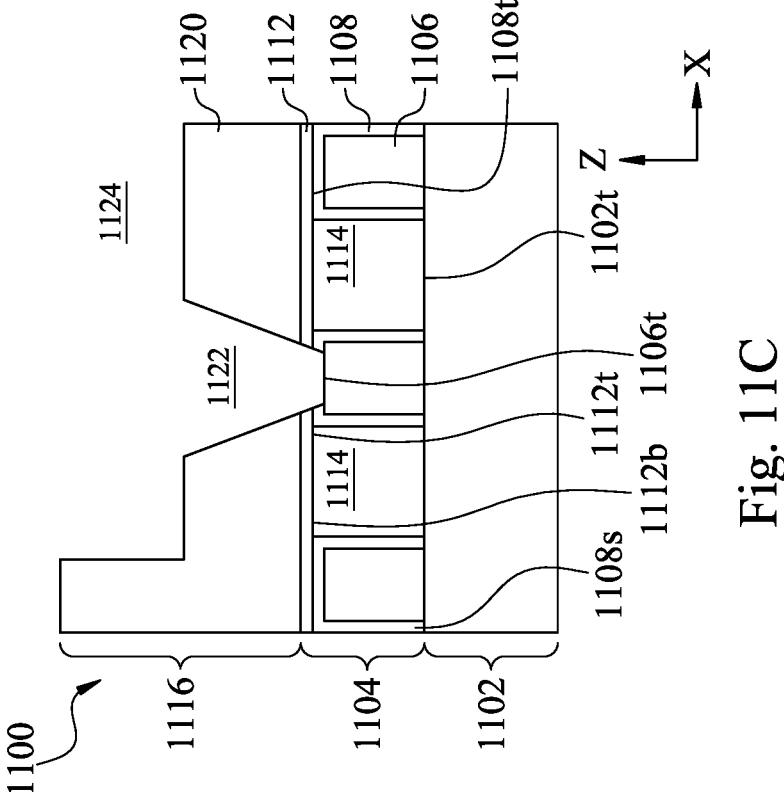
Figure 11F:
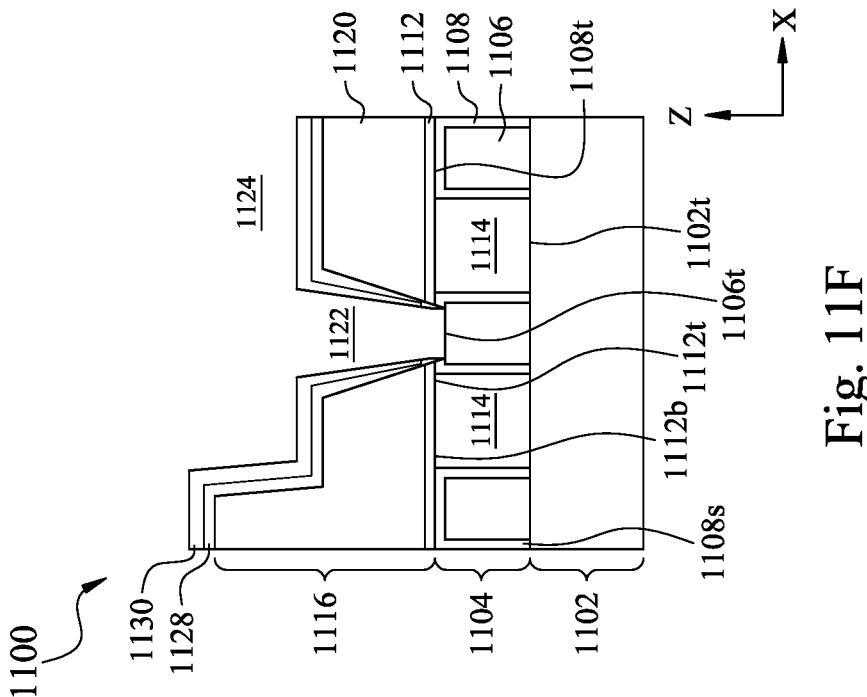

In operation 1006 of the method 1000, a dielectric layer 1120 is deposited on the planar layer 1112, as shown in FIG. 11C. The planar layer 1112 may also function as an etch stop during patterning of the dielectric layer 1120. The dielectric layer 1120 may be a low-k dielectric material. For example, the dielectric layer 1120 may be an oxide formed by TEOS, un-doped silicate glass, or doped silicon oxide such as BPSG, fused FSG, PSG, BSG, OSG, SiOC, and/or any suitable low-k dielectric material. The dielectric layer 920 may be deposited by spin-on, CVD, FCVD, PECVD, PVD, or any suitable deposition technique. The thickness of the planar layer 1112 may be dependent on the thickness of the dielectric layer 1120. The thickness of the dielectric layer 1120 may be selected according to density of the conductive features formed therein. In some embodiments, the dielectric layer 1120 may have a thickness in a range between 175 Angstroms to about 4500 Angstroms. In some embodiments, a ratio of the thickness of the planar layer 1112 over the thickness of the dielectric layer 1120 is in a range between 1:50 and 1:150.

In operation 1008 of the method 1000, a patterning process is performed to form openings 1124, 1122 in and through the dielectric layer 1120, as shown in FIG. 11C. The openings 1122, 1124 are intended to be filled with a conductive material and form conductive features therein. The openings 1122, 1124 may be formed by any suitable process. In some embodiments, the openings 1122, 1124 may be a result of a dual-damascene process. The opening 1124 may be a trench opening formed in an upper portion of the dielectric layer 1120. The opening 1122 is a via opening connected to the opening 1124 and through the dielectric layer 1120 and the planar layer 1112, which may function as an etch stop during formation of the opening 1124. The openings 1124, 1122 may be formed by any suitable processes, such as one or more etch processes. The etch processes also remove a portion of the planar layer 1112 and the cap layer 1108, so the opening 1122 exposes the top surface 1106*t* of the corresponding conductive feature 1106. In some embodiments, the opening 1122 may also expose a top surface 1108*t* of the capping layer 1108 formed on sidewalls 1106*s* of the conductive feature 1106.

In operation 1010 of the method 1000, a blocking layer 1126 is selectively formed on the exposed top surface 1106*t* of the conductive feature 1106, as shown in FIG. 11D. In some embodiments, the blocking layer 1126 may include the same material as the blocking layer 926 and may be formed by a method similar to the operation 810 of the method 800. Similar to formation of the blocking layer 926, the blocking layer 1126 may also leave portion sidewalls 1108*s* of the capping layer 1108 exposed.

In some embodiments, the blocking layer 1126 may have a thickness in a range between about 2 angstrom and about 100 Angstroms. A thickness less than 2 Angstroms may not provide enough coverage and protection to the conductive feature 1106 underneath. A thickness greater than 100 Angstroms may block portions of the dielectric layer 1120 or the planar layer 1112 resulting in incomplete coverage of the subsequently formed barrier layer and liner layer.

Figure 11E:
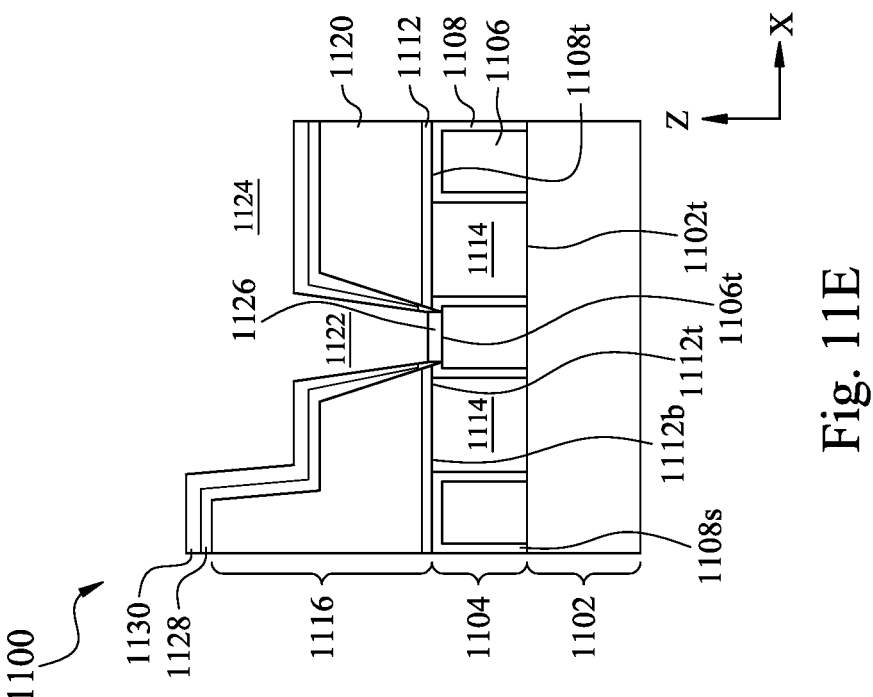

In operation 1012 of the method 1000, a barrier layer 1128 and a liner layer 1130 are deposited on exposed dielectric surfaces, such as the dielectric layer 1120, and the planar layer 1112, as shown in FIG. 11E. With the blocking layer 1126 formed on the metallic surfaces of the conductive features 1106, the barrier layer 1128, and the liner layer 1130 are selectively formed on the dielectric layer 1120 and the planar layer 1112 and not formed on the blocking layer 1126.

In some implementations, the barrier layer 1128 may include the same material as the barrier layer 928 and may be formed by a method similar to the operation 812 of the method 800. The barrier layer 1128 may include the same material as the barrier layer 928 and may be formed by a method similar to the operation 812 of the method 800. The barrier layer 1128 may be formed to a thickness between about 0.5 nm and about 5 nm. In some embodiments, the liner layer 1130 may be deposited using ALD, or CVD. The liner layer 1130 may be formed to a thickness between about 0.5 nm and 3 nm.

In operation 1014 of the method 1000, the blocking layer 1126 is removed to expose the top surface 1106*t* of the conductive feature 1106, as shown in FIG. 11F. The blocking layer 1126 may be removed using thermal degradation or plasma bombardment, or other suitable process.

Figure 11H:
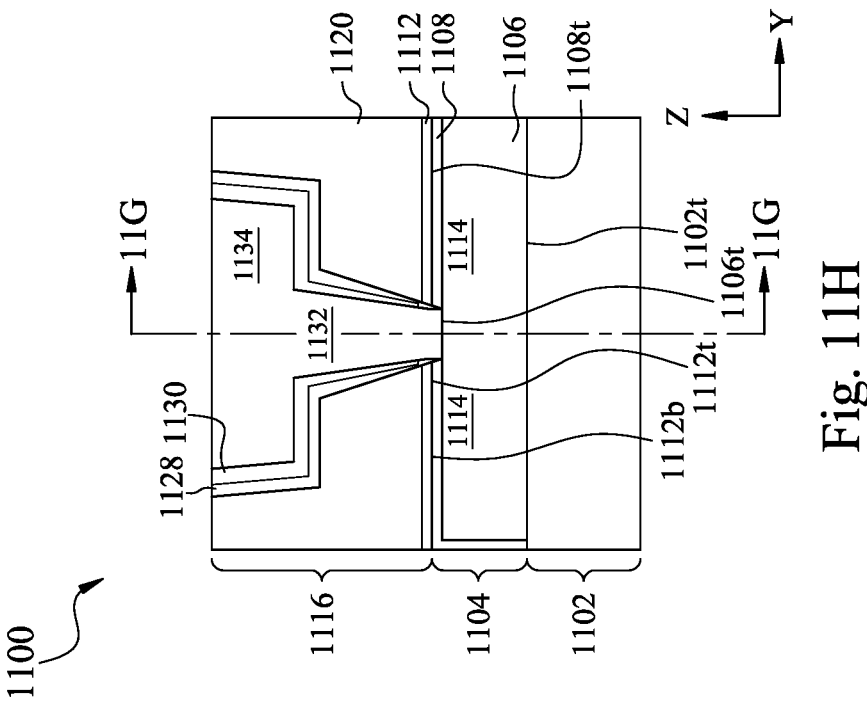
Figure 11G:
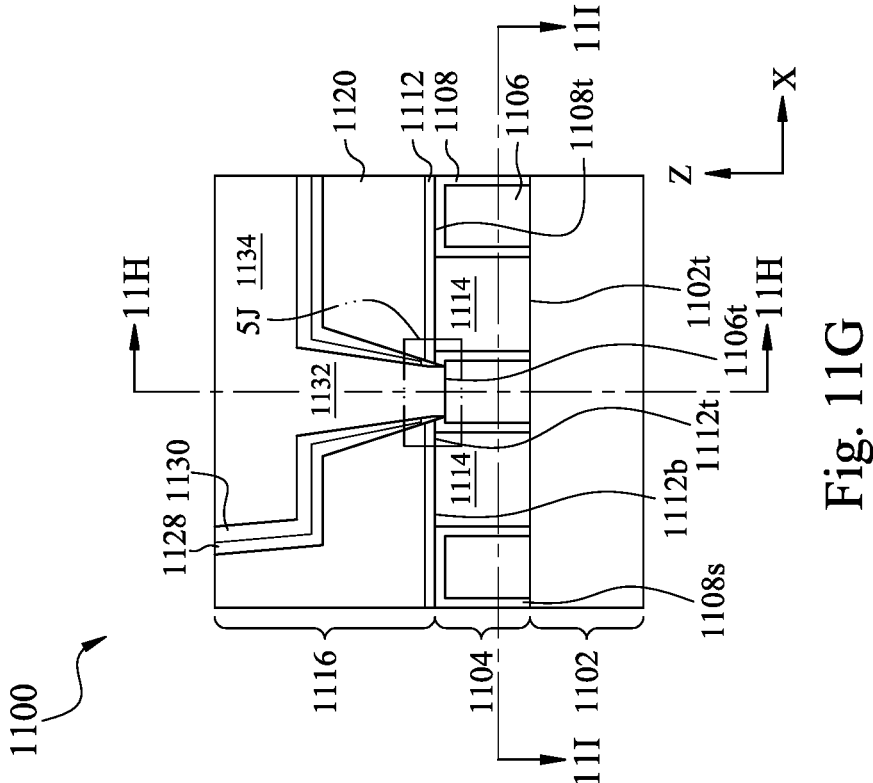

In operation 1016 of the method 1000, conductive lines 1134 and conductive vias 1132 are formed in the openings 1124, 1122 respectively, as shown in FIGS. 11G and 11H. FIG. 11H is a cross sectional view of the interconnect structure 1100 along the 11H-11H line in FIG. 11G. FIG. 11G is a cross sectional view of the interconnect structure 1100 along the 11G-11G line in FIG. 11H.

The conductive lines 1134 and conductive vias 1132 may be formed by filling a conductive material in the openings 1122, 1124. The conductive lines 1134 and conductive vias 1132 may include the same material as the conductive lines 934 and the conductive vias 932 and may be formed by a method similar to the operation 816 of the method 800.

Figure 11J:
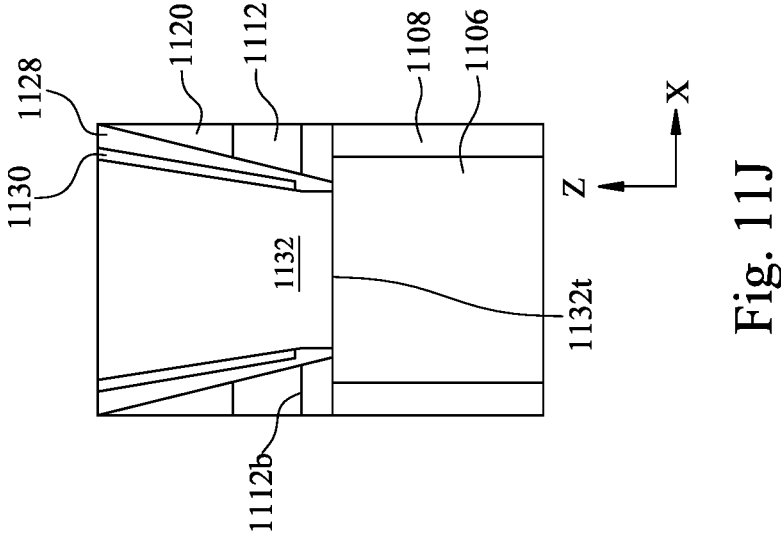
Figure 11I:
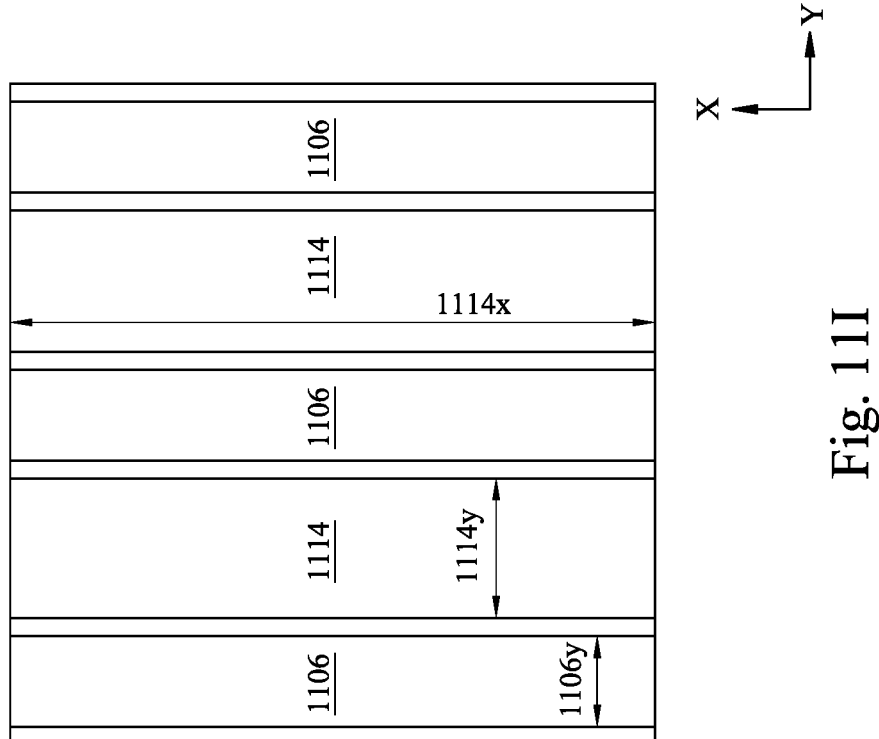

Fabrication of the IMD layer 1116 is complete after operation 416. As shown in FIGS. 11G and 11H, the IMD layer 1116 includes conductive lines 1134 and conductive vias 1132 formed in the dielectric layer 1120 and the planar layer 1112. FIG. 11J is a schematic enlarged view of the interconnect structure 1100 in the area 11J of FIG. 11G. As shown in FIG. 11J, the barrier layer 1128 may be in contact with a portion of the capping layer 1108. The conductive via 1132 is in direct contact with the conductive features 1106 in the IMD layer 1104. Because there is no barrier layer or liner layer between the conductive via 1132 and the conductive feature 1106, the resistance between the conductive via 1132 and the conductive feature 1106 is reduced. The air gaps 1114 formed between the conductive features 1106 lower the dielectric constant K of the dielectric material between the neighboring conductive features 1106, thus, reducing capacitance between the conductive features 1106 and reducing RC delay.

FIG. 12 is a flow chart of a method 1200 for manufacturing an interconnect structure according to embodiments of the present disclosure. FIGS. 13A-13N are cross-sectional side views of various stages of manufacturing an interconnect structure 1300 according to the method 1200. The method 1200 and the interconnect structure 1300 may be used on one or more layers of the interconnection structure 250.

In operation 1202 of the method 1200, a plurality of conductive features 1306 are formed in an IMD layer 1304, as shown in FIG. 13A. In FIG. 13A, the IMD layer 1304 is formed over a layer 1302. The layer 1302 may be an ILD layer, such as the ILD layer 128 in FIG. 1, or an intermetal dielectric (IMD) layer. In some embodiments, the layer 1302 is similar to the layer 902 described in FIG. 3A above.

The plurality of conductive features 1306 are formed on a top surface 1302t of the layer 1302. In some embodiments, an optional etch stop layer, not shown, may be formed between the conductive features 1306 and the layer 1302. The plurality of conductive features 1306 may be formed by depositing and then patterning a conductive layer on the layer 1302. A plurality of openings 1310 are formed with in the IMD layer 1304 between neighboring conductive features 1306. A capping layer 1308 may be formed on exposed surfaces of the plurality of conductive features 1306 to prevent diffusion of the conductive material into adjacent regions. The capping layer 1308 may be formed on a top surface 1306t and sidewalls 1306s of each conductive feature 1306. Each opening 1310 is defined between the capping layer 1308 on the sidewalls 1306s of neighboring conductive features 1306, and the top surface 1302t of the layer 1302. In some embodiments, the conductive feature 1306 may a thickness H1 in a range from about 50 Angstroms to about 500 Angstroms.

The material of the conductive features 1306 and the capping layer 1308 are similar to the material of the conductive features 906 and the capping layer 908 respectively and may be formed by a similar process as described in operation 802 of the method 800. The capping layer 1308 may have a thickness in a range between about 2 Angstroms to about 50 Angstroms.

Figure 13B:
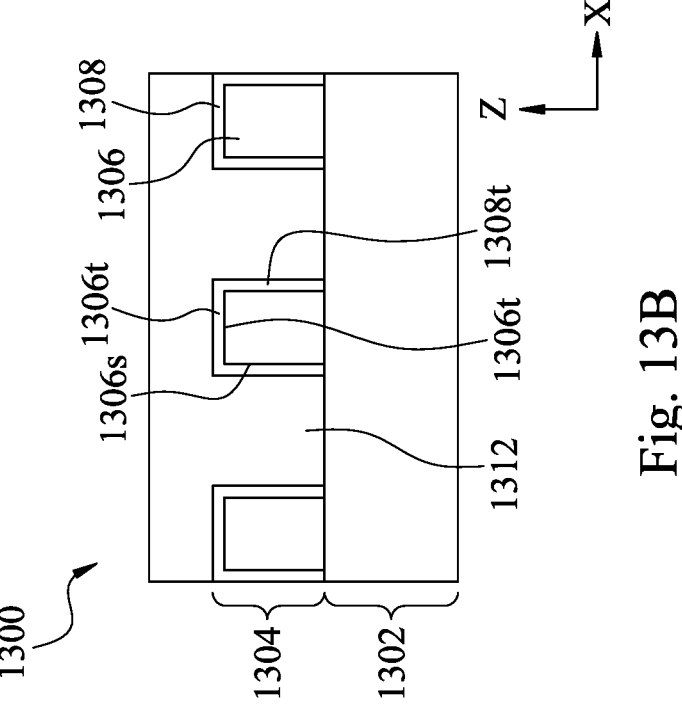
FIGS. 13A-13N are cross-sectional side views of various stages of manufacturing an interconnect structure according to embodiments of the present disclosure.
Figure 13A:
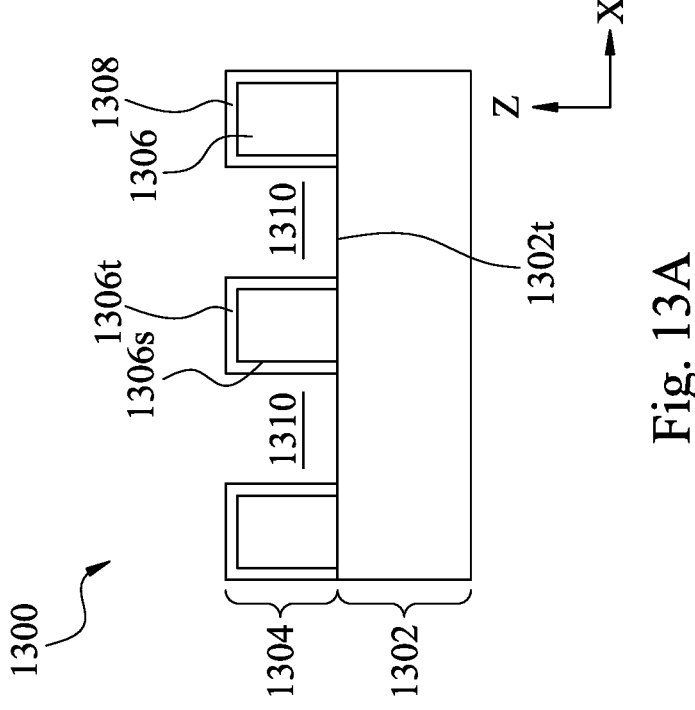
Figure 13D:
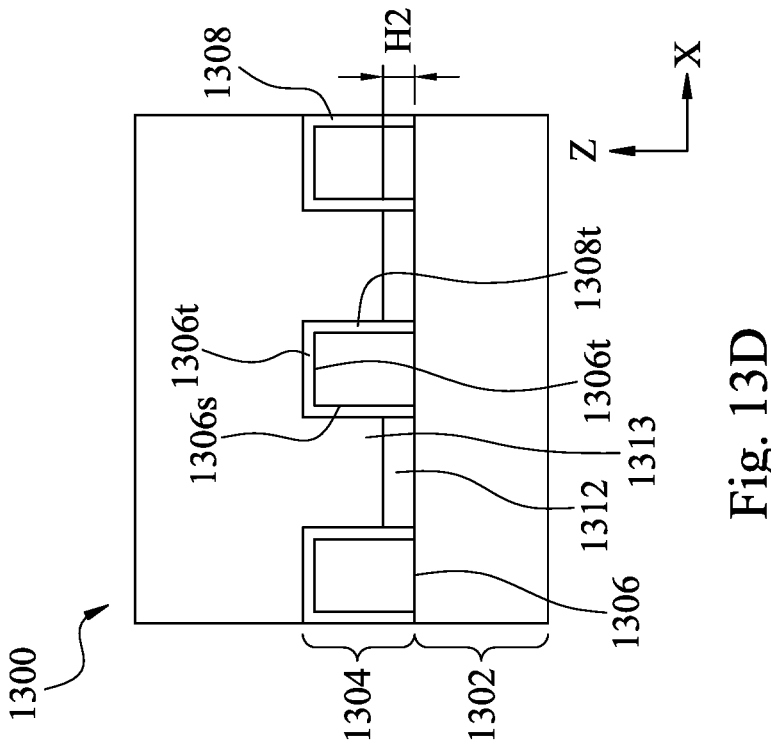
Figure 13C:
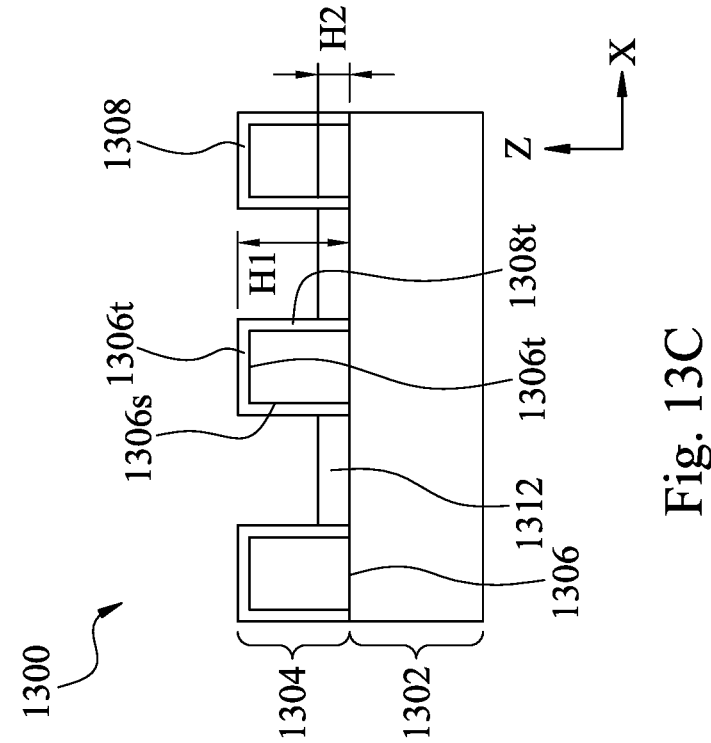
Figure 13F:
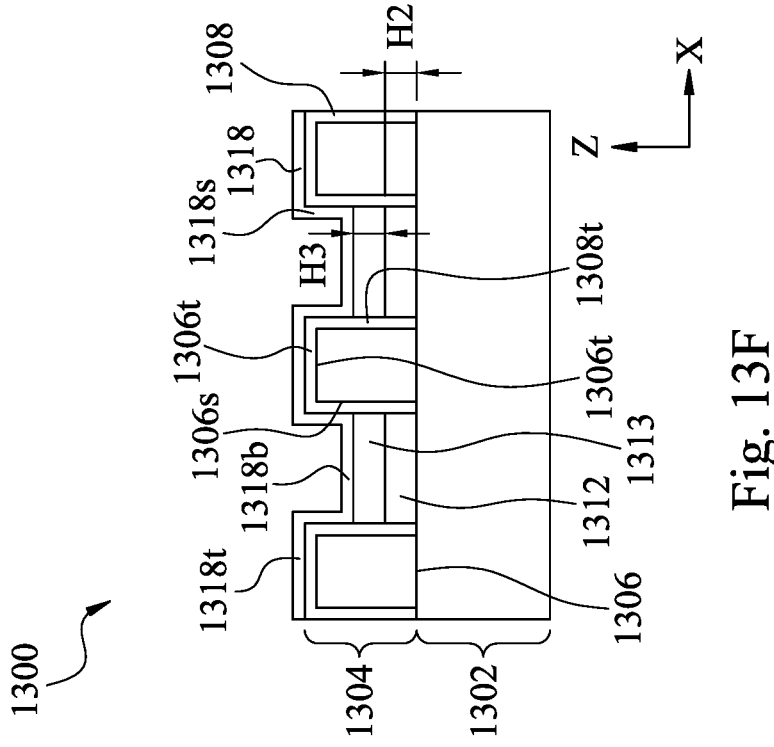

In operation 1204 of the method 1200, the plurality of openings 1310 are filled with a dielectric layer 1312, as shown in FIG. 13B, and the dielectric layer 1312 is then etched back to remain on in a lower portion of the openings 1310, as shown in FIG. 13C. In some embodiments, the dielectric layer 1312 may be deposited by a suitable deposition process to first fill the openings 1310. The dielectric layer 1312 may include a low-k dielectric material, for example, oxide formed by TEOS, un-doped silicate glass, or doped silicon oxide such as BPSG, FSG, PSG, BSG, and/or other suitable dielectric materials. The dielectric layer 1312 may be deposited by CVD, ALD, spin coating, or other suitable process.

The dielectric layer 1312 is then etched back to a thickness H2 at the lower portion of the openings 1310. In some embodiments, the thickness H2 may be between about 25% to about 50% of the thickness H1 of the conductive features 1306. The remained portion of the dielectric layer 1312 provide structural support to the openings 1310 and also provide isolation around the conductive features 1306, preventing current leakage.

Figure 13E:
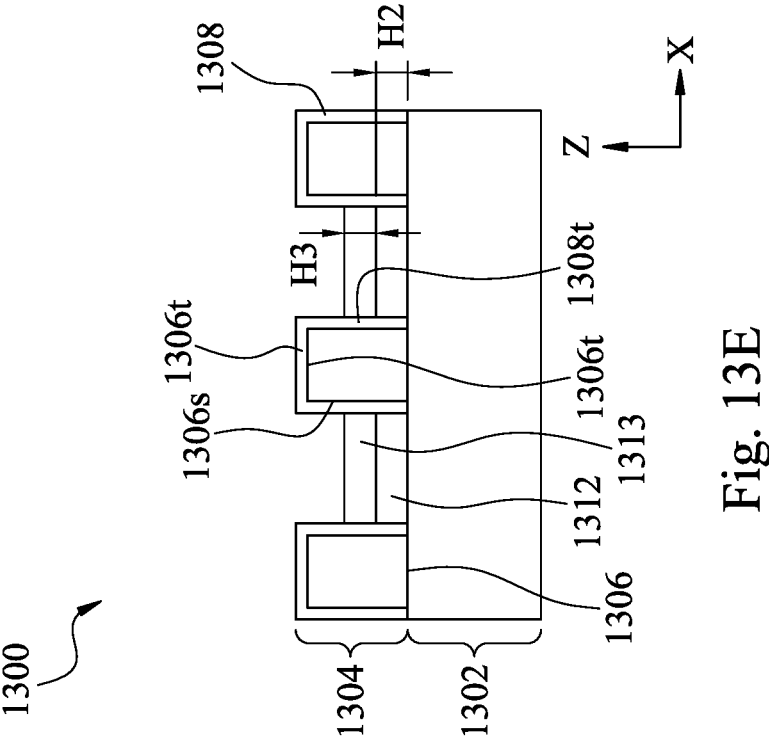
Figure 13H:
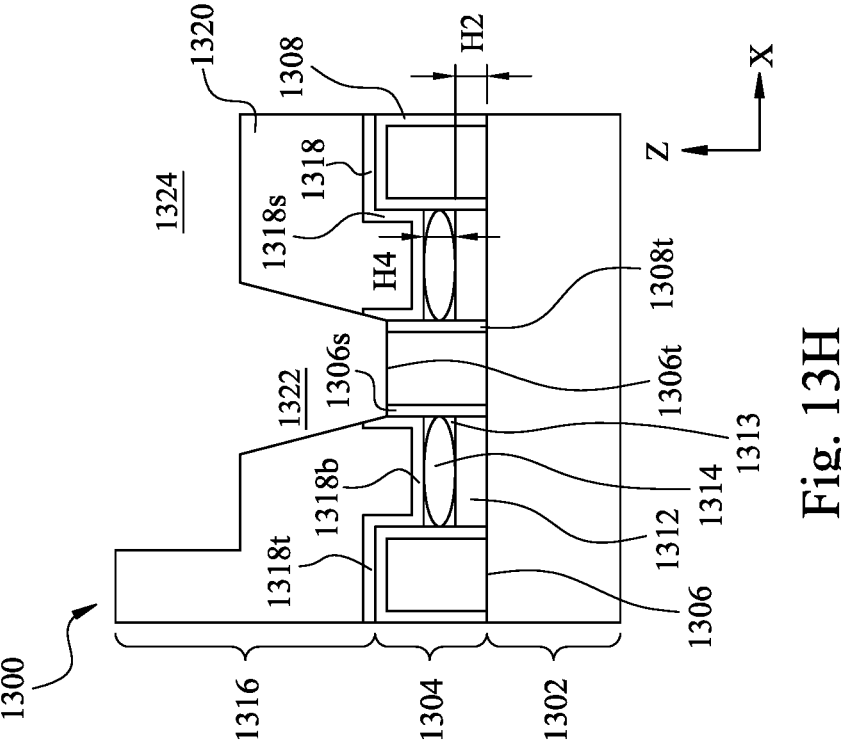

In operation 1206 of the method 1200, the plurality of openings 1310 are filled with a sacrificial dielectric 1313, as shown in FIG. 13D, and the sacrificial layer 1313 is then etched back to remain on in a middle portion of the openings 1310, as shown in FIG. 13E. The sacrificial layer 1313 may be formed above the dielectric layer 1312 to fill the openings 1310. The sacrificial layer 1313 may be a polymer or a small molecule material. In some embodiments, the sacrificial layer 1313 may include a polymer, such as an organic layer having C, O, N, and/or H. In some embodiments, the sacrificial layer 1313 includes polyurea. The polyurea may be synthesized by reacting diisocyanate and diamine, which is shown below.

$$O{=}C{=}N \diagdown_{R} \diagup N{=}C{=}O \quad + \quad H_2N \diagdown_{R'} \diagup NH_2 \quad \longrightarrow$$

$$\left( \underset{NH}{\overset{R}{\diagup}} \underset{}{\overset{O}{\diagdown}} \underset{NH}{\overset{}{\diagup}} \underset{}{\overset{R'}{\diagdown}} \underset{NH}{\overset{O}{\diagup}} \underset{}{\overset{}{\diagdown}} NH \right)_n$$

The sacrificial layer 1313 may be formed by any suitable process, such as CVD, ALD, plasma enhanced CVD (PECVD), plasma enhanced ALD (PEALD), molecular layer deposition (MLD), or spin coating.

As shown in FIG. 13E, the sacrificial layer 1313 is recessed to a level below the level of a top surface 1306t of the conductive features 1306. The recess of the sacrificial layer 1313 may be performed by any suitable process, such as thermal baking, UV curing, an etch-back process (e.g., a plasma etch process), or any combination thereof. In some embodiments, the sacrificial layer 1313 is recessed by a UV curing process that expose the sacrificial layer 1313 to UV energy having an energy density ranging from about 10 mJ/cm2 to about 100 J/cm2. The UV energy causes a top portion of the sacrificial layer 1313 to be thermally decomposed to gaseous byproducts, which vaporize and leave a cavity in the top portion of the sacrificial layer 1313. In some embodiments, the recess of the sacrificial layer 1313 may expose at least a portion of the barrier layer capping layer 1308 in the openings 1310. The remaining sacrificial layer 1313 may have a height H3 ranging from about 10 Angstroms to about 100 Angstroms. In some embodiments, a ration of the height H3 of the remaining sacrificial layer 1313 and the thickness H1 of the conductive features 1306 may be in a range between about 10% and about 75% depending on the dimension of the air gaps to be formed.

In operation 1206 of the method 1200, a dielectric layer 1318 is formed on the exposed surfaces of the interconnect structure 1300, as shown in FIG. 13F. In some embodiments, the dielectric layer 1318 is formed on the sacrificial layer 1313, and the exposed portions of the capping layer 1308. In some embodiments, the dielectric layer 1318 functions to provide support to air gaps subsequently formed in the sacrificial dielectric layer 1313. The dielectric layer 1318 may include Si, O, N, or any combinations thereof. In some embodiments, the dielectric layer 1318 includes SiO, SiCO, SiNO, SiCN, or SiCON. The dielectric layer 1318 may be porous in order to allow UV energy, thermal energy, or plasma, etc., to reach the sacrificial layer 1313 disposed there below. The dielectric layer 1318 may be formed by any suitable process, such as PVD, CVD, ALD, PECVD, or PEALD. In some embodiments, the dielectric layer 1318 is a conformal layer formed by ALD or PEALD. The term "conformal" may be used herein for ease of description upon a layer having substantial same thickness over various regions.

The dielectric layer 1318 may have a thickness ranging from about 2 Angstroms to about 100 Angstroms. A thickness less than 2 Angstroms may not be strong enough to provide structure support to maintain air gaps to be formed. A thickness greater than 100 Angstroms may increase device dimension and hinder removal of the sacrificial layer 1313 without additional benefit.

As shown in FIG. 13F, the dielectric layer 1318 may be a non-planar layer having upper portions 1318t formed over a top surface 1308t of the capping layer 1308, lower portions 1318b formed over the sacrificial layer 1313, and sidewall portions 1318s formed on the capping layer 1308 along sidewalls 1306s of the conductive features 1306. When air gaps are subsequently formed below the lower portion 1318b, the sidewall portions 1318s provide structural reinforcement to the lower portions 1318b.

Figure 13G:
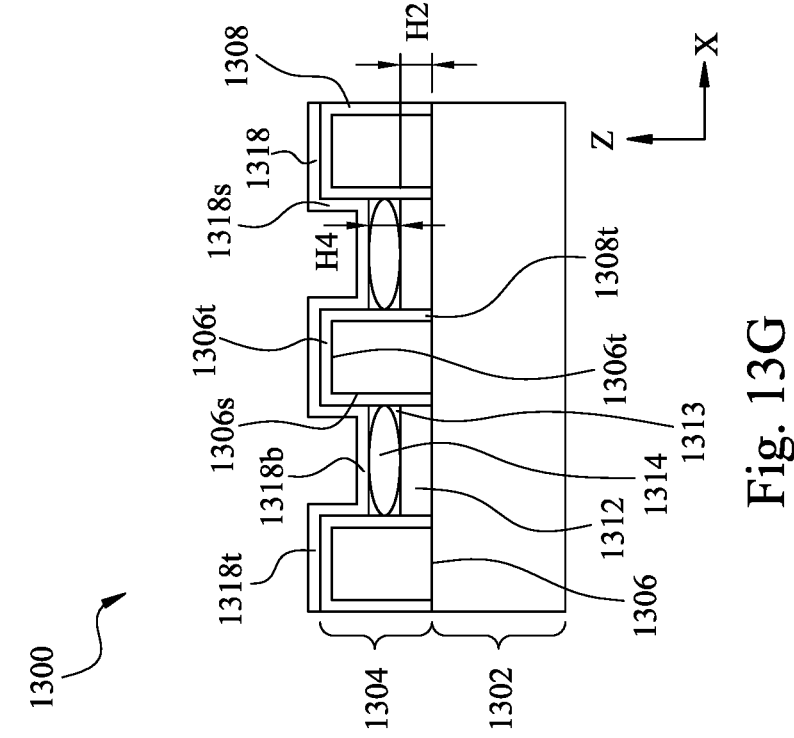
Figure 13J:
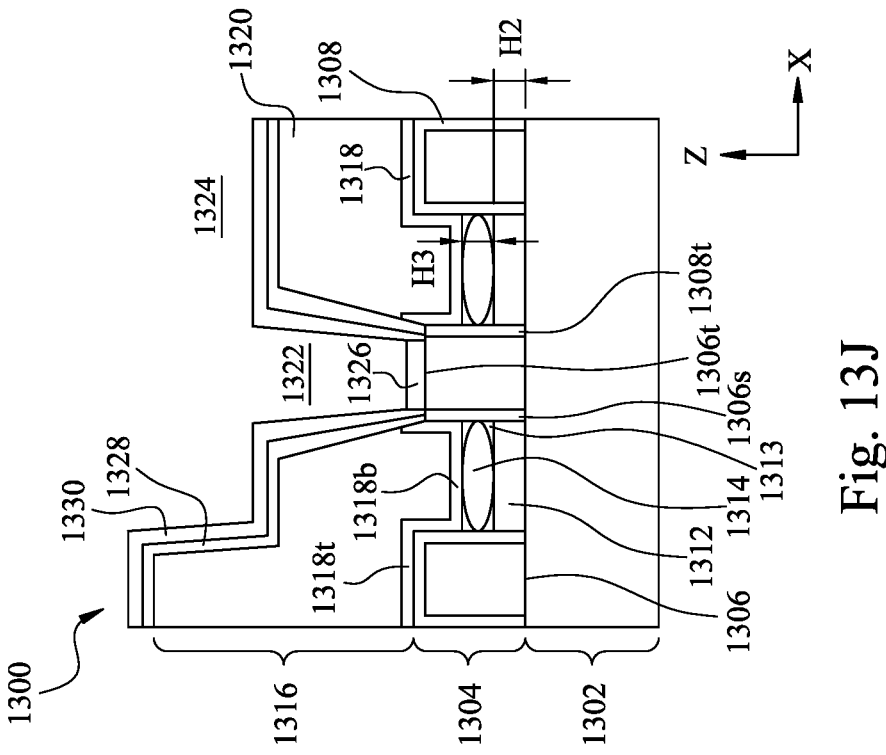

In operation 1210 of the method 1200, the sacrificial layer 1313 between the dielectric layer 1318 and the dielectric layer 1312 is at least partially removed to form air gaps 1314, as shown in FIG. 13G. The removal of the sacrificial layer 1313 may be a result of degradation or decomposition of the sacrificial layer 1313. The decomposition or degradation of the sacrificial layer 1313 may be performed by any suitable process, such as thermal baking and/or UV curing. In some embodiments, an UV curing process is performed to remove the sacrificial layer 1313. The UV energy may pass through the porous dielectric layer 1318 to reach and remove the sacrificial layer 1313. The UV energy may have an energy density ranging from about 10 mJ/cm2 to about 100 J/cm2. The air gaps 1314 may have a height H4, which is equal to or less than the height H3 of the sacrificial layer 1313 shown in FIG. 13E. The height H4 may be in a range from about 10 Angstroms to about 100 Angstroms. The air gap 1314 may reduce capacitive coupling between neighboring the conductive features 1306. If the height H4 is less than about 10 Angstroms, the air gaps 1314 may not provide reduced capacitive coupling between neighboring conductive features 1306. If the height H4 is greater than about 100 Angstroms, the sidewall portions 1318s of the dielectric layer 1318 may not have enough length on the capping layer 1308 to prevent materials subsequently formed on the lower portion 1318b of the dielectric layer 1318 from collapsing into the air gap 1314.

The air gaps 1314 in FIG. 13G are shown in oval shapes. This is because during the removal of the sacrificial layer 1313, central portions of the sacrificial layer 1313 may be removed prior to the corner portions of the sacrificial layer 1313, the partial removal of the sacrificial layer 1313 may end up with oval shaped air gaps 1314. However, the air gaps 1314 may have other shapes depending on the dimension of the remaining sacrificial layer 1313, and/or process parameters used to remove the sacrificial layer 1313. For example, the sacrificial layer 1313 may be completed removed, and the air gaps 1314 may be substantially rectangular.

After formation of the air gaps 1314 the fabrication of the IMD layer 1304 is completed. As shown in FIG. 13G, the IMD layer 1304 includes the plurality of conductive features 1306, the dielectric layer 1312, the capping layer 1308, the dielectric layer 1318, and optionally residual of the sacrificial layer 1313 around the air gaps 1314. An IMD layer 1316 is fabricated on the IMD layer 1304 using the subsequent operations of the method 1200.

In operation 1212 of the method 1200, a dielectric layer 1320 is deposited on the dielectric layer 1318, as shown in FIG. 13H. The dielectric layer 1318 may also function as an etch stop during patterning of the dielectric layer 1320. The dielectric layer 1320 may be a low-k dielectric material. For example, the dielectric layer 1320 may be an oxide formed by TEOS, un-doped silicate glass, or doped silicon oxide such as BPSG, fused FSG, PSG, BSG, OSG, SiOC, and/or any suitable low-k dielectric material. The dielectric layer 920 may be deposited by spin-on, CVD, FCVD, PECVD, PVD, or any suitable deposition technique.

In operation 1214 of the method 1200, a patterning process is performed to form openings 1322, 1324 in and through the dielectric layer 1320, as shown in FIG. 13H. The openings 1322, 1324 are intended to be filled with a conductive material and form conductive features therein. The openings 1322, 1324 may be formed by any suitable process. In some embodiments, the openings 1322, 1324 may be a result of a dual-damascene process. The opening 1324 may be a trench opening formed in an upper portion of the dielectric layer 1320. The opening 1322 is a via opening connected to the opening 1324 and through the dielectric layer 1320 and the dielectric layer 1318, which may function as an etch stop during formation of the opening 1324. The openings 1324, 1322 may be formed by any suitable processes, such as one or more etch processes. The etch processes also remove a portion of the dielectric layer 1318 and the capping layer 1308, so the opening 1322 exposes the top surface 1306t of the corresponding conductive feature 1306. In some embodiments, the opening 1322 may also expose a top surface 1308t of the capping layer 1308 formed on sidewalls 1106s of the conductive feature 1306.

Figure 13I:
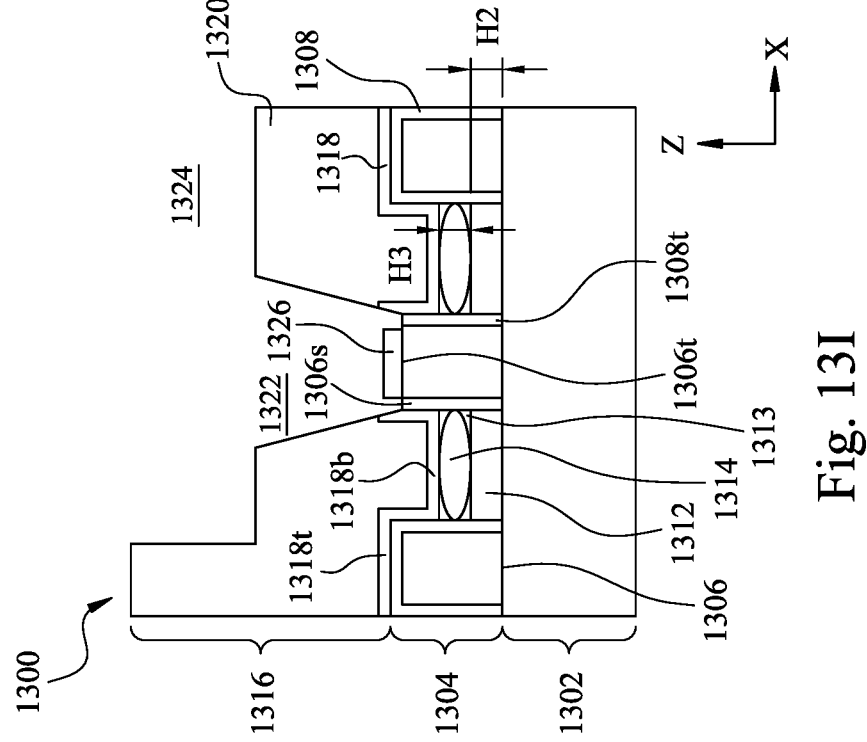
Figure 13L:
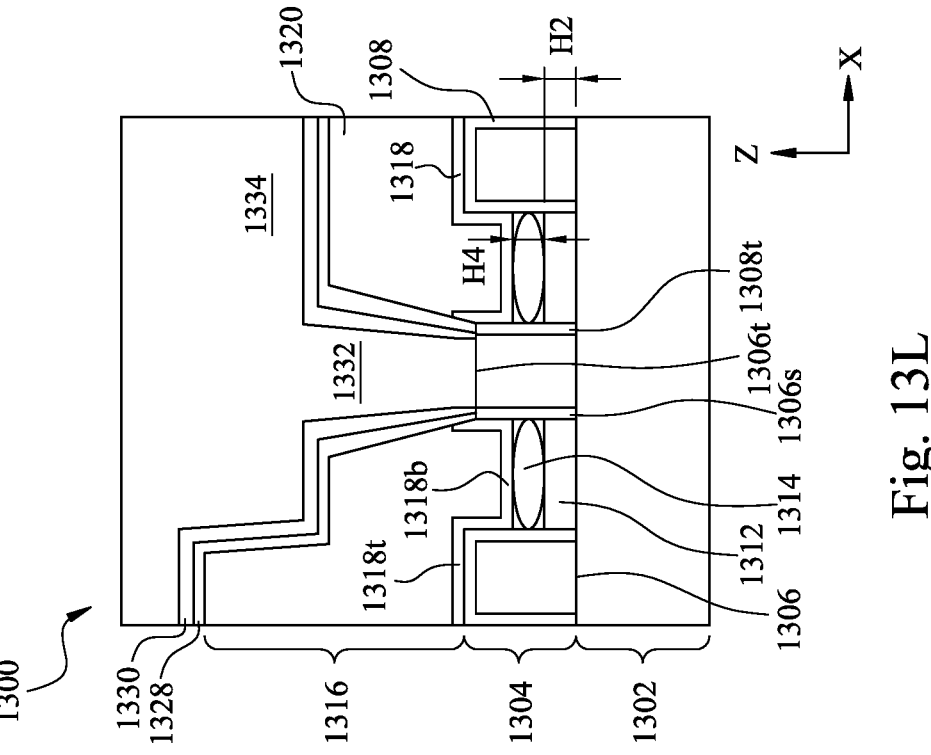

In operation 1216 of the method 1200, a blocking layer 1326 is selectively formed on the exposed top surface 1306t of the conductive feature 1306, as shown in FIG. 13I. In some embodiments, the blocking layer 1326 may include the same material as the blocking layer 926 and may be formed by a method similar to the operation 810 of the method 800.

In some embodiments, the blocking layer 1326 may have a thickness in a range between about 2 Angstrom and about 100 Angstroms. A thickness less than 2 Angstroms may not provide enough coverage and protection to the conductive feature 1306 underneath. A thickness greater than 100 Angstroms may block portions of the dielectric layer 1320 or the dielectric layer 1318 resulting in incomplete coverage of the subsequently formed barrier layer and liner layer.

In operation 1218 of the method 1200, a barrier layer 1328 and a liner layer 1330 are deposited on exposed dielectric surfaces, such as the dielectric layer 1320, and the dielectric layer 1318, as shown in FIG. 13J. With the blocking layer 1326 formed on the metallic surfaces of the conductive features 1306, the barrier layer 1328, and the liner layer 1330 are selectively formed on the dielectric layer 1320 and the dielectric layer 1318 and not formed on the blocking layer 1326.

In some implementations, the barrier layer 1328 may include the same material as the barrier layer 928 and may be formed by a method similar to the operation 812 of the method 800. The barrier layer 1328 may include the same material as the barrier layer 928 and may be formed by a method similar to the operation 812 of the method 800. The barrier layer 1328 may be formed to a thickness between about 0.5 nm and about 5 nm. In some embodiments, the liner layer 930 may be deposited using ALD, or CVD. A liner layer 1330 may be formed to a thickness between about 0.5 nm and 3 nm.

Figure 13K:
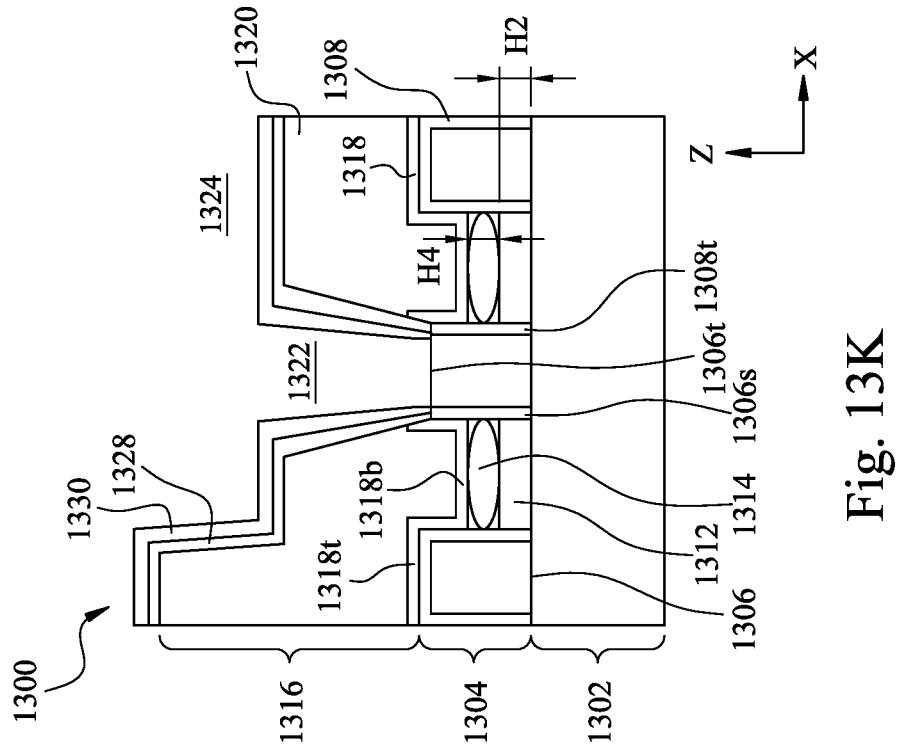
Figure 13N:
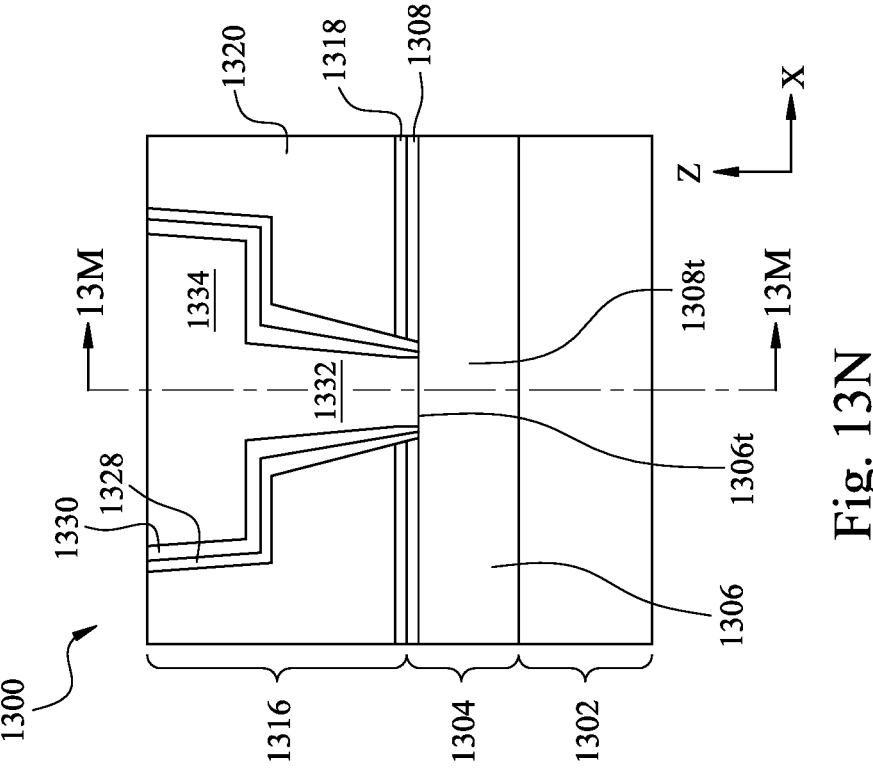

In operation 1220 of the method 1200, the blocking layer 1326 is removed to expose the top surface 1306t of the conductive feature 1306, as shown in FIG. 13K. The blocking layer 1326 may be removed using thermal degradation or plasma bombardment, or other suitable process.

Figure 13M:
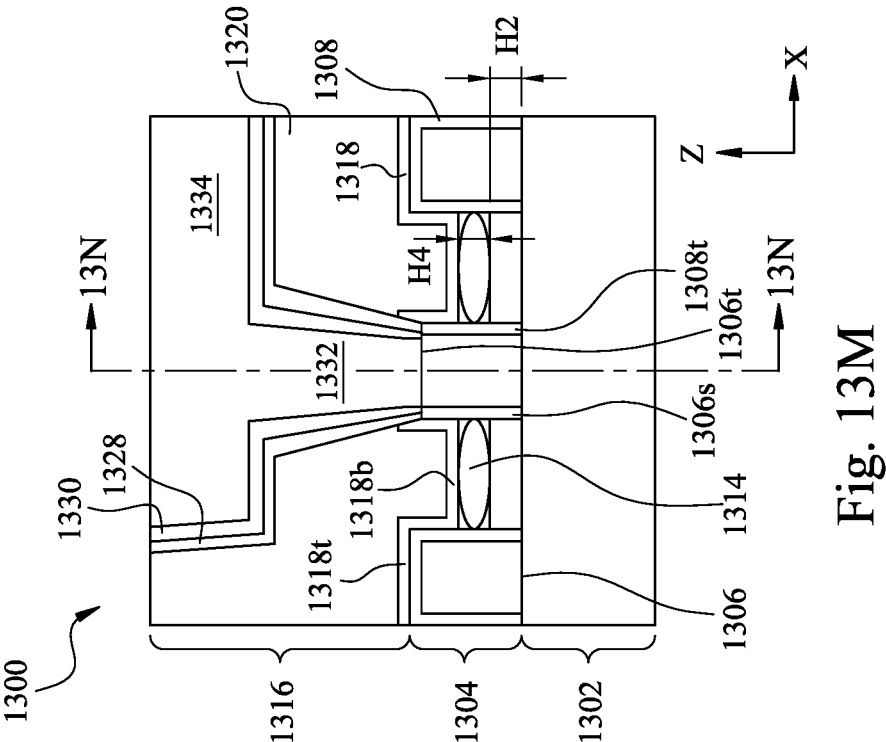

In operation 1222 of the method 1200, conductive lines 1334 and conductive vias 1332 are formed in the openings 1324, 1322 respectively, as shown in FIGS. 13L, 13M, and 13N. FIG. 13N is a cross sectional view of the interconnect structure 1300 along the 13N-13N line in FIG. 13M. FIG. 13M is a cross sectional view of the interconnect structure 1300 along the 13M-3M line in FIG. 13N.

The conductive lines 1334 and conductive vias 1332 may be formed by filling a conductive material in the openings 1322, 1324. The conductive lines 1334 and conductive vias 1332 may include the same material as the conductive lines 1334 and the conductive vias 1332 and may be formed by a method similar to the operation 816 of the method 800.

Fabrication of the IMD layer 1316 is complete after operation 1222. As shown in FIGS. 13M and 13N, the IMD layer 1316 includes conductive lines 1334 and conductive vias 1332 formed in the dielectric layer 1320 and the dielectric layer 1318. The conductive via 1332 is in direct contact with the conductive features 1306 in the IMD layer 1304. Because there is no barrier layer or liner layer between the conductive via 1332 and the conductive feature 1306, the resistance between the conductive via 1332 and the conductive feature 1306 is reduced. The air gaps 1314 formed between the conductive features 1306 lower the dielectric constant K of the dielectric material between the neighboring conductive features 1306, thus, reducing capacitance between the conductive features 1306 and reducing RC delay.

FIGS. 14A-14F are cross-sectional side views of various stages of manufacturing an interconnect structure 1400 according to embodiments of the present disclosure. Similar to the interconnect structure 1300 above, the interconnect structure 1400 may be fabricated using the method 800 except that in operation 802, a plurality of conductive features 1406 are formed on a layer 1402 by patterning a dielectric layer 1405 and filling openings in the dielectric layer 1405. The layer 1402 may be similar to the layer 902 described in the interconnect structure 900.

Figures 14A, 14B, 14C, 14D:
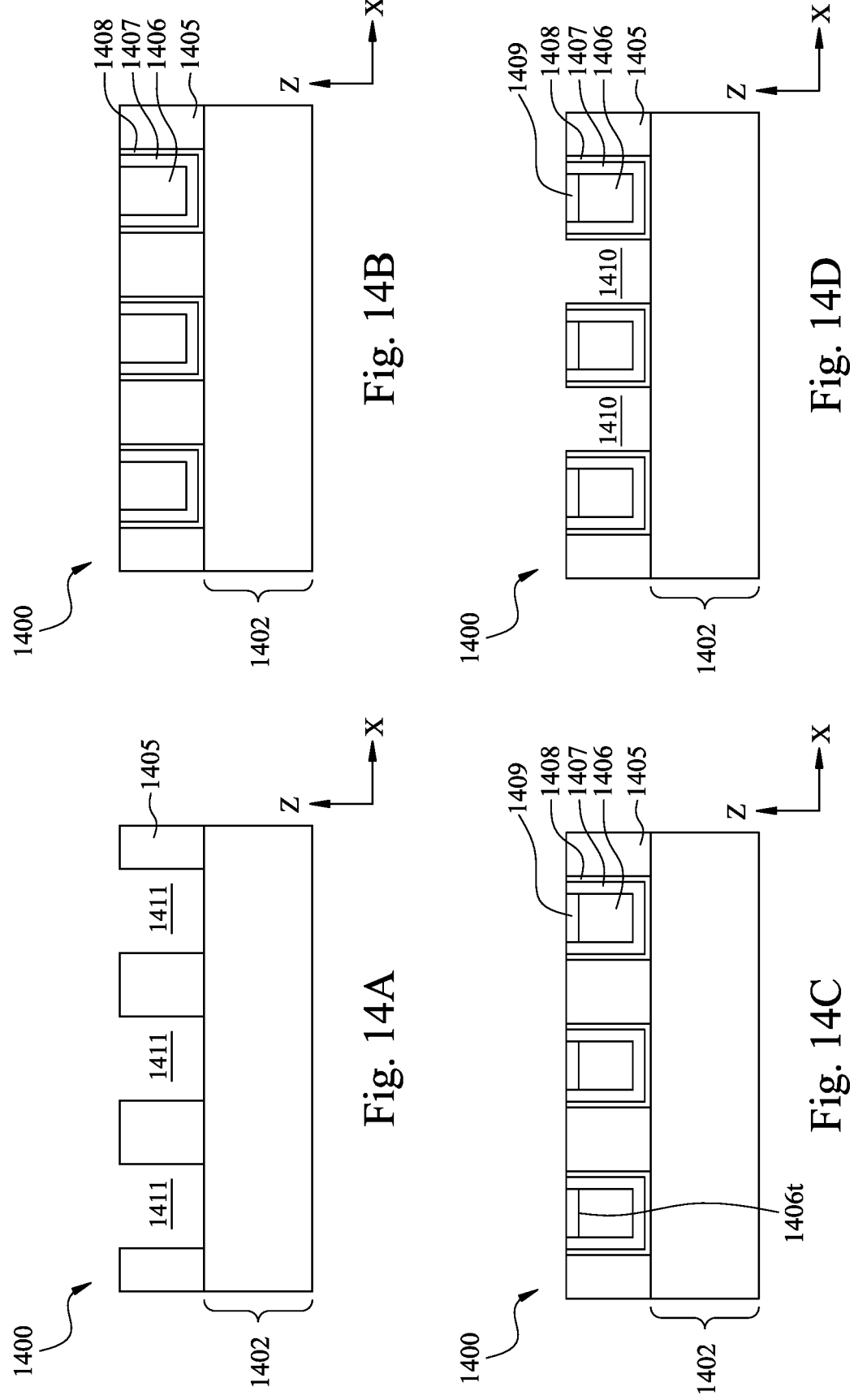
FIGS. 14A-14F are cross-sectional side views of various stages of manufacturing an interconnect structure according to embodiments of the present disclosure.
Figure 14F:
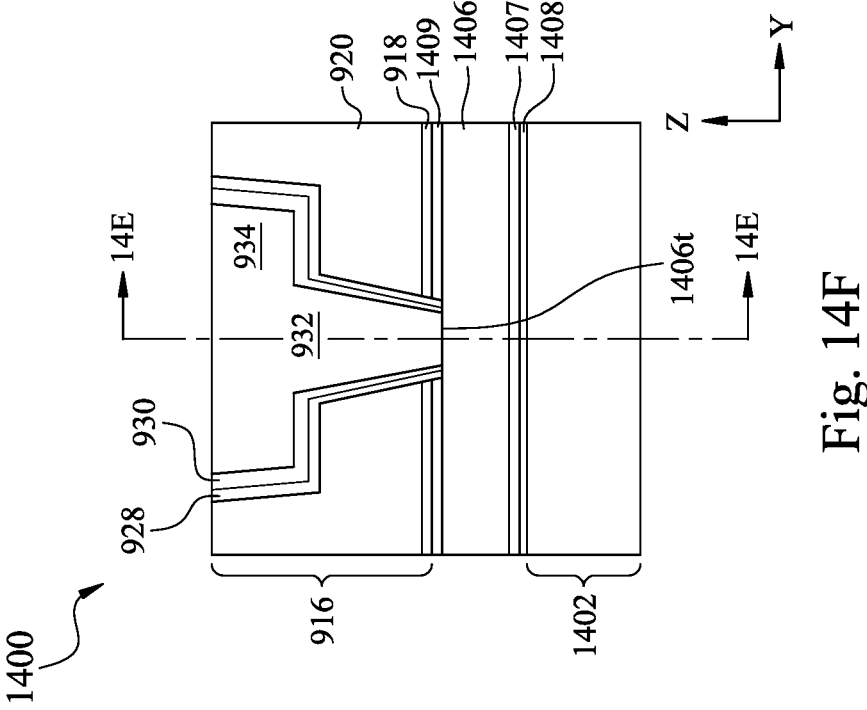

A plurality of openings 1411 may be formed in the dielectric layer 1405 as shown in FIG. 14A. The openings 1411 is then filled by sequentially depositing a barrier layer 1408 and a liner layer 1407 on exposed surfaces in the openings 1411, and filling the openings 1411 with a conductive material to form conductive lines 1406, as shown in FIG. 14B.

The barrier layer 1408 may be similar to the barrier layer 928 described above and may be formed by similar methods. The liner layer 1407 may be similar to the liner layer 930 described above and may be formed by similar methods. The conductive lines 1406 may be similar to the conductive lines 934 described above and formed with similar methods. After filling the openings 1411, a planarization process, such as a CMP process, is performed to expose the dielectric layer 1405.

A capping layer 1409 may be selectively formed over a top surface 1406t of the conductive lines 1406, as shown in FIG. 14C. The capping layer 1409 may include a metal nitride, such as TaN, an oxygen-doped silicon carbide (SiC: O, also known as ODC), or any suitable material. In some embodiments, the capping layer 1409 is selectively formed on the conductive features 1406. The capping layer 1409 may have a thickness ranging from about 2 Angstroms to about 50 Angstroms. In some embodiments, the capping layer 1409 may be formed by a deposition process including low-pressure CVD (LPCVD), CVD, PECVD, PEALD, PVD, sputtering, the like, or a combination thereof.

Portions of the dielectric layer 1405 may then be removed to form openings 1410 adjacent the conductive lines 1406, as shown in FIG. 14D. In some embodiments, a patterning process may be performed to selectively remove portions of the dielectric layer 1405. Air gaps may be subsequently formed from the openings 1410 according to the methods 800, 1000, or 1200 described above.

Figure 14E:
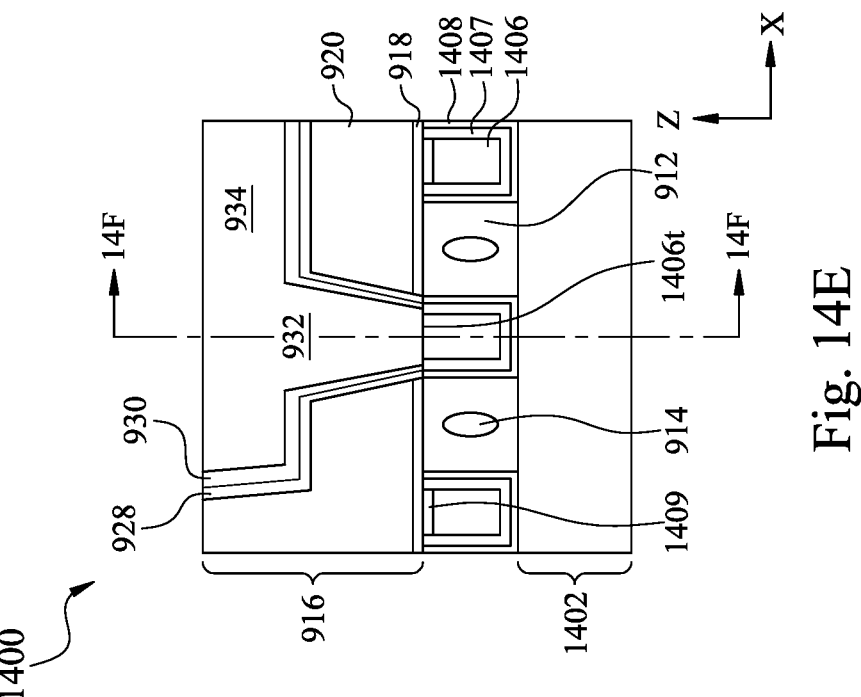

Upon formation of the openings 1410 in FIG. 14D, operations 804, 806, 808, 810, 812, 814, and 816 of the method 800 may be performed to form the interconnect structure 1400 as shown in FIGS. 14E and 14D. The interconnect structure 1400 is similar to the interconnect structure 900 except that the dielectric layer 912 is disposed between the barrier layer 1408 on sidewalls of the conductive lines 1406. The conductive line 1406 is in direct contact with the conductive via 932 (FIG. 14E).

Figure 15A:
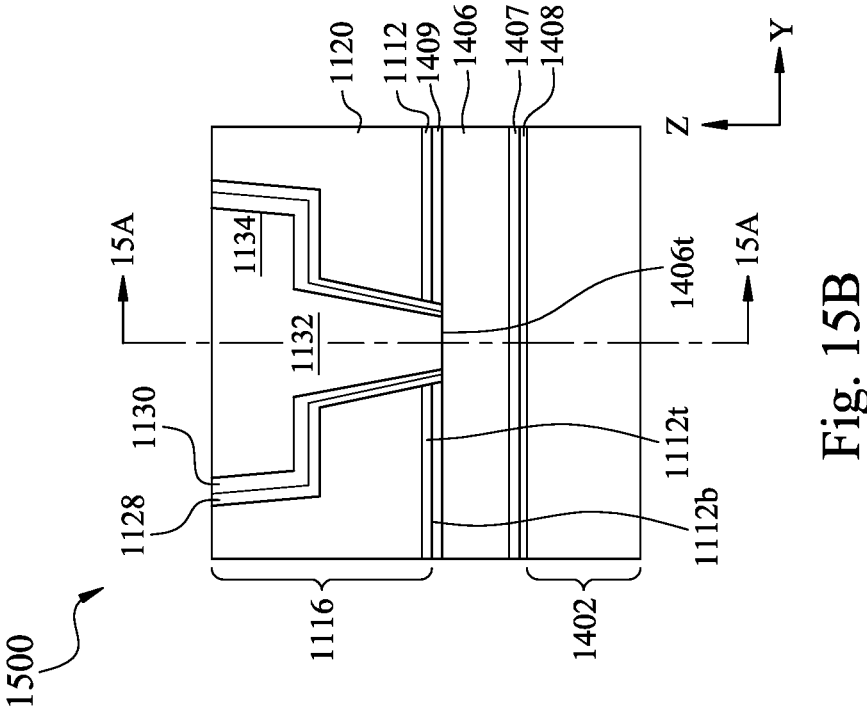
FIGS. 15A-15B are cross-sectional side views of an interconnect structure according to embodiments of the present disclosure.
Figure 15B:
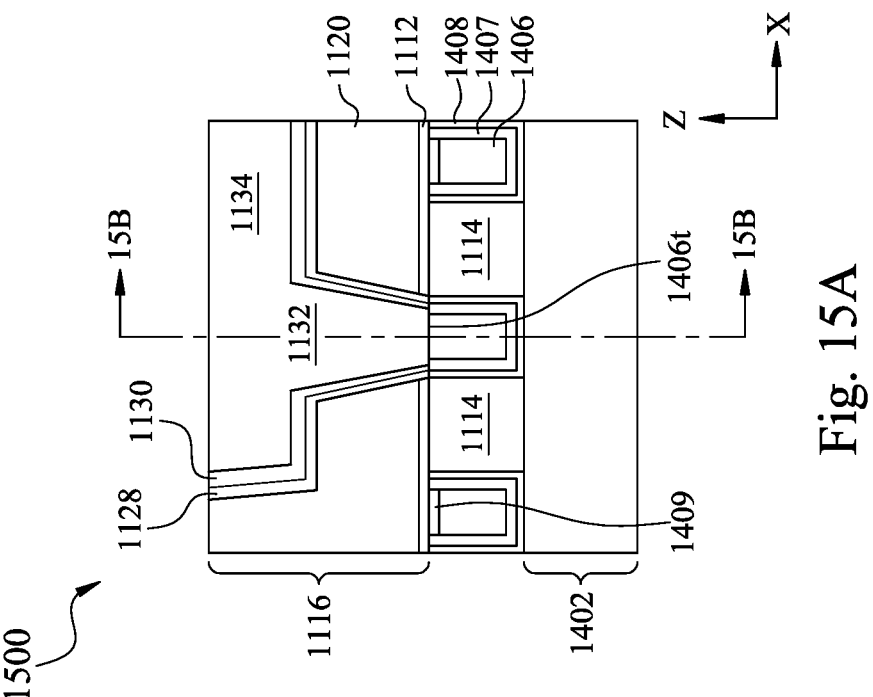

FIGS. 15A-15B are cross-sectional side views of an interconnect structure 1500 according to embodiments of the present disclosure. Upon formation of the openings 1410 in FIG. 14D, operations 1004, 1006, 1008, 1010, 1012, 1014, and 1016 of methods 1000 may be performed to form the interconnect structure 900. The interconnect structure 900 is similar to the interconnect structure 1100 except that the air gaps 1114 is formed between the barrier layer 1408 on sidewalls of the conductive lines 1406. The conductive line 1406 is in direct contact with the conductive via 1132.

Figure 16A:
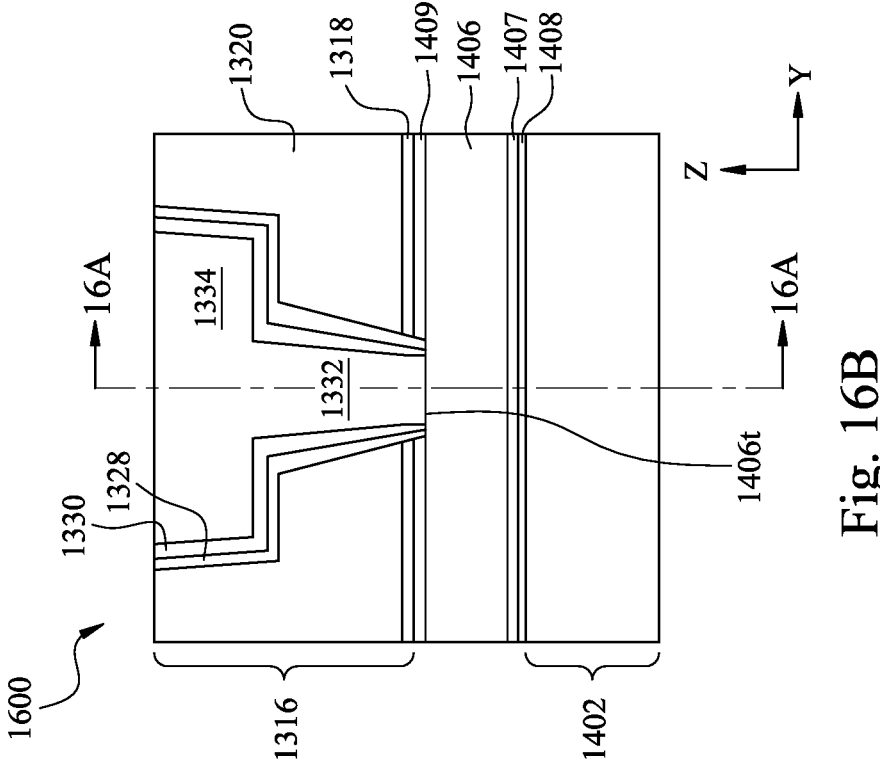
FIGS. 16A-16B are cross-sectional side views of an interconnect structure according to embodiments of the present disclosure.
Figure 16B:
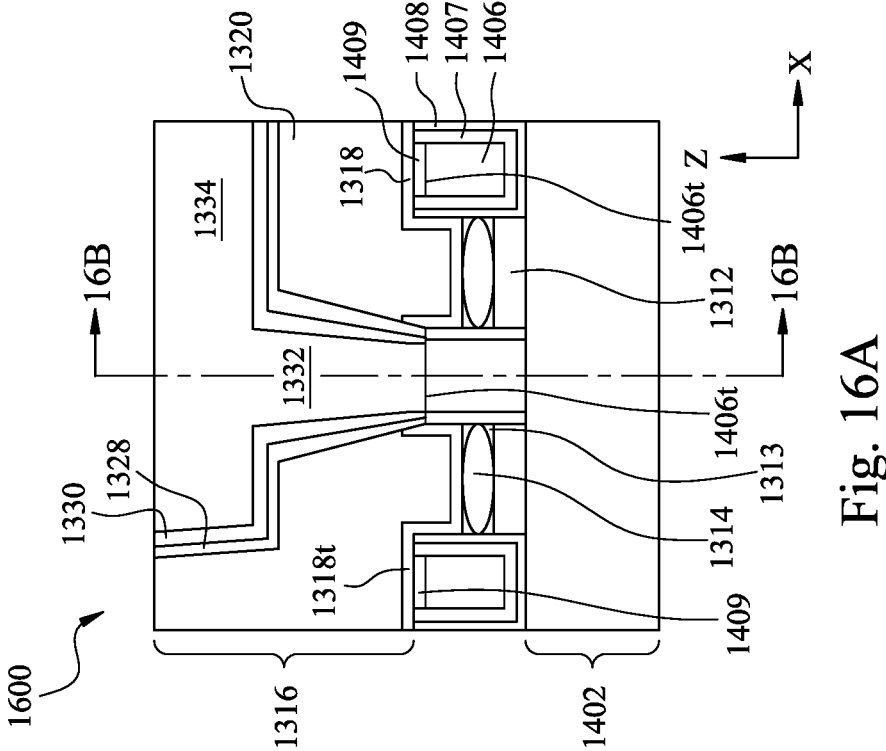

FIGS. 16A-16B are cross-sectional side views of an interconnect structure 1600 according to embodiments of the present disclosure. Upon formation of the openings 1410 in FIG. 14D, operations 1204, 1206, 1208, 1210, 1212, 1214, 1216, 1218, 1220, and 1222 of the method 1200 may be performed to form the interconnect structure 1600. The interconnect structure 1600 is similar to the interconnect structure 1300 except that the sacrificial layer 1313 and the dielectric layer 1318 are formed between the barrier layer 1408 on sidewalls of the conductive lines 1406. The conductive line 1406 is in direct contact with the conductive via 1332.

Some embodiments relate to interconnection structures with reduced via contact resistance and reduced RC delay. Particularly, the embodiments of the present disclosure provide barrier-free and liner-free conductive via structures in direct contact with conductive lines to be connected by using a removable blocking layer, such as self-assembled monolayer (SAM). SAM deposition can be a one step or two-step process to enable selective barrier and liner deposition for both dual-damascene and single damascene fabrication.

Some embodiments relate to interconnect structures with reduced via contact resistance and reduced RC delay. Particularly, the embodiments of the present disclosure provide conductive via structures in direct contact with conductive lines to be connected. In some embodiments, air gaps are formed between conductive lines connected to via structures within an IMD layer. The air gaps lower capacitance thus, thus, reducing capacity penalty. Air gaps according to the present disclosure may be selectively formed in IMD layers susceptible to capacity penalty. In some embodiments air gaps around conductive vias are not present in layers adjacent to the IMD layer with air gaps, such as the IMD layer immediately above or below the IMD layer with air gaps.

An embodiment of a method for forming an interconnection structure is provided. The method includes forming a conductive feature in a first dielectric material, the conductive feature being surrounded by a first barrier layer and a first liner, forming an etch stop layer on the first dielectric material, forming a second dielectric material on the etch stop layer, removing portions of the second dielectric material and the etch stop layer to form a trench opening in an upper portion of the second dielectric material and a via opening in a lower portion of the second dielectric material, the trench opening connecting to the via opening, and the via opening exposing a top surface of the conductive feature, selectively forming a second barrier layer on the second dielectric material in the via opening and the trench opening, selectively forming a second liner on the second barrier layer, and forming a conductive material in the via opening and the trench opening, the conductive material being in direct contact with the top surface of the conductive feature, and the second barrier layer and second liner being separated from the first barrier layer and the first liner.

Another embodiment of a method for forming an interconnection structure is provided. The method includes forming a first conductive feature in a first dielectric material, forming a first etch stop layer on the first dielectric material, forming a second dielectric material on the first etch stop layer, forming a first opening through the second dielectric material and the first etch stop layer to expose a top surface of the first conductive feature, the first opening have a first dimension, forming a first blocking layer on the top surface of the first conductive feature, selectively forming a first barrier layer on the second dielectric material in the first opening, removing the first blocking layer, forming a second blocking layer on the top surface of the first conductive feature, selectively forming a first liner on the first barrier layer, removing the second blocking layer to expose the top surface of the first conductive feature, and forming a first conductive material in the first opening so that a portion of the first conductive material is in direct contact with the first conductive feature.

A further embodiment is an interconnection structure. The interconnection structure includes a conductive feature disposed in a first dielectric material, a first etch stop layer disposed over the first dielectric material, a second dielectric material disposed on the first etch stop layer, a conductive via extending through the second dielectric material and the first etch stop layer and in contact with at least a portion of the conductive feature, a first barrier layer disposed between the second dielectric material and the conductive via, a first liner disposed between and in contact with the first barrier layer and the conductive via, a third dielectric material disposed over the second dielectric material, a conductive line disposed in the third dielectric material and in direct contact with the conductive via, a second barrier layer disposed on the second dielectric material and in contact with the first barrier layer and the conductive line, and a second liner disposed between and in contact with the second barrier layer and the conductive line, wherein the second liner is separated from the first liner.

Some embodiments of the present disclosure provide an interconnect structure comprising a first conductive feature having a top surface and a first sidewall; a second conductive feature adjacent the first conductive feature, wherein the second conductive feature has a second sidewall facing the first conductive feature, and an air gap is disposed between the first sidewall and the second sidewall; a capping layer disposed on the first sidewall of the first conductive feature and the second sidewall of the second conductive feature; a first material layer disposed over the capping layer, wherein a bottom surface of the first material is in contact with the capping layer; a second material layer disposed over a top surface of the first material layer; and a conductive via disposed in the first and second material layers, wherein a bottom surface of the conductive via is in direct contact with the top surface of the first conductive feature, and the bottom surface of the first material layer is above the bottom surface of the first conductive via.

Some embodiments of the present disclosure provide a method for forming an interconnect structure, comprising forming a plurality of first conductive features on a substrate, wherein each of the plurality of conductive features has a bottom surface on the substrate, two sidewalls extending from the bottom surface, and a top surface connecting the two sidewalls, and a plurality of air gaps formed between sidewalls of neighboring first conductive features; forming a capping layer on the top surface and two sidewalls of the plurality of first conductive features; depositing a first material layer on the top surfaces of the plurality of first conductive features, wherein at least a portion the air gaps remain under the first material layer; depositing a first dielectric layer over the first material layer; forming a first opening through the first dielectric layer and the first material layer to expose one of the plurality of first conductive features; and filing the first opening with a conductive material to form a second conductive feature, wherein the second conductive feature is in direct contact with the corresponding one of the first conductive features, and a bottom surface of the second conductive feature is lower than a top surface of the first material layer.

Some embodiments of the present disclosure provide a method for forming an interconnect structure. The method includes forming a plurality of first conductive features, generating air gaps between the plurality of first conductive features, depositing a dielectric layer over the plurality of first conductive features, patterning the dielectric layer to form an opening to expose one or more plurality of first conductive features, depositing a blocking layer on exposed surfaces of the first conductive features, depositing a liner layer on surfaces of the dielectric layer, depositing a barrier layer on the liner layer, removing the blocking layer, and filing the opening with a conductive material to form a second conductive feature, wherein the second conductive feature is in direct contact with one of the first conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an interconnection structure, comprising:

forming a first conductive feature in a first dielectric material;

forming a first etch stop layer on the first dielectric material;

forming a second dielectric material on the first etch stop layer;

forming a first opening through the second dielectric material and the first etch stop layer to expose a top surface of the first conductive feature, the first opening having a first dimension;

forming a first blocking layer on the top surface of the first conductive feature;

selectively forming a first barrier layer on surfaces of the second dielectric material and the first etch stop layer in the first opening while the first blocking layer prevents formation of the first barrier layer on the top surface of the first conductive feature;

removing the first blocking layer;

forming a second blocking layer on the top surface of the first conductive feature;

selectively forming a first liner on surfaces of the first barrier layer while the second blocking layer prevents formation of the first liner on the top surface of the first conductive feature;

removing the second blocking layer to expose the top surface of the first conductive feature; and forming a first conductive material in the first opening so that a portion of the first conductive material is in direct contact with the first conductive feature.

2. The method of claim 1, wherein the first barrier layer is formed so that a bottom of the first barrier layer is disposed on a portion of the first blocking layer.

3. The method of claim 2, wherein the first blocking layer is removed so that a spacing is formed between the bottom of the first barrier layer and a portion of the top surface of the first conductive feature.

4. The method of claim 3, wherein the first conductive material is formed such that a portion of the first conductive material is extended into the spacing.

5. The method of claim 2, wherein the first etch stop layer is formed by:

forming a first layer on the first dielectric material;

forming a second layer on the first layer;

forming a third layer on the second layer; and forming a fourth layer on the third layer.

6. The method of claim 5, wherein the bottom of the first barrier layer is at or near an interface defined by the first layer and the second layer.

7. The method of claim 5, wherein the first layer and the third layer comprise aluminum oxide, and the second layer and the fourth layer comprise silicon carbide.

8. The method of claim 7, wherein the fourth layer is an oxygen-doped silicon carbide.

9. The method of claim 1, further comprising:

forming a second opening in the second dielectric material, wherein the first opening is a via opening, and the second opening is a trench opening.

10. The method of claim 1, wherein the first and the second blocking layers comprise one or more self-assembled monolayers (SAMs) having a head group and a tail group.

11. The method of claim 10, wherein the head group comprises an azole group-containing compound or a compound terminated with an alkyne group.

12. The method of claim 11, wherein the head group comprises a highly hydrophobic long alkyl chain.

13. The method of claim 1, wherein the first barrier layer is selectively formed on the second dielectric material through self-limiting surface reactions by ALD process and/or MLD process.

14. A method for forming an interconnection structure, comprising:

forming a first conductive feature in a first dielectric material, wherein the first conductive feature has three surfaces in contact with a first liner layer, and a first barrier layer is disposed between the first liner layer and in contact with the first dielectric material and in contact with the first dielectric material;

forming a first etch stop layer on the first dielectric material;

forming a second dielectric material on the first etch stop layer;

forming a first opening through the second dielectric material and the first etch stop layer to expose a top surface of the first conductive feature and a top surface of the first liner layer;

forming a first blocking layer on the top surfaces of the first conductive feature and the first liner layer;

selectively forming a second barrier layer on surfaces of the second dielectric material and the first etch stop layer in the first opening while the first blocking layer prevents formation of the second barrier layer on the top surfaces of the first conductive feature and the first liner layer;

removing the first blocking layer to expose the top surface of the first conductive feature and the top surface of the first liner layer;

forming a second blocking layer on the top surface of the first conductive feature and the top surface of the first liner layer;

removing the second blocking layer to expose the top surface of the first conductive feature and the top surface of the first liner layer; and forming a first conductive material in the first opening so that a portion of the first conductive material is in direct contact with the first conductive feature and the first liner layer.

15. The method of claim 14, wherein the second barrier layer is formed so that a bottom of the second barrier layer is disposed on a portion of the first blocking layer.

16. The method of claim 15, wherein the first blocking layer is removed so that a spacing is formed between the bottom of the second barrier layer and portions of the top surfaces of the first conductive feature and the first liner layer.

17. The method of claim 16, wherein the first conductive material is formed such that a portion of the first conductive material is extended into the spacing.

18. A method for forming an interconnection structure, comprising:

forming a first conductive feature in a first dielectric material, the first conductive feature having a top surface; forming a first etch stop layer on the first dielectric material and the top surface of the first conductive feature;

forming a second dielectric material on the first etch stop layer;

forming a first opening through the second dielectric material and the first etch stop layer to expose the top surface of the first conductive feature;

forming a first blocking layer on the top surface of the first conductive feature;

conformally forming a first barrier layer on sidewalls of the first opening while the first blocking layer prevents formation of the first barrier layer on the top surface of the first conductive feature;

removing the first blocking layer to form a spacing between a bottom of the first barrier layer and the top surface of the first conductive feature;

forming a second blocking layer on the top surface of the first conductive feature;

conformally forming a first liner on surfaces of the first barrier layer while the second blocking layer prevents formation of the first liner on the top surface of the first conductive feature;

removing the second blocking layer to form a spacing between a bottom of the first liner and the top surface of the first conductive feature, wherein the bottom of the first liner is spaced apart from the top surface of the first conductive feature by a distance corresponding to a thickness of the second blocking layer; and forming a first conductive material in the first opening so that a portion of the first conductive material is in direct contact with the top surface of the first conductive feature and extends into the spacing under the first liner.

19. The method of claim 18, wherein the first etch stop layer comprises multiple layers including aluminum oxide and silicon carbide.

20. The method of claim 18, wherein the first blocking layer and the second blocking layer each comprise a self-assembled monolayer having an azole group-containing compound.

* * * * *